US011450683B2

United States Patent
Kubota et al.

(10) Patent No.: US 11,450,683 B2
(45) Date of Patent: Sep. 20, 2022

(54) SEMICONDUCTOR MEMORY DEVICE

(71) Applicant: KIOXIA CORPORATION, Minato-ku (JP)

(72) Inventors: Yoshitaka Kubota, Sagamihara (JP); Erika Kodama, Yokohama (JP)

(73) Assignee: KIOXIA CORPORATION, Minato-ku (JP)

( * ) Notice: Subject to any disclaimer, the term of this patent is extended or adjusted under 35 U.S.C. 154(b) by 0 days.

(21) Appl. No.: 16/808,459

(22) Filed: Mar. 4, 2020

(65) Prior Publication Data
US 2021/0082948 A1  Mar. 18, 2021

(30) Foreign Application Priority Data
Sep. 13, 2019  (JP) .............................. JP2019-167639

(51) Int. Cl.
*H01L 27/11582* (2017.01)
*H01L 23/528* (2006.01)

(52) U.S. Cl.
CPC ...... *H01L 27/11582* (2013.01); *H01L 23/528* (2013.01)

(58) Field of Classification Search
CPC ........... H01L 27/0207; H01L 27/11521; H01L 27/11526; H01L 27/11568; H01L 27/11551; H01L 27/11578; H01L 23/528; H01L 27/11582; H01L 27/11575; H01L 27/11565; H01L 27/11573; H01L 27/115
See application file for complete search history.

(56) References Cited

U.S. PATENT DOCUMENTS

| 8,952,426 | B2 * | 2/2015 | Maejima ........... H01L 27/11573 257/214 |
| 9,728,548 | B2 | 8/2017 | Freeman et al. |
| 9,806,093 | B2 | 10/2017 | Toyama et al. |
| 10,134,749 | B2 * | 11/2018 | Noguchi ........... H01L 27/11519 |
| 10,872,857 | B1 * | 12/2020 | Otsu ................. H01L 27/11556 |
| 2017/0077132 | A1 | 3/2017 | Inokuma |
| 2017/0179152 | A1 * | 6/2017 | Toyama ............ H01L 27/11582 |
| 2017/0213845 | A1 * | 7/2017 | Baba ................. H01L 27/11575 |
| 2018/0350831 | A1 * | 12/2018 | Kim ................. H01L 27/11582 |
| 2019/0067314 | A1 * | 2/2019 | Lu ..................... H01L 21/76895 |

FOREIGN PATENT DOCUMENTS

| JP | 2018-026518 A | 2/2018 |
| JP | 2018-534765 A | 11/2018 |

* cited by examiner

*Primary Examiner* — Galina G Yushina
(74) *Attorney, Agent, or Firm* — Oblon, McClelland, Maier & Neustadt, L.L.P.

(57) ABSTRACT

According to one embodiment, a semiconductor memory device includes a substrate having a first region and a second region arranged in a first direction. The first region includes word line layers and interlayer insulating layers laminated in a second direction, a first semiconductor layer opposed to the word line layers, and an electric charge accumulating film disposed between them. The second region includes a part of the word line layers and the interlayer insulating layers, first insulating layers and a part of the interlayer insulating layers that separate from the word line layers, a contact that has an outer peripheral surface connected to the first insulating layers, and a second insulating layer disposed between the word line layers and the first insulating layers. The first insulating layers have side surfaces connected to the word line layers and side surfaces connected to the second insulating layer.

13 Claims, 46 Drawing Sheets

SEMICONDUCTOR MEMORY DEVICE

CROSS-REFERENCE TO RELATED APPLICATIONS

This application is based upon and claims the benefit of Japanese Patent Application No. 2019-167639, filed on Sep. 13, 2019, the entire contents of which are incorporated herein by reference.

BACKGROUND

Field

Embodiments described herein relate generally to a semiconductor memory device.

Description of the Related Art

There has been known a semiconductor memory device that includes a semiconductor substrate, a memory cell array disposed separately from the semiconductor substrate in a direction intersecting with a surface of the semiconductor substrate, and a transistor array disposed on a surface of the semiconductor substrate.

BRIEF DESCRIPTION OF THE DRAWINGS

FIG. 9 is taken along the line C-C' and viewed in the arrow direction;
FIG. 9 is taken along the line D-D' and viewed in the arrow direction.

DETAILED DESCRIPTION

Figure 1:
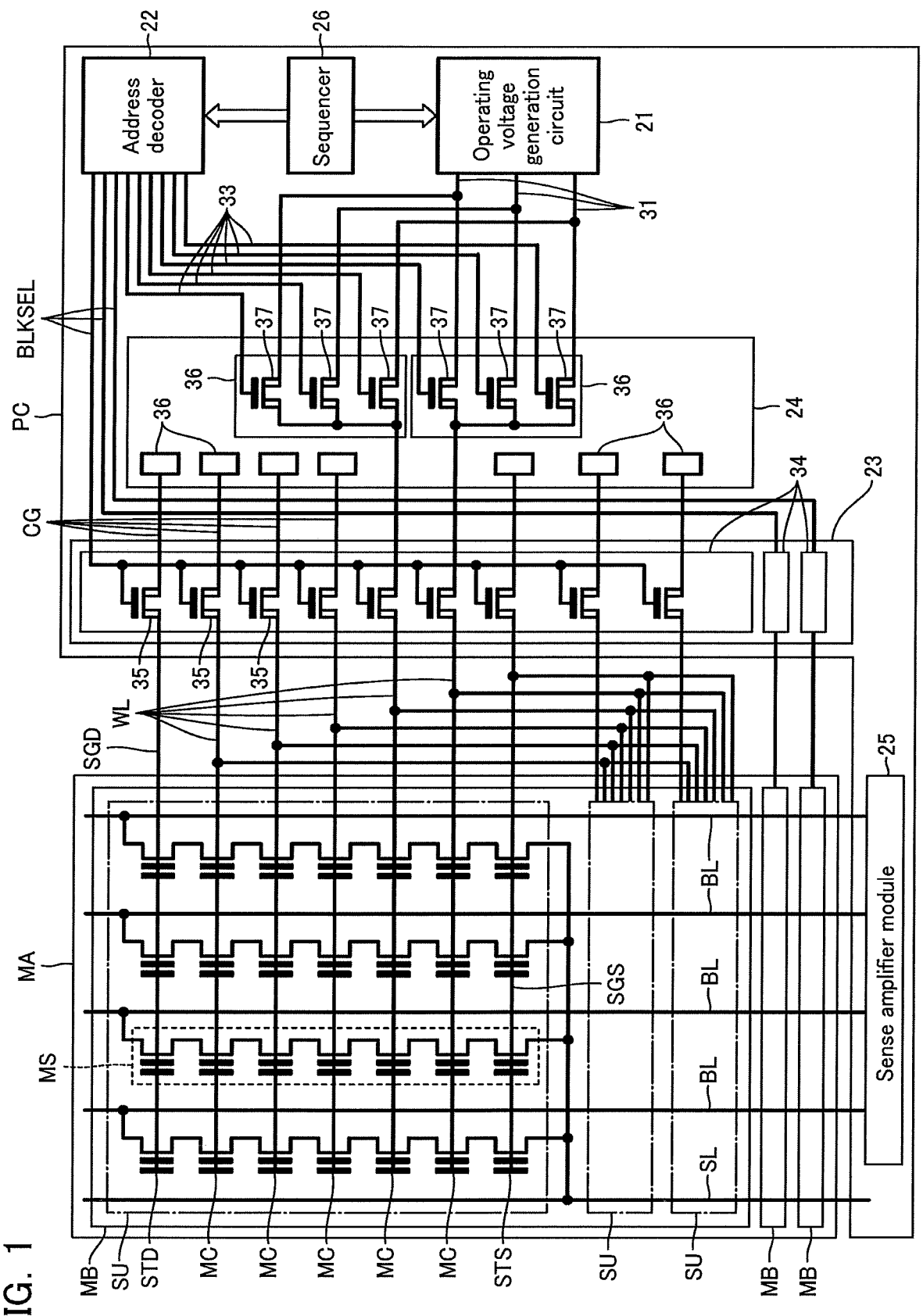
FIG. 1 is an equivalent circuit diagram illustrating a schematic configuration of a semiconductor memory device according to a first embodiment.

A semiconductor memory device according to one embodiment includes a substrate having a first region and a second region arranged in a first direction. The first region includes a plurality of first word line layers and a plurality of first interlayer insulating layers, a first semiconductor layer, and a first electric charge accumulating film. The plurality of first word line layers and the plurality of first interlayer insulating layers are laminated in a second direction intersecting with a surface of the substrate. The first semiconductor layer extends in the second direction. The first semiconductor layer has an outer peripheral surface opposed to the plurality of first word line layers. The first electric charge accumulating film is disposed between the plurality of first word line layers and the first semiconductor layer. The second region includes a part of the plurality of first word line layers and a part of the plurality of first interlayer insulating layers, a plurality of first insulating layers and a part of the plurality of first interlayer insulating layers, a first contact, and a second insulating layer. The part of the plurality of first word line layers and the part of the plurality of first interlayer insulating layers are laminated in the second direction. The plurality of first insulating layers and the part of the plurality of first interlayer insulating layers are separate from the plurality of first word line layers in a third direction intersecting with the first direction and the second direction. The plurality of first insulating layers and the part of the plurality of first interlayer insulating layers are laminated in the second direction. The first contact extends in the second direction. The first contact has an outer peripheral surface connected to the plurality of first insulating layers. The second insulating layer is disposed between the plurality of first word line layers and the plurality of first insulating layers. The second insulating layer extends in the first direction and the second direction. The plurality of first insulating layers have side surfaces in the first direction connected to the plurality of first word line layers, and the plurality of first insulating layers have side surfaces in the third direction connected to the second insulating layer.

Next, semiconductor memory devices according to embodiments will be described in detail with reference to the drawings. The following embodiments are merely examples, and will not be described for the purpose of limiting the present invention.

In this specification, a predetermined direction parallel to a surface of a semiconductor substrate is referred to as an X direction, a direction parallel to the surface of the semiconductor substrate and perpendicular to the X direction is referred to as a Y direction, and a direction perpendicular to the surface of the semiconductor substrate is referred to as a Z direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may correspond to any of the X direction, the Y direction, and the Z direction or need not to correspond to these directions.

Expressions such as "above" and "below" in this specification are based on the semiconductor substrate. For example, a direction away from the semiconductor substrate along the Z direction is referred to as above and a direction approaching the semiconductor substrate along the Z direction is referred to as below. A lower surface and a lower end portion of a certain configuration mean a surface and an end portion on the semiconductor substrate side of this configuration. A top surface and an upper end portion of a certain configuration mean a surface and an end portion on a side opposite to the semiconductor substrate of this configuration. A surface intersecting with the X direction or the Y direction is referred to as a side surface or the like.

In this specification, when referring to that a first configuration is "electrically connected" to a second configuration, the first configuration may be directly connected to the second configuration, or the first configuration may be connected to the second configuration via wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the first configuration is disposed on a current path between the second configuration and the third configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like is turned ON.

First Embodiment

With reference to the drawings, a configuration of a semiconductor memory device according to a first embodiment will be described below. The following drawings are schematic, and for convenience of explanation, a part of a configuration is sometimes omitted.

FIG. 1 is a schematic equivalent circuit diagram illustrating a configuration of a semiconductor memory device according to the first embodiment.

The semiconductor memory device according to the embodiment includes a memory cell array MA and a peripheral circuit PC controlling the memory cell array MA.

The memory cell array MA includes a plurality of memory blocks MB. The plurality of these memory blocks MB each include a plurality of string units SU. The plurality of these string units SU each include a plurality of memory strings MS. The plurality of these memory strings MS each have one end connected to the peripheral circuit PC via a bit line BL. The plurality of these memory strings MS each have the other end connected to the peripheral circuit PC via a common source line SL.

The memory string MS includes a drain select transistor STD, a plurality of memory cells MC, and a source select transistor STS, which are connected in series between the bit line BL and the source line SL. Hereinafter, the drain select transistor STD and the source select transistor STS may be simply referred to as select transistors (STD, STS).

The memory cell MC according to the embodiment is a field-effect type transistor including an electric charge accumulating film in its gate insulating film. The memory cell MC has a threshold voltage that varies corresponding to an electric charge amount in the electric charge accumulating film. Note that, the plurality of memory cells MC corresponding to one memory string MS have gate electrodes to which respective word lines WL are connected. These word lines WL are each connected to all the memory strings MS in one memory block MB in common.

The select transistors (STD, STS) are field-effect type transistors. The gate electrodes of the select transistors (STD, STS) are connected to respective select gate lines (SGD, SGS). A drain select line SGD is disposed corresponding to the string unit SU and connected to all the memory strings MS in one string unit SU in common. A source select line SGS is connected to all the memory strings MS in one memory block MB in common.

The peripheral circuit PC includes an operating voltage generation circuit 21 that generates operating voltages, an address decoder 22 that decodes address data, a block select circuit 23 and a voltage select circuit 24 that transfer the operating voltage to the memory cell array MA corresponding to an output signal of the address decoder 22, a sense amplifier module 25 connected to the bit lines BL, and a sequencer 26 that controls them.

The operating voltage generation circuit 21 includes a plurality of operating voltage output terminals 31. The operating voltage generation circuit 21, for example, includes a step down circuit of a regulator and the like, and a step up circuit of a charge pump circuit and the like. The operating voltage generation circuit 21, for example, generates a plurality of operating voltages to be applied to the bit line BL, the source line SL, the word line WL, and the select gate line (SGD, SGS) on the occasion of a read operation, a write operation, and an erase operation for the memory cell array MA in accordance with a control signal from the sequencer 26, and simultaneously outputs the plurality of operating voltages to the plurality of operating voltage output terminals 31. The operating voltage output from the operating voltage output terminal 31 is appropriately adjusted in accordance with the control signal from the sequencer 26.

The address decoder 22 includes a plurality of block select lines BLKSEL and a plurality of voltage select lines 33. For example, the address decoder 22 sequentially refers to address data of an address register in accordance with the control signal from the sequencer 26, decodes this address data to cause the block select transistor 35 and the voltage select transistor 37 corresponding to the address data to be in an ON state and cause the block select transistor 35 and the voltage select transistor 37 other than the above to be in an OFF state. For example, the voltage of the block select line BLKSEL and the voltage select line 33 corresponding to the address data is caused to be in a state of "H", voltages other than that is caused to be in a state of "L". Note that, when a P channel type transistor is used, not an N channel type, a reverse voltage is applied to these wirings.

Note that, in the illustrated example, the address decoder 22 includes one each of block select lines BLKSEL for one memory block MB. However, this configuration is appropriately changeable. For example, one each of block select lines BLKSEL may be disposed for two or more memory blocks MB.

The block select circuit 23 includes a plurality of block selectors 34 that correspond to the memory blocks MB. The plurality of these block selectors 34 each include a plurality of block select transistors 35 corresponding to the word lines WL and the select gate lines (SGD, SGS). The block select transistor 35 is, for example, afield-effect type high voltage transistor. The block select transistors 35 have drain electrodes each electrically connected to the corresponding word line WL or select gate line (SGD, SGS). Source electrodes are each electrically connected to the operating voltage output terminal 31 via a wiring CG and the voltage select circuit 24. The gate electrodes are commonly connected to the corresponding block select line BLKSEL.

Note that, the block select circuit 23 includes a plurality of transistors (not illustrated). The plurality of these transistors are field-effect type high voltage transistors connected between the select gate line (SGD, SGS) and a ground voltage supply terminal. The plurality of these transistors electrically conducts the select gate line (SGD, SGS) included in a non-selected memory block MB with the ground voltage supply terminal. Note that the plurality of word lines WL included in the non-selected memory block MB are in a state of floating.

The voltage select circuit 24 includes a plurality of voltage selectors 36 corresponding to the word line WL and the select gate line (SGD, SGS). The plurality of these voltage selectors 36 each include a plurality of voltage select transistors 37. The voltage select transistor 37 is, for example, a field-effect type high voltage transistor. The voltage select transistors 37 have drain terminals each electrically connected to the corresponding word line WL or the select gate line (SGD, SGS) via the wiring CG and the block select circuit 23. Source terminals are each electrically connected to the corresponding operating voltage output terminal 31. Gate electrodes are each connected to the corresponding voltage select line 33.

The sense amplifier module 25 is connected to a plurality of the bit lines BL. The sense amplifier module 25 includes, for example, a plurality of sense amplifier units corresponding to the bit lines BL. The sense amplifier units each include a clamp transistor that charges the bit line BL based on the voltage generated in the operating voltage generation circuit 21, a sense transistor that senses the voltage or the current of the bit line BL, and a plurality of latch circuits that hold output signals of this sense transistor, write data, and the like.

The sequencer 26 outputs a control signal to the operating voltage generation circuit 21, the address decoder 22, and the sense amplifier module 25, corresponding to an input instruction and a state of the semiconductor memory device. For example, the sequencer 26 sequentially refers to command data of the command register in accordance with the clock signal, decodes this command data, and outputs the operating voltage generation circuit 21, the address decoder 22, and the sense amplifier module 25.

Figure 2:
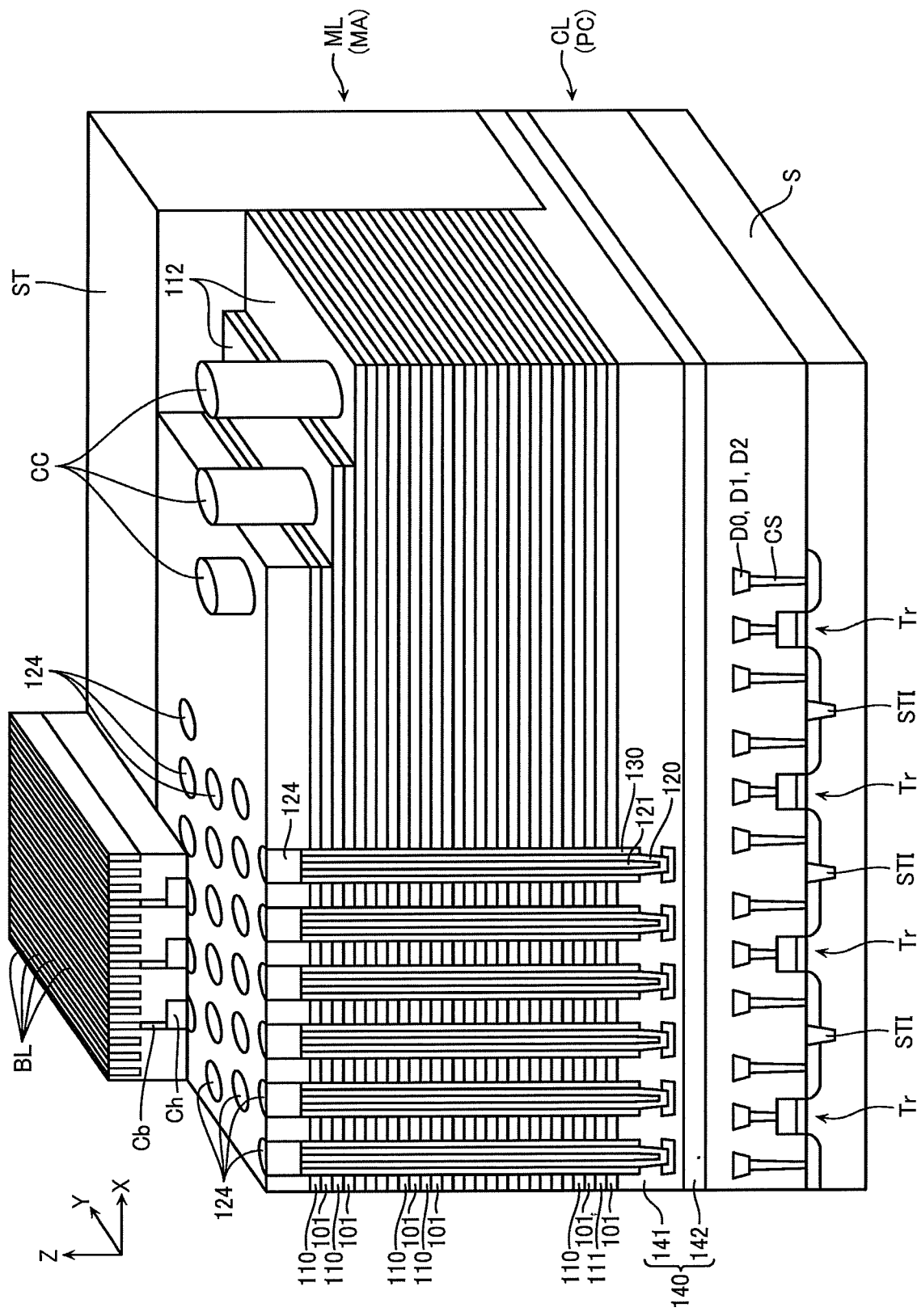
FIG. 2 is a schematic perspective view of the semiconductor memory device.

FIG. 2 is a schematic perspective view of the semiconductor memory device according to the embodiment. Note that FIG. 2 is a schematic structure for description, and is not for illustrating detailed positions or the like of respective configurations. Further specific positions and the like of the respective configurations are described below with reference to FIG. 4 to FIG. 12.

As illustrated in FIG. 2, the semiconductor memory device according to the embodiment includes a semiconductor substrate S, a circuit layer CL disposed on the semiconductor substrate S, and a memory layer ML disposed on an upper side of the circuit layer CL.

The semiconductor substrate S is a semiconductor substrate made of, for example, single-crystal silicon (Si). The semiconductor substrate S has, for example, an N-type well on a surface of a P-type semiconductor substrate, and further includes a double well structure having a P-type well in this N-type well. The semiconductor substrate S includes insulating layers STI of silicon oxide ($SiO_2$) or the like.

The circuit layer CL includes a plurality of transistors Tr constituting the peripheral circuit PC (FIG. 1), and a plurality of wirings D0, D1, and D2, and contacts CS connected to the plurality of these transistors Tr. The transistor Tr is, for example, a field-effect type transistor that uses a surface of the semiconductor substrate S as a channel region (a gate region). Regions that function as a part of the transistor Tr on the surface of the semiconductor substrate S are surrounded by the insulating layers STI.

The memory layer ML includes a plurality of configurations included in the memory cell array MA. The memory layer ML includes a plurality of conducting layers 110 arranged in a Z direction, a semiconductor layer 120 extending in the Z direction to be opposed to the plurality of these conducting layers 110, a gate insulating film 130 disposed between the plurality of conducting layers 110 and the semiconductor layer 120, a conducting layer 140 connected to a lower end of the semiconductor layer 120.

The conducting layer 110 is an approximately plate-shaped conducting layer that extends in the X direction, and the plurality of conducting layers 110 are arranged in the Z direction. The conducting layer 110 may include, for example, a laminated film of titanium nitride (TiN) and tungsten (W), or may include, for example, polycrystalline silicon including impurities, such as phosphorus or boron. A conducting layer 111 of polycrystalline silicon or the like is disposed between the conducting layer 110 and the conducting layer 140. Interlayer insulating layers 101 of silicon oxide (SiO$_2$) or the like are disposed between the plurality of conducting layers 110, and between the conducting layer 111 and the conducting layer 140, laminated in the Z direction. The plurality of conducting layers 110 and the conducting layer 111 each include a connecting portion 112 with a contact CC extending in the Z direction.

Among the plurality of conducting layers 110, one or the plurality of conducting layers 110 positioned at the lowermost layer function, together with the conducting layer 111, as the source select lines SGS (FIG. 1) and a gate electrode of the plurality of source select transistors STS (FIG. 1) connected to these. The plurality of conducting layers 110 positioned in the upper side with respect to this function as the word lines WL (FIG. 1) and gate electrodes of the plurality of memory cells MC (FIG. 1) connected to these. One or the plurality of conducting layers 110 positioned in the upper side with respect to this function as the drain select lines SGD (FIG. 1) and gate electrodes of the plurality of drain select transistors STD (FIG. 1) connected to these.

A plurality of the semiconductor layers 120 are disposed in the X direction and the Y direction. The semiconductor layer 120 is, for example, a semiconductor layer of non-doped polycrystalline silicon (Si) or the like. The semiconductor layer 120 has an approximately cylindrical shape, and has a center portion where an insulating layer 121 of silicon oxide or the like is disposed. The semiconductor layer 120 has an outer peripheral surface opposed to inner circumferential surfaces of through holes disposed in the respective conducting layers 110. The semiconductor layer 120 has a lower end portion connected to the conducting layer 140. The semiconductor layer 120 has an upper end portion connected to the bit line BL extending in the Y direction via a semiconductor layer 124 including the N-type impurities, such as phosphorus (P), and the contacts Ch and Cb. The semiconductor layers 120 each function as a channel region of the plurality of memory cells MC and the select transistor (STD, STS) included in one memory string MS (FIG. 1).

Figure 3:
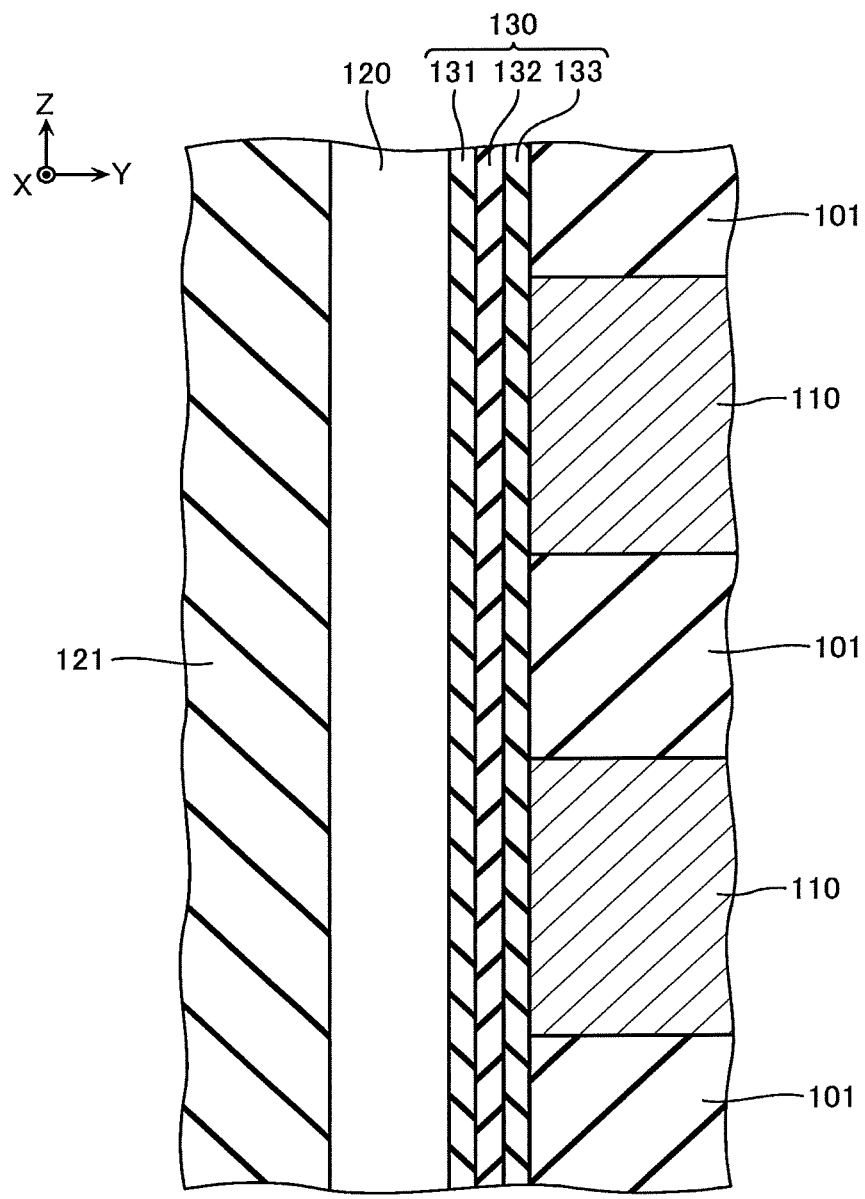
FIG. 3 is a schematic enlarged view of FIG. 2.

For example, as illustrated in FIG. 3, the gate insulating film 130 includes a tunnel insulating film 131, an electric charge accumulating film 132, and a block insulating film 133, laminated between the semiconductor layer 120 and the conducting layer 110. The tunnel insulating film 131 and the block insulating film 133 are insulating films of, for example, silicon oxide. The electric charge accumulating film 132 is a film that can accumulate an electric charge of, for example, silicon nitride (SiN). The tunnel insulating film 131, the electric charge accumulating film 132, and the block insulating film 133 have approximately cylindrical shapes and extend in the Z direction along the outer peripheral surface of the semiconductor layer 120.

Note that, while the example where the gate insulating film 130 includes the electric charge accumulating film 132 of silicon nitride or the like has been illustrated in FIG. 3, for example, the gate insulating film 130 may include a floating gate of polycrystalline silicon or the like including N-type or P-type impurities.

For example, as illustrated in FIG. 2, the conducting layer 140 includes a conductive film 141 connected to the lower end portion of the semiconductor layer 120 and a conductive film 142 disposed on a lower surface of the conductive film 141. The conductive film 141 includes, for example, a conductive semiconductor, such as polysilicon, including the N-type impurities of phosphorus (P) or the like. The conductive film 142, for example, may include a conductive semiconductor, such as polysilicon, including the N-type impurities of phosphorus (P) or the like, may include metal, such as tungsten (W), or may include silicide or the like.

Next, with reference to FIG. 4 to FIG. 12, the semiconductor memory device according to the embodiment will be described in more detail. Note that FIG. 4 to FIG. 12 illustrates schematic configurations, and the specific configurations are changeable as necessary. For sake of convenience of description, FIG. 4 to FIG. 12 omit a part of configuration.

Figure 4:
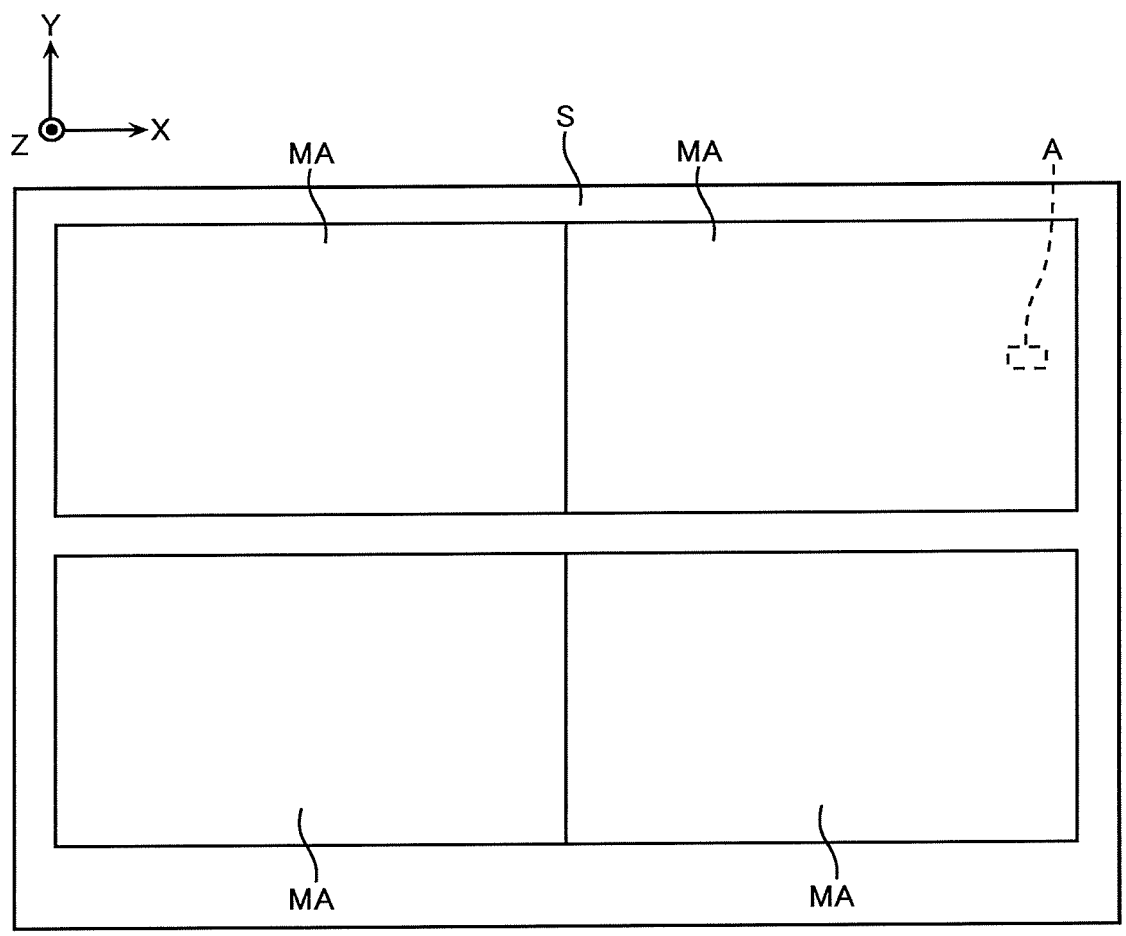
FIG. 4 is a schematic plan view of the semiconductor memory device.

FIG. 4 is a schematic plan view of the semiconductor memory device according to the embodiment. In the example in FIG. 4, in the semiconductor substrate S, four memory cell arrays MA arranged in the X direction and the Y direction are disposed.

Figure 5:
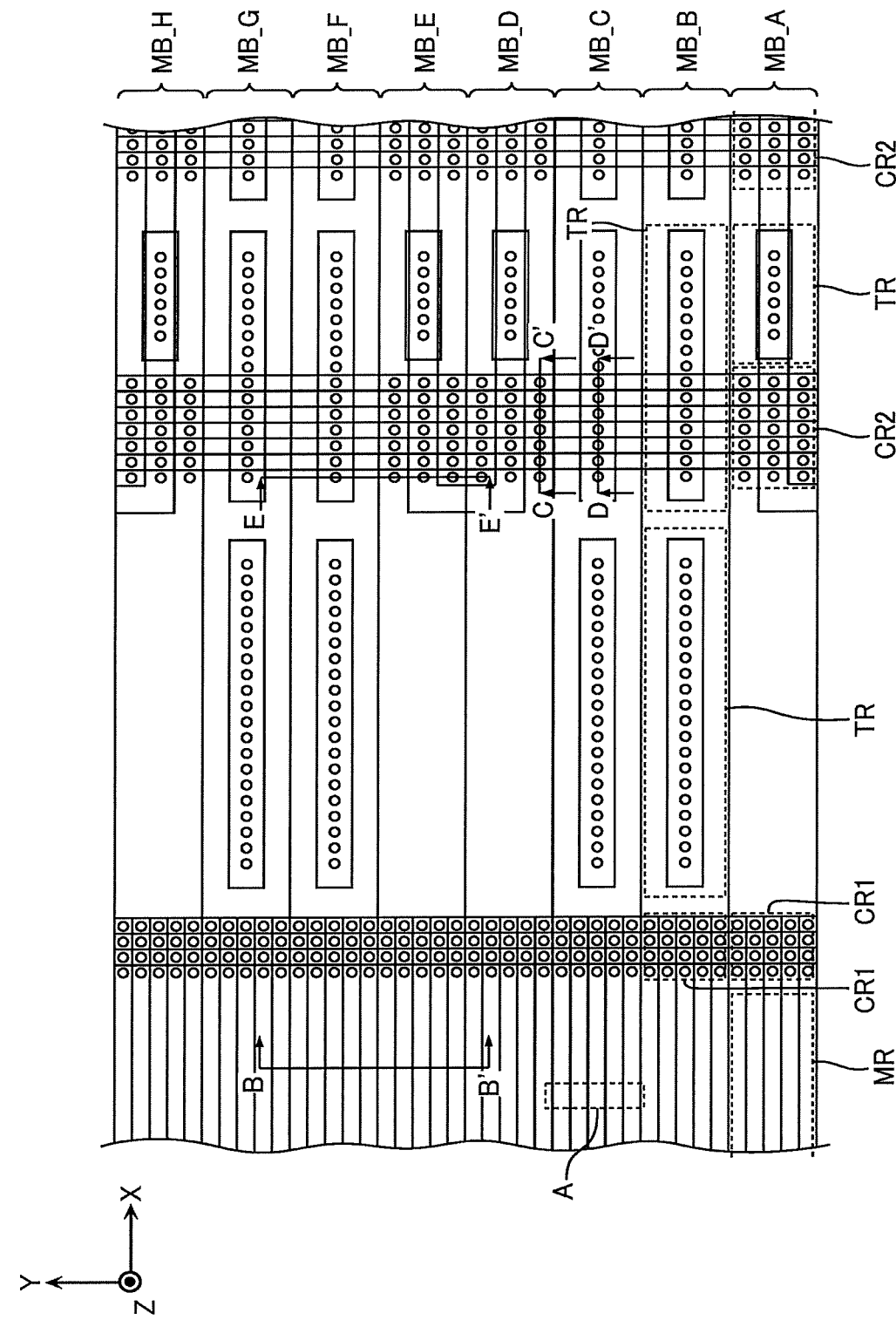
FIG. 5 is a schematic enlarged view of FIG. 4.

FIG. 5 is a schematic plan view illustrating a configuration in a region indicated by A in FIG. 4, and illustrates a configuration in the memory layer ML. As illustrated in FIG. 5, each of the memory cell arrays MA includes a plurality of memory blocks MB (MB_A to MB_H) arranged in the Y direction. The memory blocks MB each have a memory area MR extending in the X direction. The memory blocks MB each have one end portion in the X direction on which a contact region CR1 is disposed. The memory blocks MB_A, MB_D, MB_E, and MB_H have one end portions in the X direction on which a plurality of contact regions CR2 and through contact regions TR arranged in the X direction are disposed. The memory blocks MB_B, MB_C, MB_F, and MB_G have one end portions in the X direction on which the plurality of through contact regions TR arranged in the X direction are disposed. Note that, while the illustration is omitted, the memory blocks MB_A, MB_D, MB_E, and MB_H have the other end portions in the X direction on which the plurality of through contact regions TR arranged in the X direction are disposed. The memory blocks MB_B, MB_C, MB_F, and MB_G have the other end portions in the X direction on which the plurality of contact regions CR2 and through contact regions TR arranged in the X direction are disposed.

Figure 6:
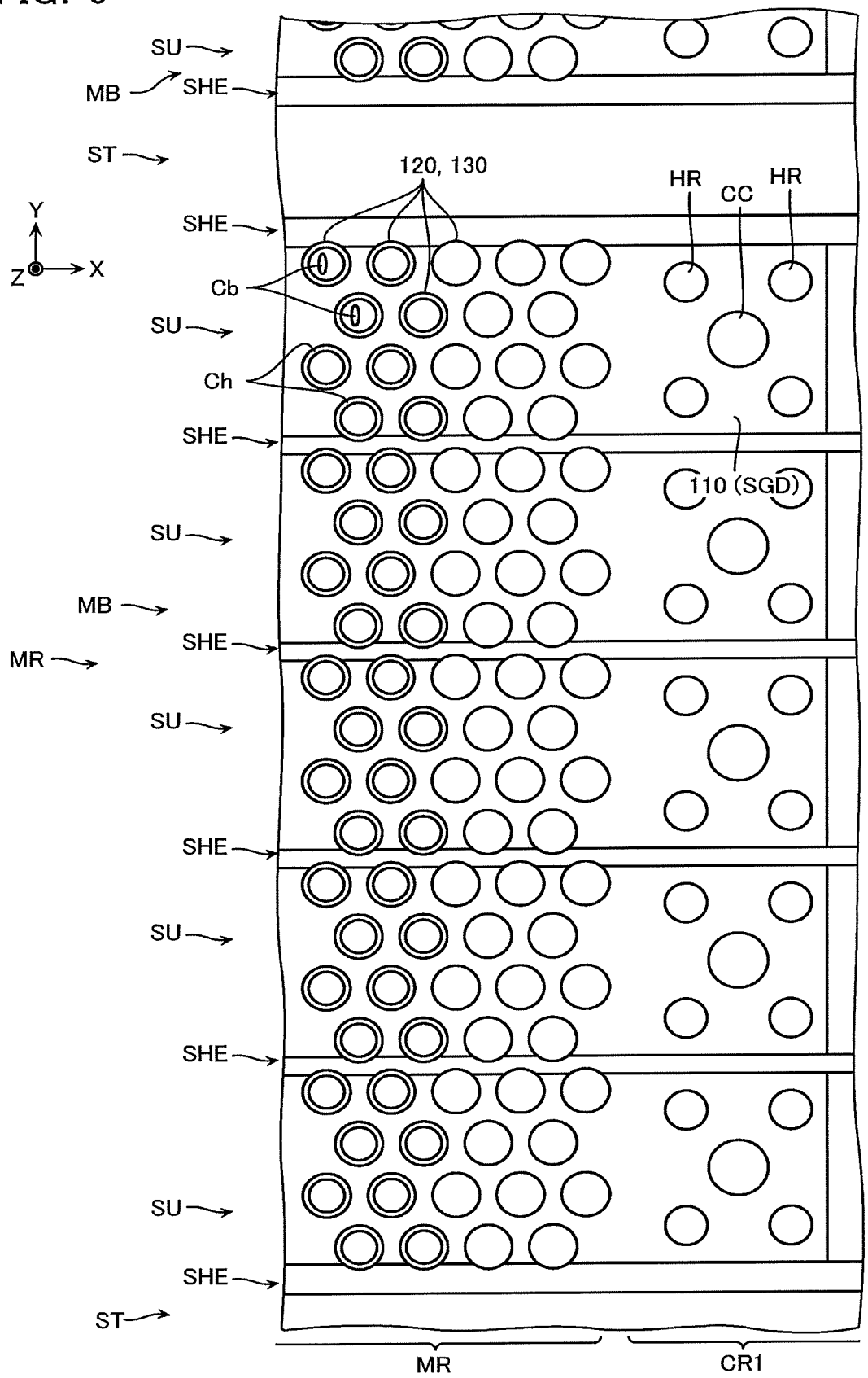
FIG. 6 is a schematic enlarged view of FIG. 5.
Figure 7:
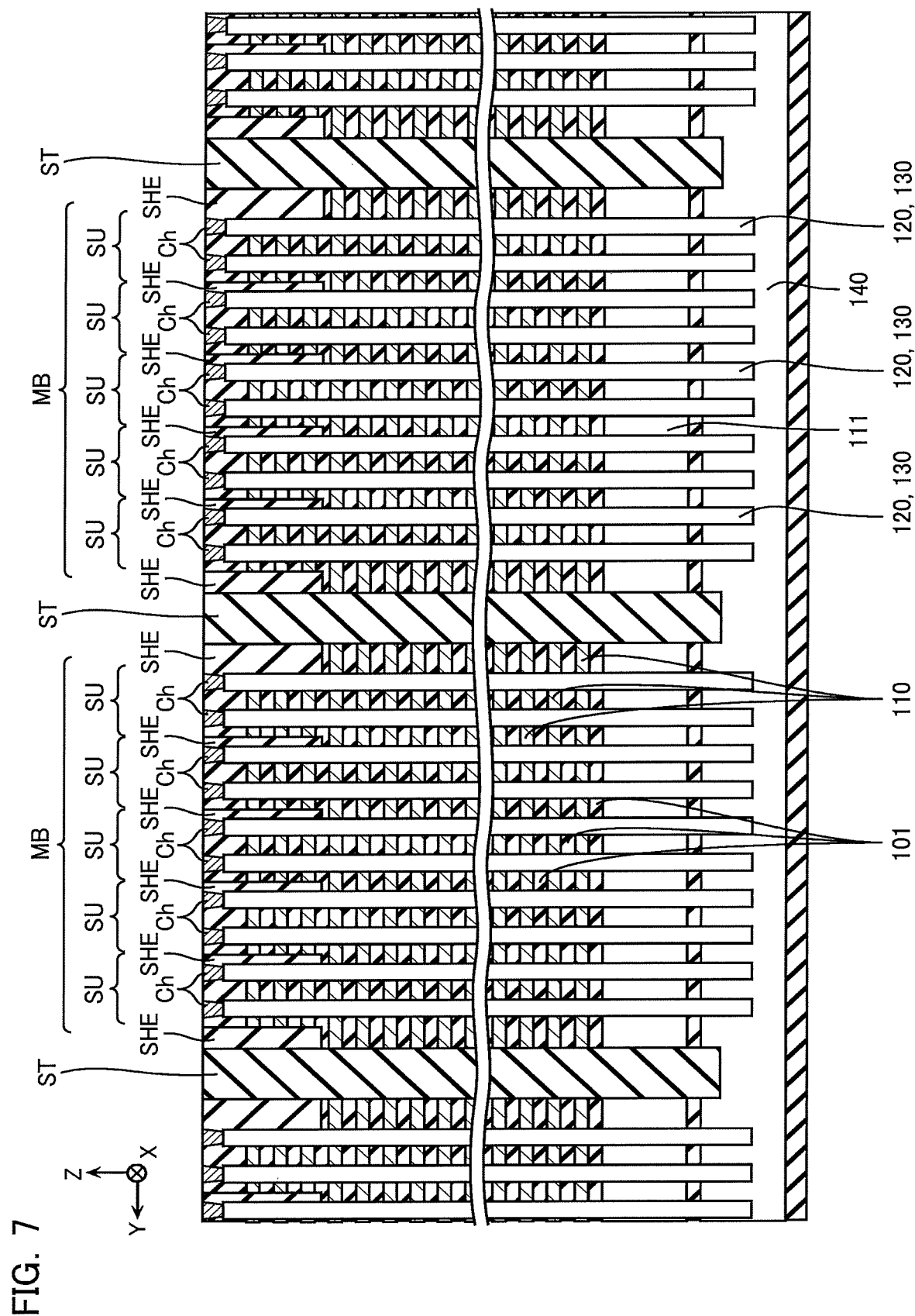
FIG. 7 is a schematic cross-sectional view when the structure illustrated in FIG. 5 is taken along the line B-B' and viewed in the arrow direction.

FIG. 6 is an enlarged view of a portion indicated by A in FIG. 5. FIG. 7 is a schematic cross-sectional view where the structure illustrated in FIG. 5 is taken along the line B-B' and viewed in the arrow direction. In the example in FIG. 6, in the memory area MR of each of the memory blocks MB, five string units SU arranged in the Y direction are disposed. In each of the string units SU, the above-described plurality of semiconductor layers 120 and gate insulating films 130 are disposed in the X direction and the Y direction. Between two string units SU arranged in the Y direction, an inter-string-unit insulating layer SHE is disposed. As illustrated in FIG. 7, among the plurality of conducting layers 110, ones that function as the drain select line SGD are separated in the Y direction via the inter-string-unit insulating layers SHE. As illustrated in FIG. 6, these conducting layers 110 are connected to the contacts CC disposed in the respective contact regions CR1. The contact CC may include, for example, a laminated film of titanium nitride (TiN) and tungsten (W), or may include another material or the like. At the proximity of the contact CC, approximately cylindrical columnar shaped support members HR that support the interlayer insulating layer 101 during the manufacturing process are disposed. The support member HR includes, for example, silicon oxide ($SiO_2$). Between the memory blocks MB arranged in the Y direction, an inter-memory-block insulating layer ST is disposed. The inter-memory-block insulating layer ST includes, for example, silicon oxide ($SiO_2$). As illustrated in FIG. 7, the plurality of conducting layers 110 are separated in the Y direction via the inter-memory-block insulating layer ST.

Figure 8:
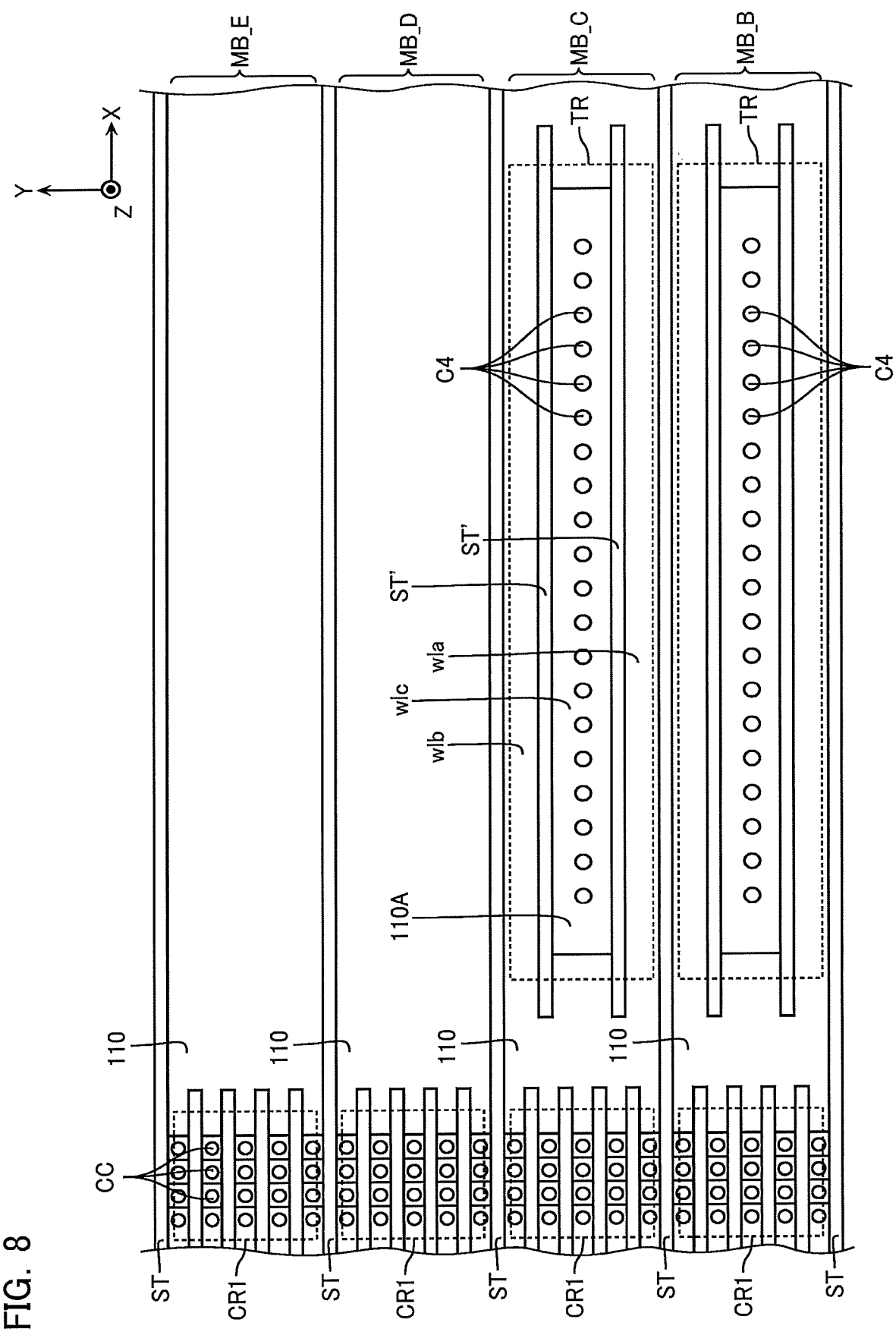
FIG. 8 is a schematic enlarged view of FIG. 5.

FIG. 8 is an enlarged view of a part of FIG. 5 and a schematic plan view illustrating a configuration in the contact region CR1 and the through contact region TR. The contact region CR1 includes the plurality of contacts CC arranged in a matrix in the X direction and the Y direction, and end portions in the X direction of the plurality of conducting layers 110 connected to the plurality of these contacts CC. The plurality of contacts CC arranged in the X direction all have different lower end positions to be connected to the different conducting layers 110. The plurality of contacts CC arranged in the Y direction are connected to the plurality of conducting layers 110 separated in the Y direction via inter-string-unit insulating layers SHE.

Figure 9:
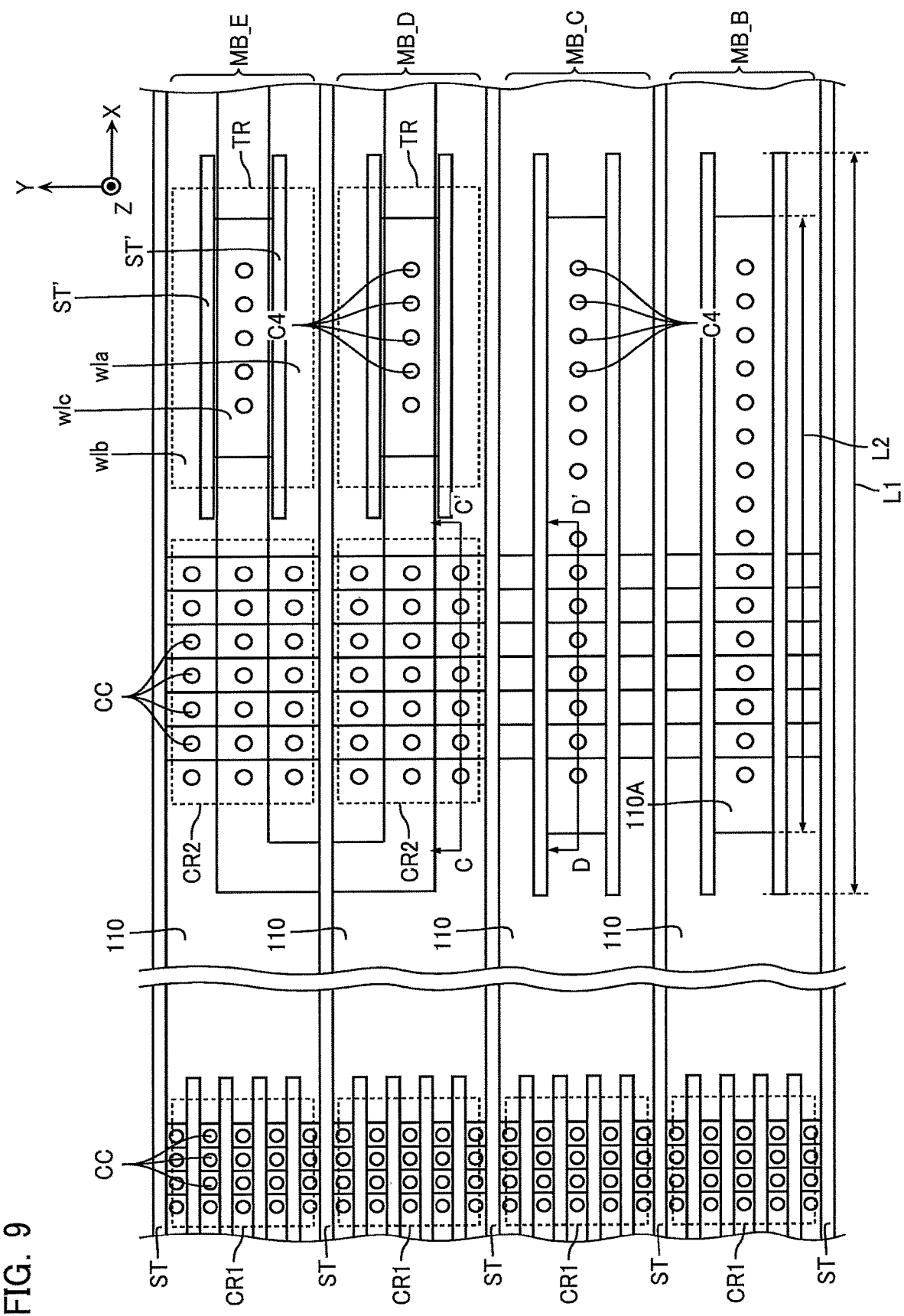
FIG. 9 is a schematic enlarged view of FIG. 5.
Figure 10:
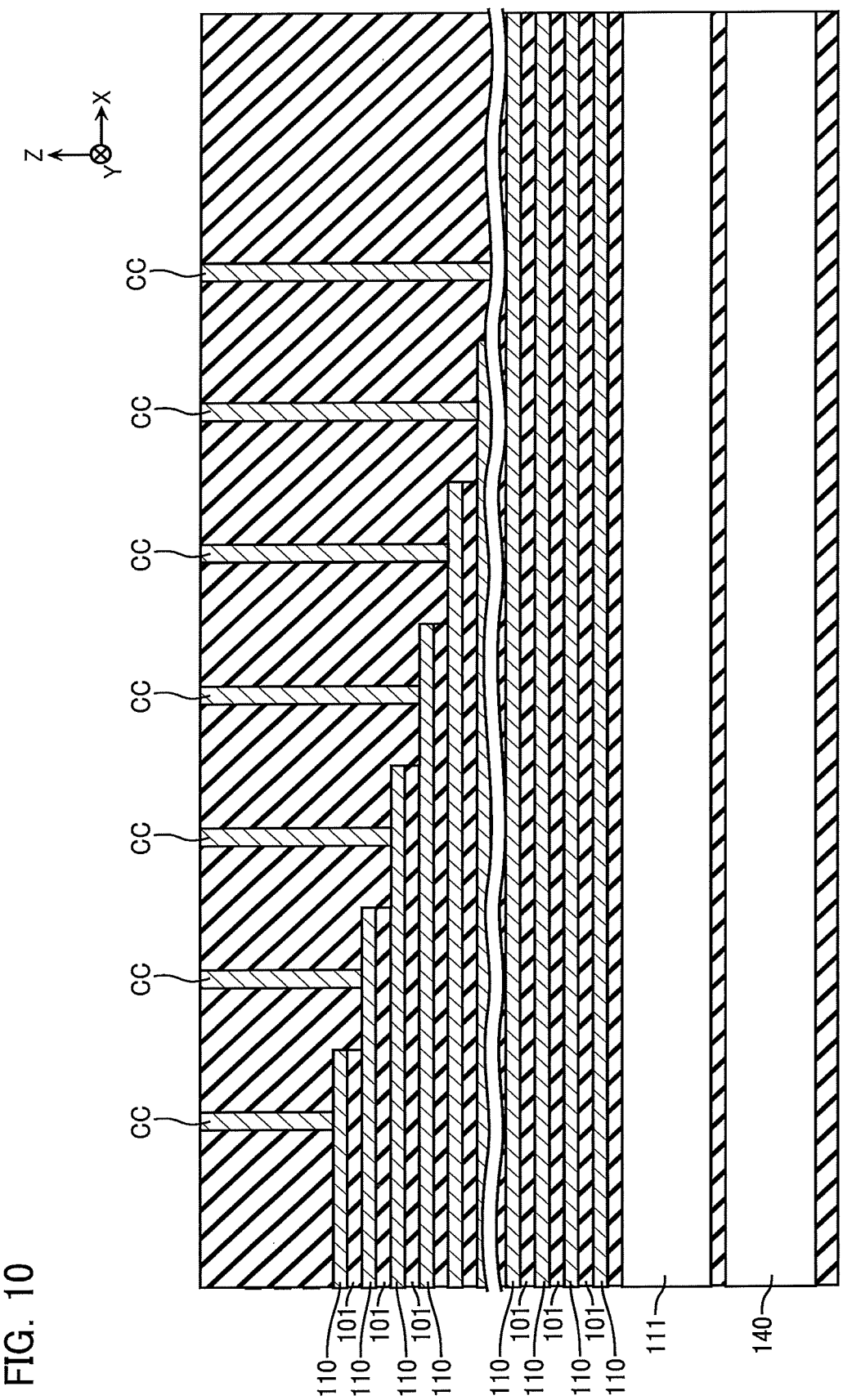
FIG. 10 is a schematic cross-sectional view where the structure illustrated in FIG. 5
Figure 11:
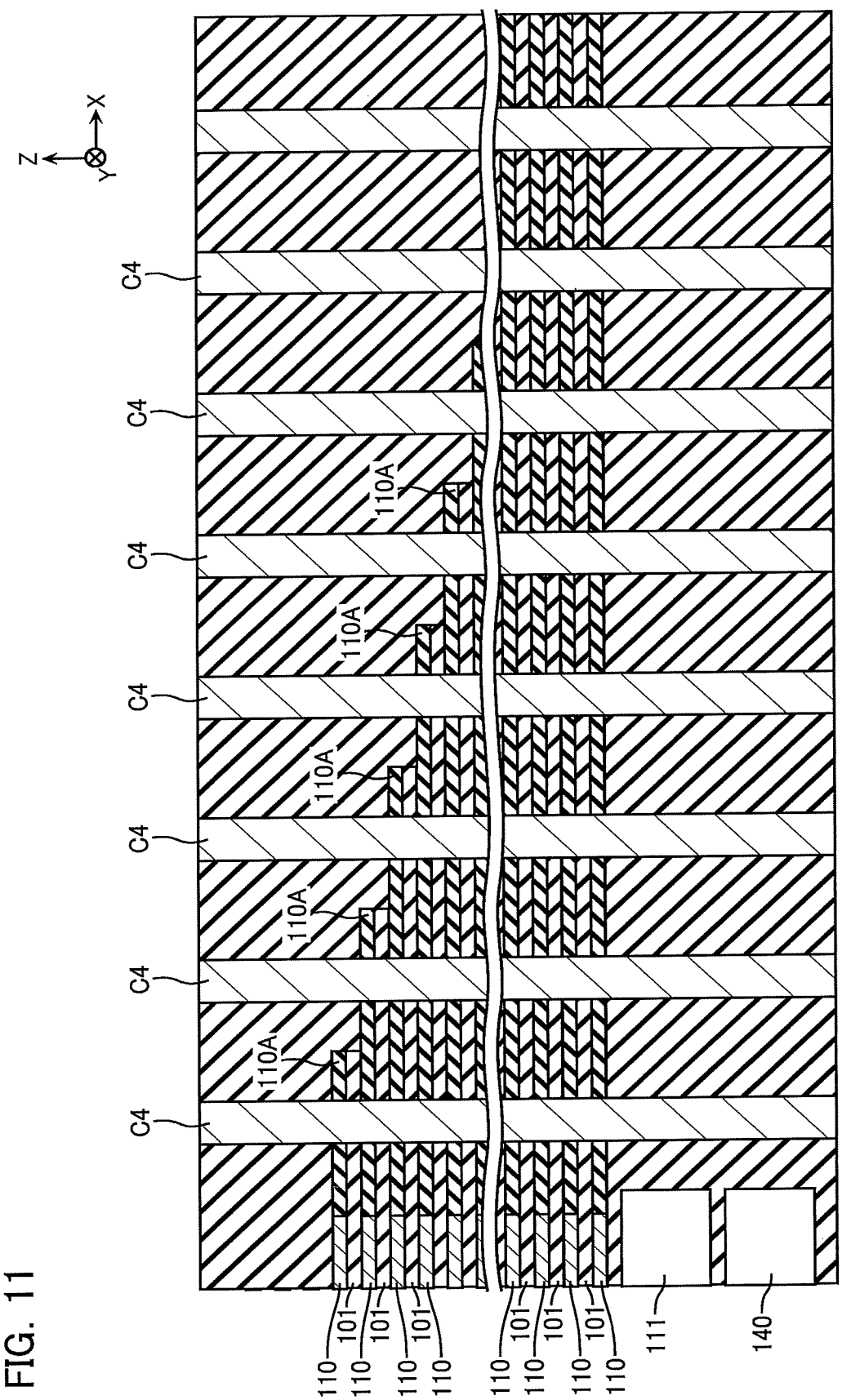
FIG. 11 is a schematic cross-sectional view where the structure illustrated in FIG. 5
Figure 12:
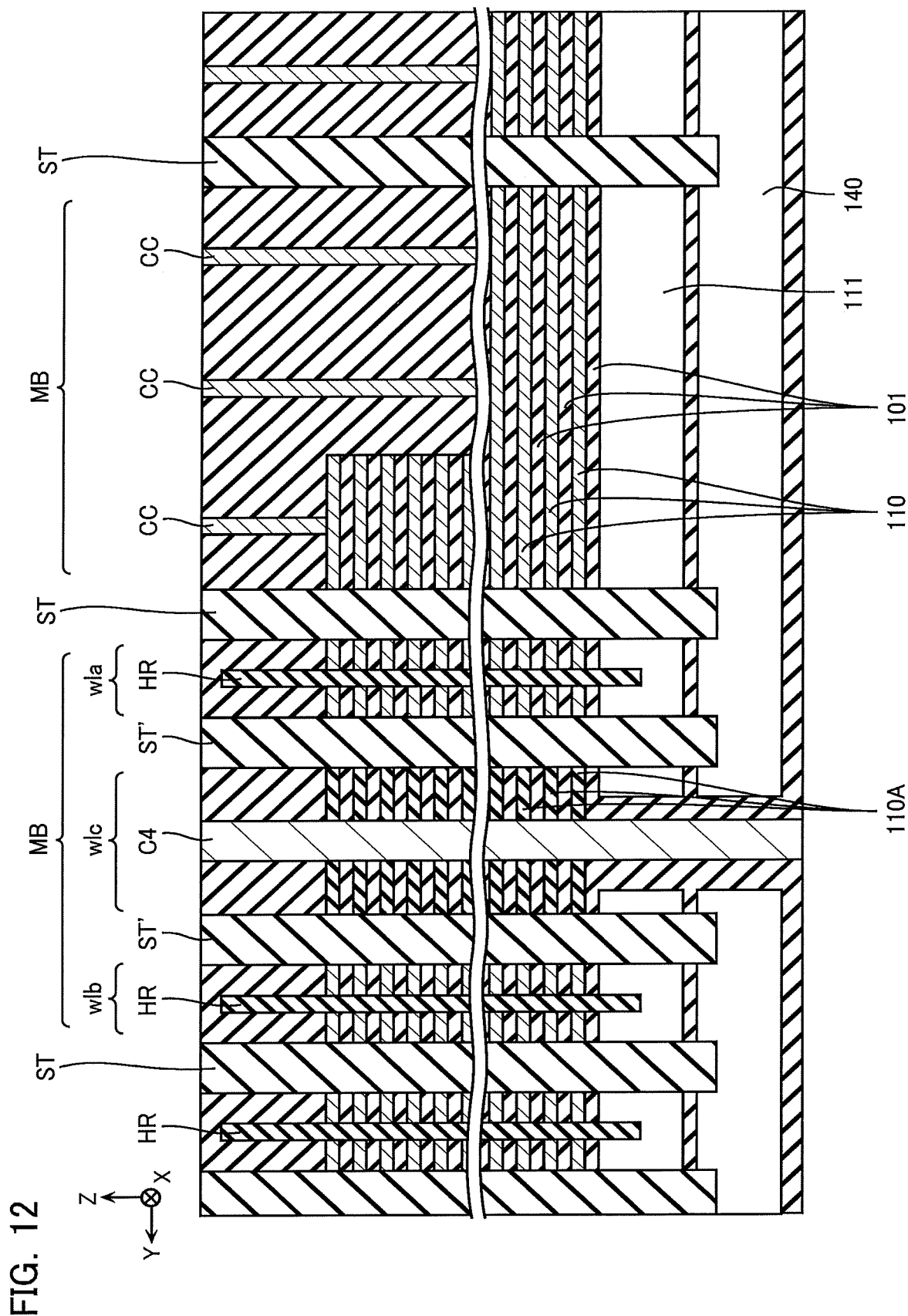
FIG. 12 is a schematic cross-sectional view where the structure illustrated in FIG. 5 is taken along the line E-E' and viewed in the arrow direction.

FIG. 9 is an enlarged view of a part of FIG. 5, and is a schematic plan view illustrating a configuration in the contact region CR2 and the through contact region TR. FIG. 10 is a schematic cross-sectional view where the structure illustrated in FIG. 5 and FIG. 9 are taken along the line C-C' and viewed in the arrow direction. FIG. 11 is a schematic cross-sectional view where the structure illustrated in FIG. 5 and FIG. 9 are taken along the line D-D' and viewed in the arrow direction. FIG. 12 is a schematic cross-sectional view where the structure illustrated in FIG. 5 is taken along the line E-E' and viewed in the arrow direction.

As illustrated in FIG. 9, the contact region CR2 includes the plurality of contacts CC arranged in a matrix in the X direction and the Y direction, and end portions in the X direction of the plurality of conducting layers 110 connected to the plurality of these contacts CC. As illustrated in FIG. 10, the plurality of contacts CC arranged in the X direction all have different lower end positions to be connected to the different conducting layers 110. As illustrated in FIG. 12, the plurality of contacts CC arranged in the Y direction all have different lower end positions to be connected to the different conducting layers 110.

As illustrated in FIG. 9, the through contact region TR includes wiring regions wla and wlb that extend in the X direction and are arranged in the Y direction, a contact region wlc that is disposed between these and extends in the X direction, and a stopper insulating layer ST' that is disposed between the wiring region wla and the contact region wlc, and between the wiring region wlb and the contact region wlc, and extends in the X direction. As illustrated in FIG. 12, the wiring regions wla and wlb include a part of the plurality of conducting layers 110 and the plurality of interlayer insulating layers 101 arranged in the Z direction. As illustrated in FIG. 11, the contact region wlc includes a plurality of through contacts C4 arranged in the X direction and a part of a plurality of insulating layers 110A and the plurality of interlayer insulating layers 101 arranged in the Z direction. The through contact C4 may include, for example, a laminated film of titanium nitride (TiN) and tungsten (W), and may include another material or the like. The through contacts C4 has an outer peripheral surface connected to inner circumferential surfaces of through holes disposed in the respective plurality of insulating layers 110A and plurality of interlayer insulating layers 101. The insulating layer 110A may be an insulating layer of, for example, silicon nitride (SiN), which includes silicon (Si) and nitrogen (N). Each of side surfaces in the Y direction of the insulating layers 110A is connected to aside surface of the stopper insulating layer ST'. As illustrated in FIG. 11, the side surfaces in the X direction of the insulating layers 110A are connected to the respective side surfaces in the Y direction of the conducting layers 110. The stopper insulating layer ST' includes, for example, silicon oxide ($SiO_2$). The stopper insulating layer ST' extends in the Z direction as illustrated in FIG. 12. As illustrated in FIG. 9, the stopper insulating layer ST' has a length L1 in the X direction greater than a length L2 in the X direction of the insulating layer 110A connected to this stopper insulating layer ST'.

[Manufacturing Method]

Figure 13:
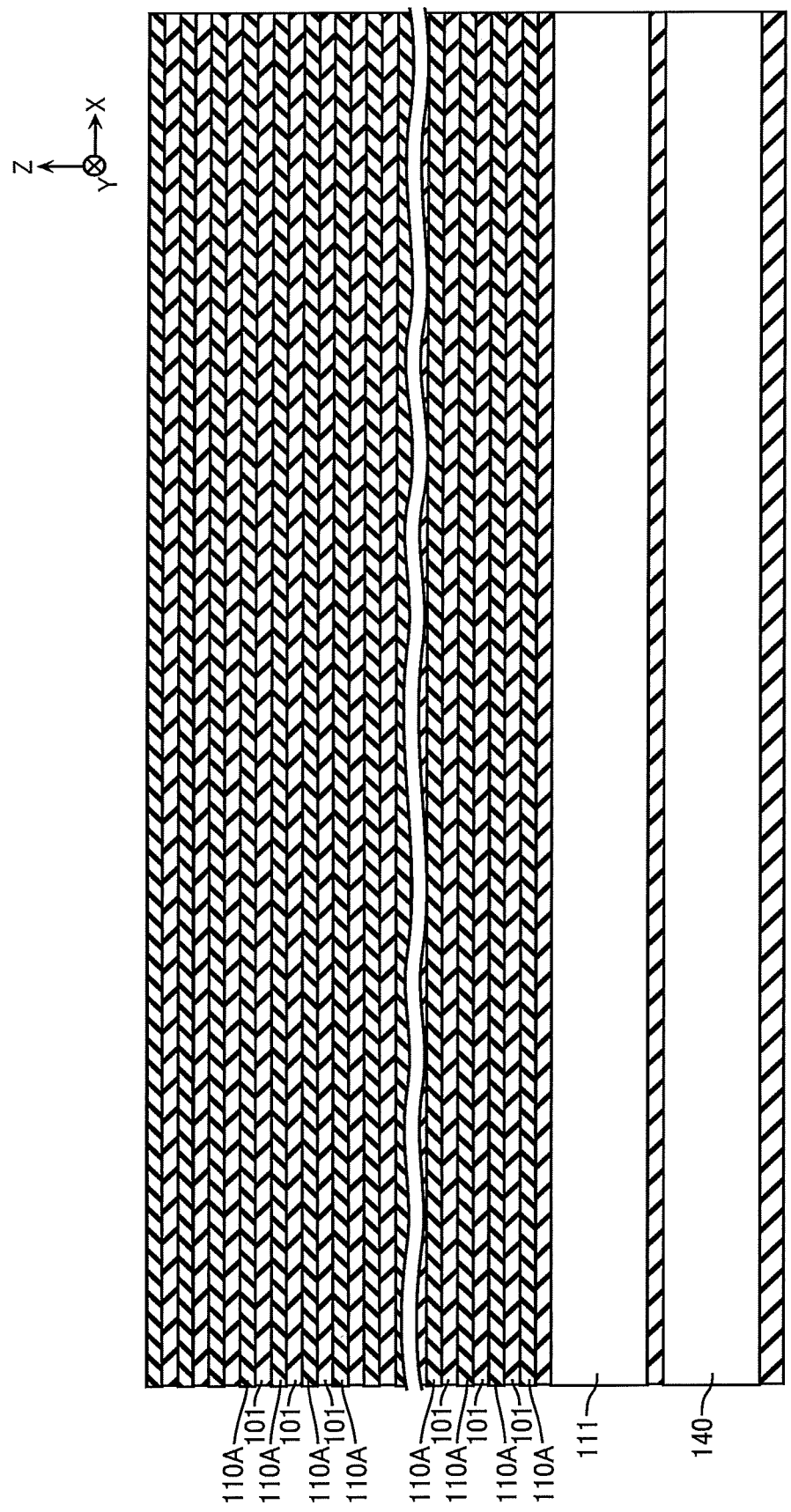
FIG. 13 is a schematic drawing illustrating a manufacturing method of the semiconductor memory device.
Figure 19:
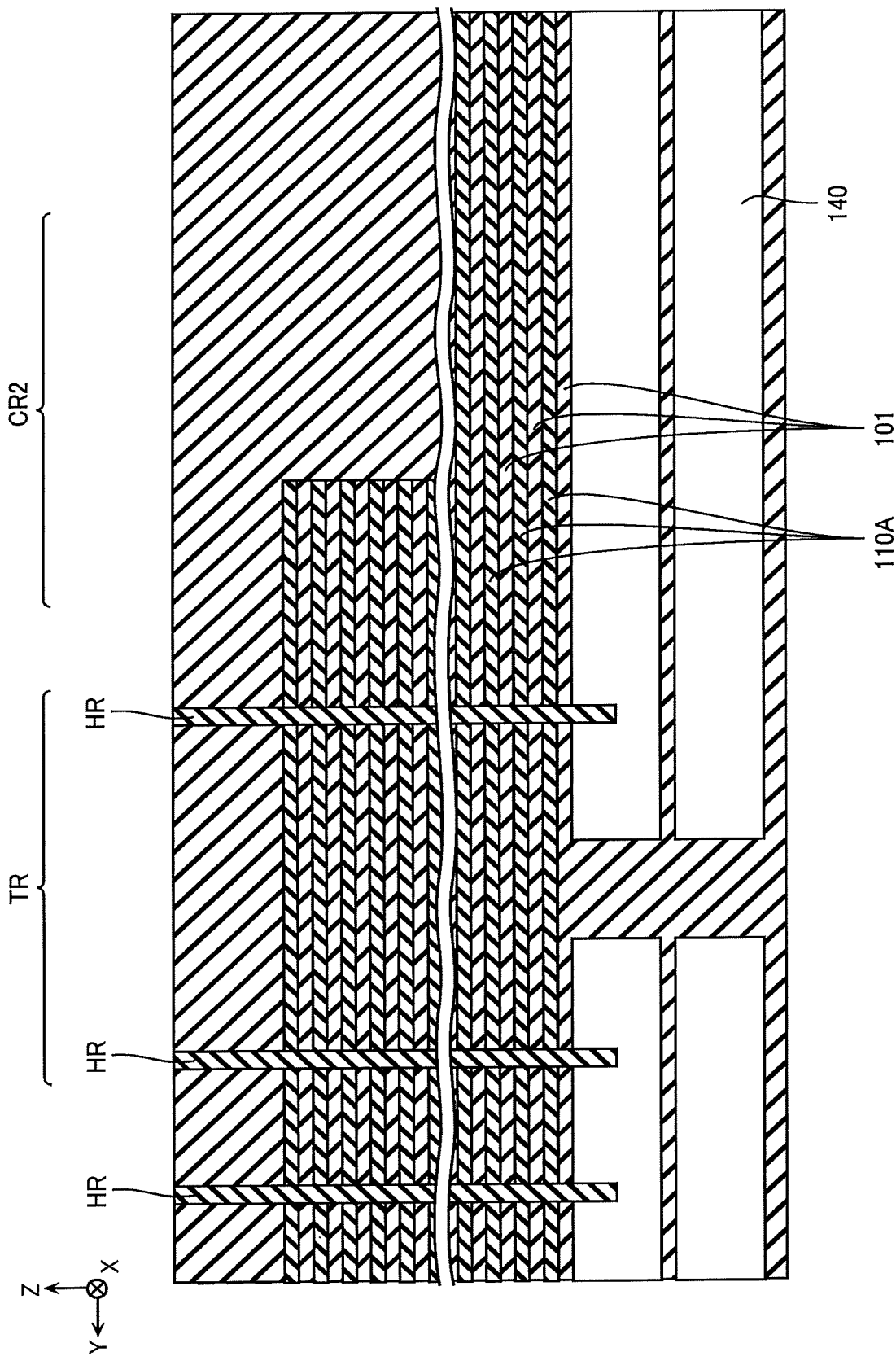
FIG. 19 is a schematic drawing illustrating the manufacturing method.
Figure 20:
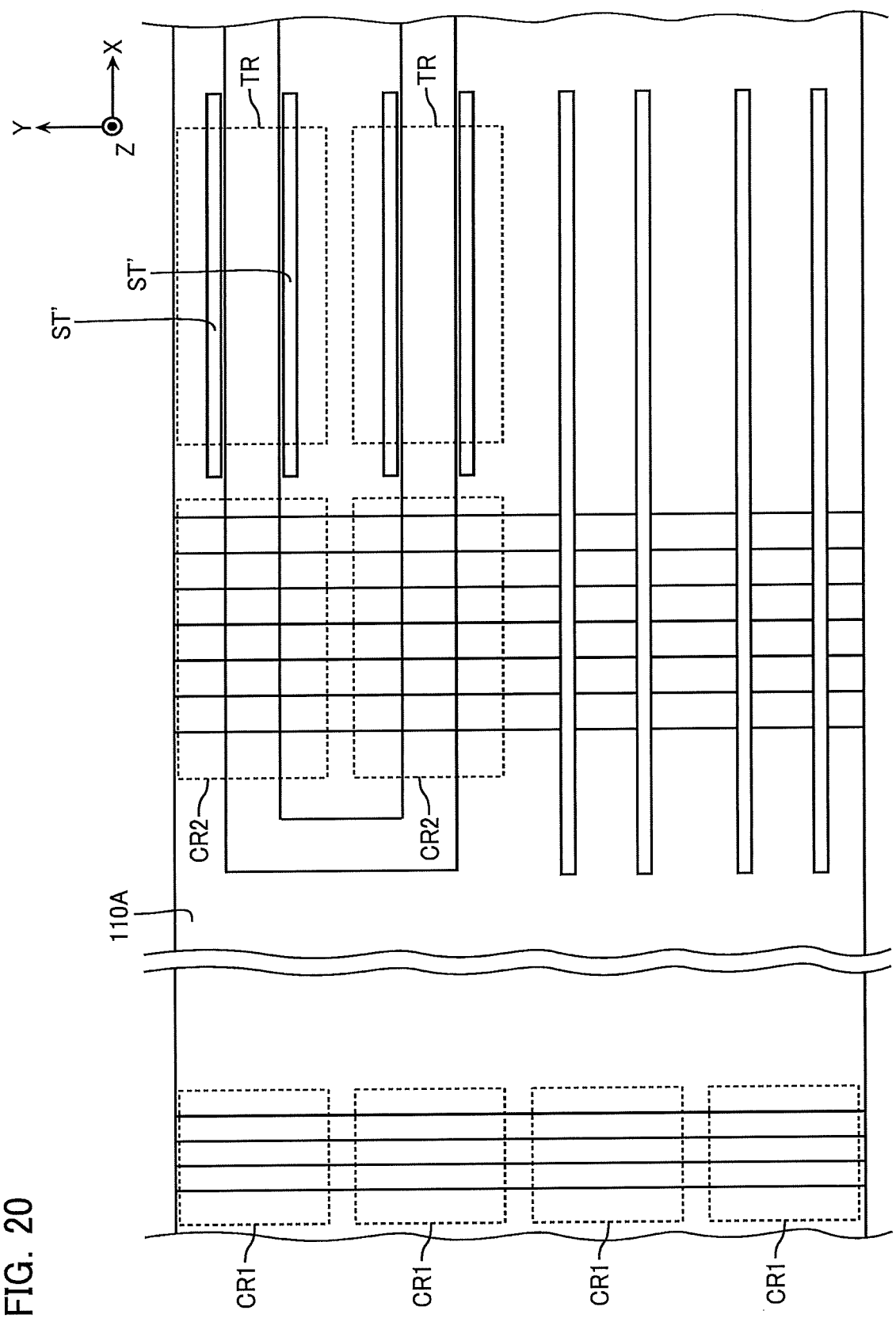
FIG. 20 is a schematic drawing illustrating the manufacturing method.
Figure 23:
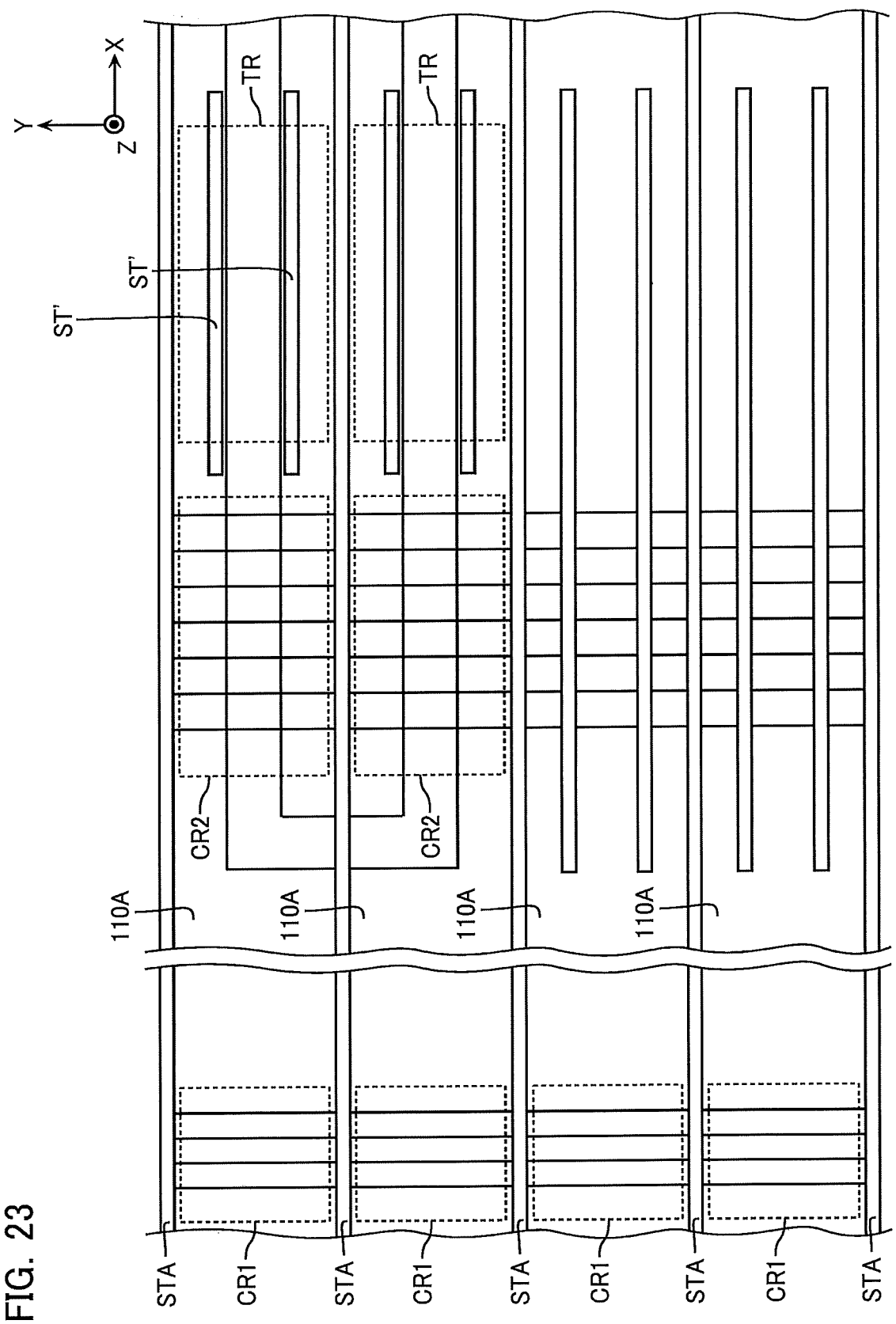
FIG. 23 is a schematic drawing illustrating the manufacturing method.
Figure 24:
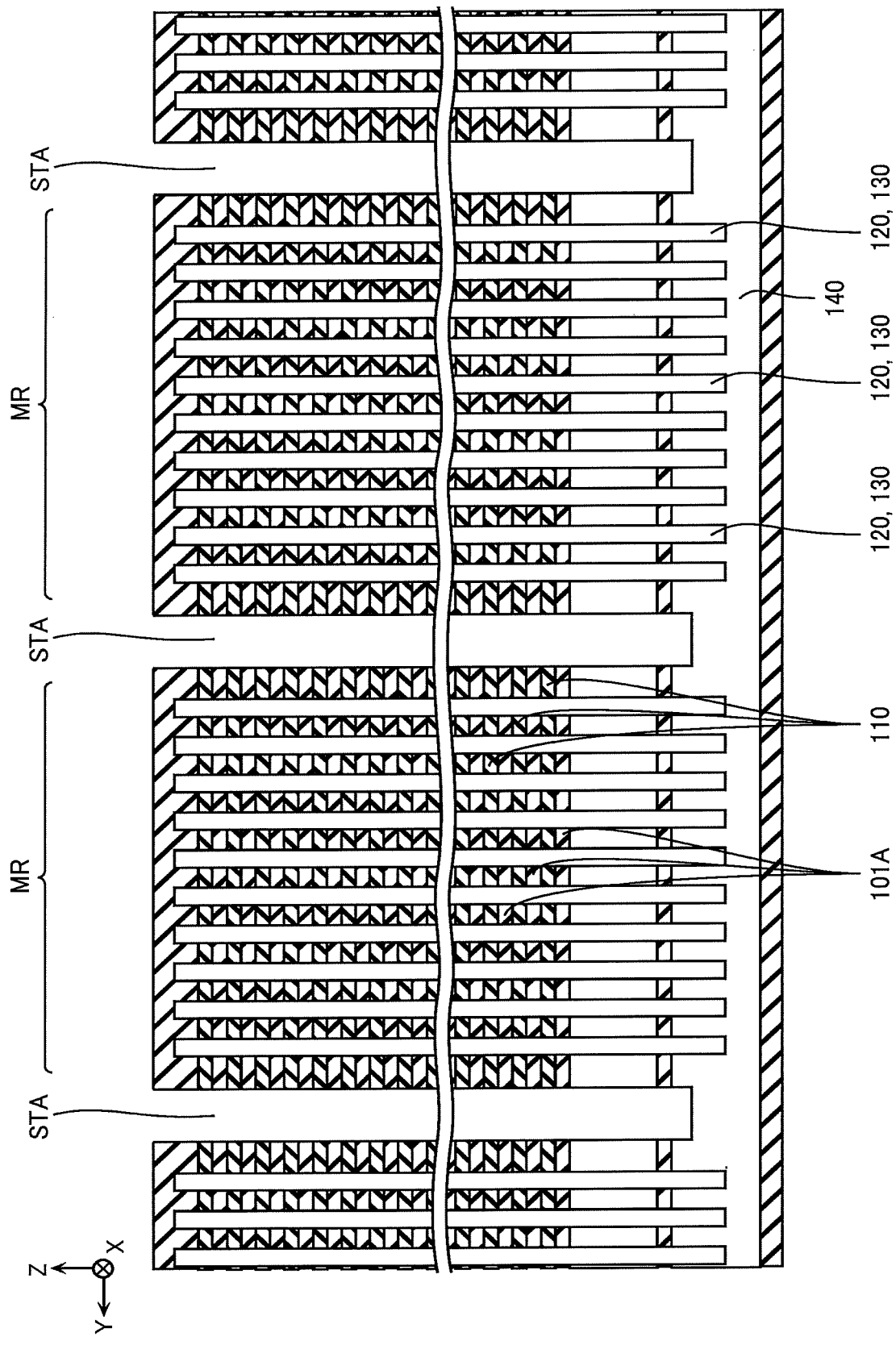
FIG. 24 is a schematic drawing illustrating the manufacturing method.
Figure 25:
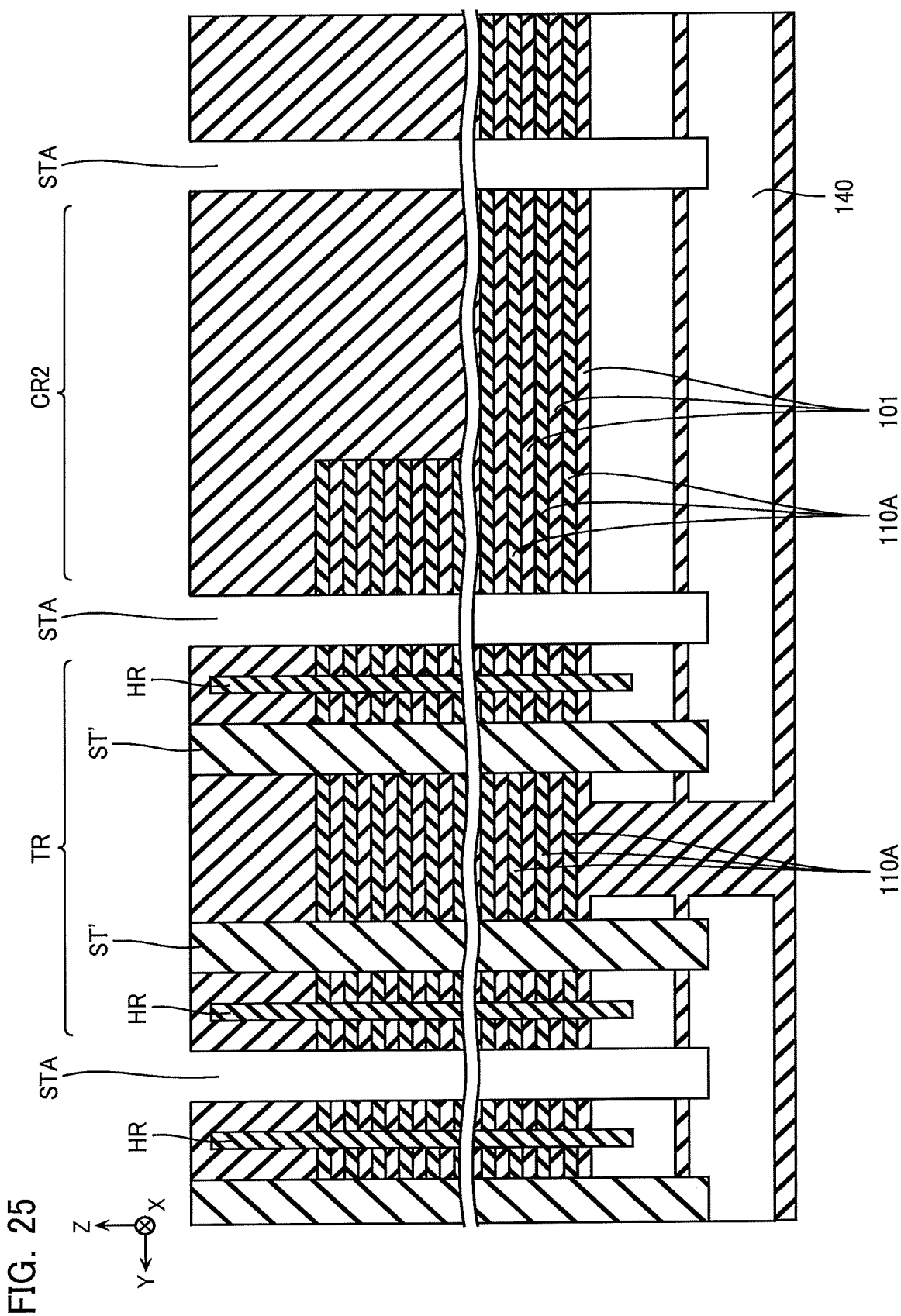
FIG. 25 is a schematic drawing illustrating the manufacturing method.
Figure 26:
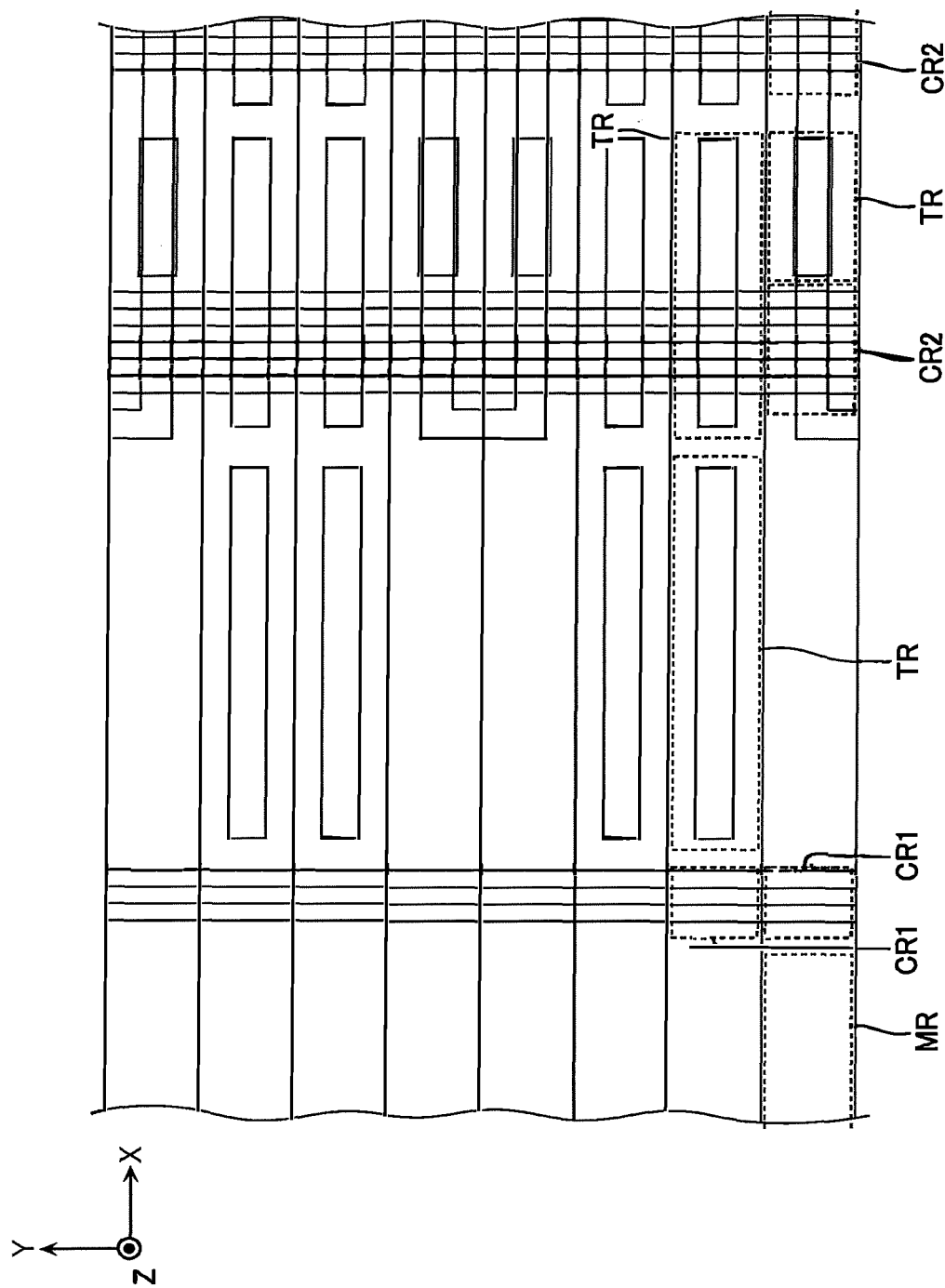
FIG. 26 is a schematic drawing illustrating the manufacturing method.
Figure 27:
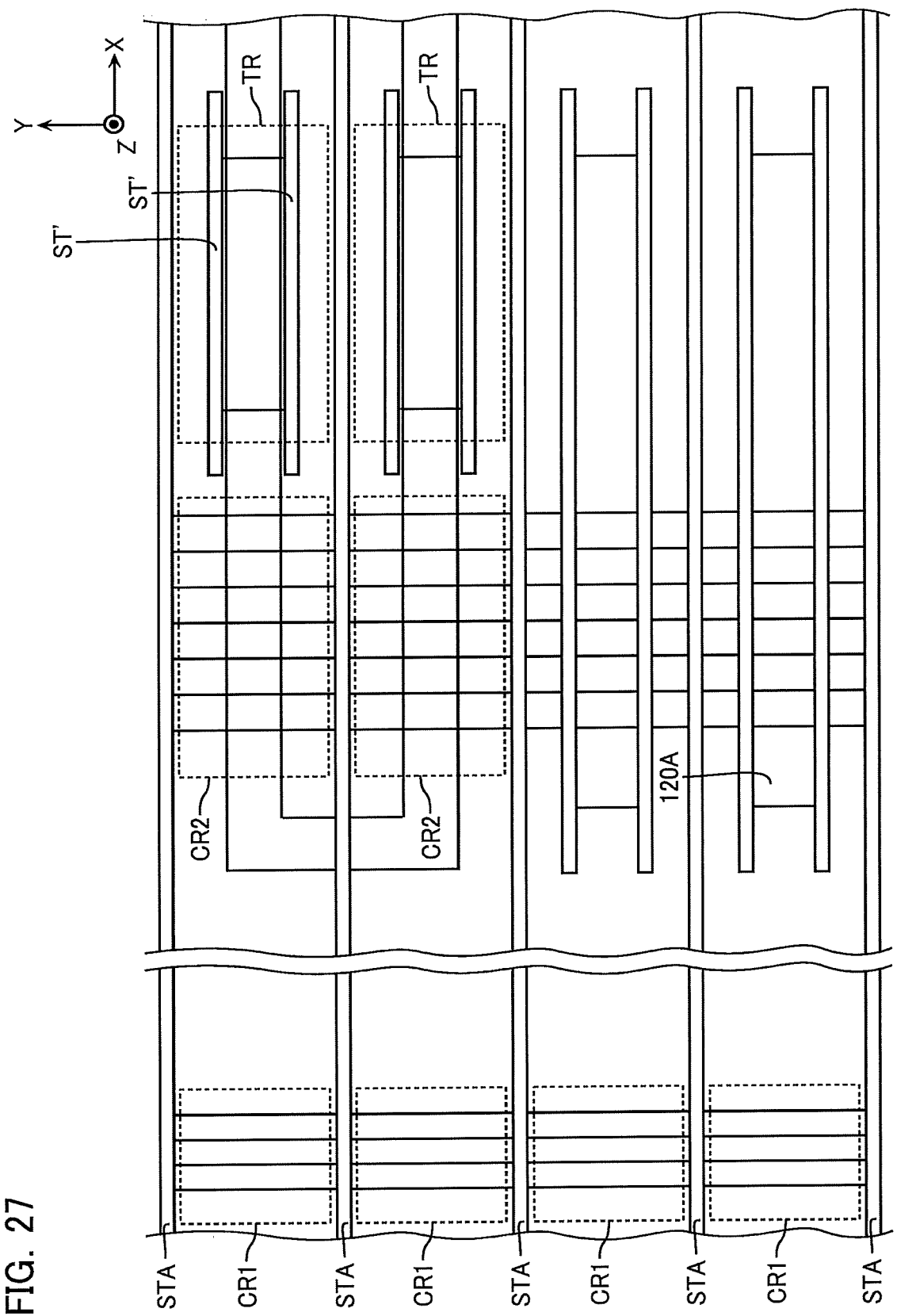
FIG. 27 is a schematic drawing illustrating the manufacturing method.
Figure 28:
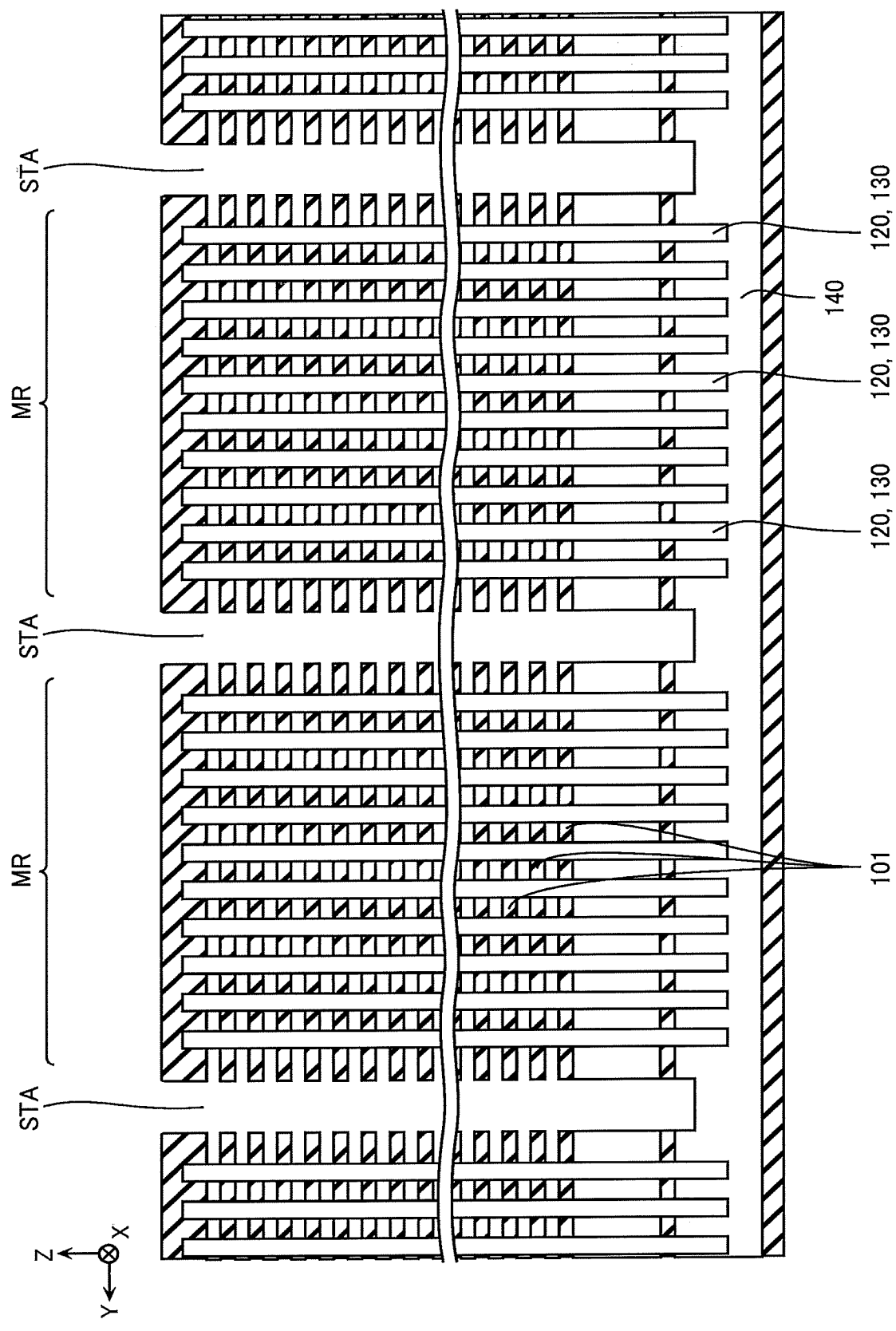
FIG. 28 is a schematic drawing illustrating the manufacturing method.
Figure 29:
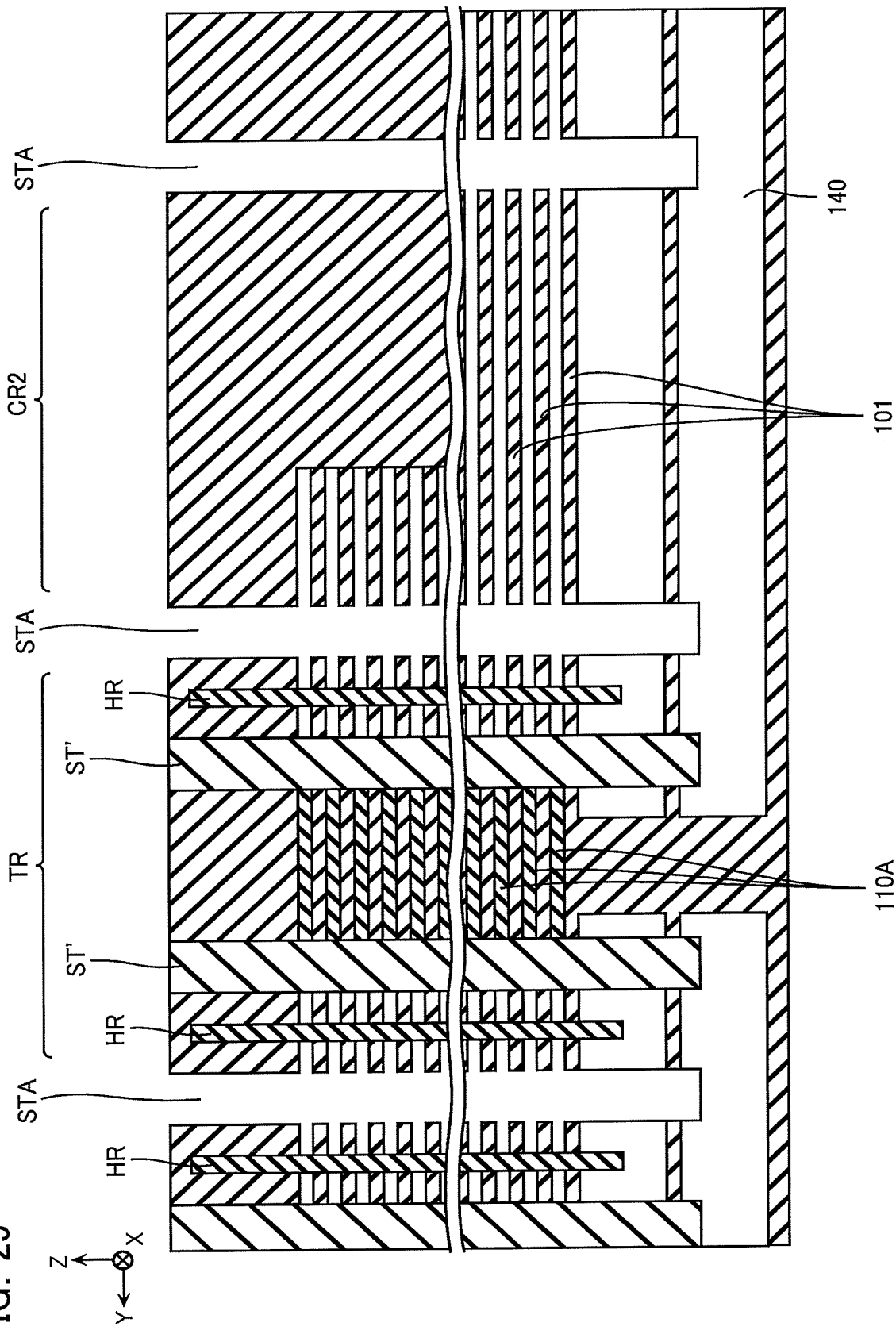
FIG. 29 is a schematic drawing illustrating the manufacturing method.

Next, with reference to FIG. 13 to FIG. 32, a part of a manufacturing method of the semiconductor memory device according to the embodiment will be described. FIG. 13 and FIG. 15 correspond to the cross-sectional surface illustrated in FIG. 10. FIG. 14, FIG. 16, FIG. 22, and FIG. 26 correspond to the planar surface illustrated in FIG. 5. FIG. 17, FIG. 19, FIG. 21, FIG. 25, FIG. 29, FIG. 31, and FIG. 32 correspond to the cross-sectional surface illustrated in FIG. 12. FIG. 18, FIG. 24, FIG. 28, and FIG. 30 correspond to the cross-sectional surface illustrated in FIG. 7. FIG. 20, FIG. 23, and FIG. 27 correspond to the planar surface illustrated in FIG. 9.

In the manufacturing method, the circuit layer CL (FIG. 2) is formed on the semiconductor substrate S.

Next, for example, as illustrated in FIG. 13, the conducting layer 140, the conducting layer 111, and the plurality of insulating layers 110A, and interlayer insulating layers 101 are formed on the circuit layer CL. This process is, for example, performed by a method, such as a Chemical Vapor Deposition (CVD).

Figure 14:
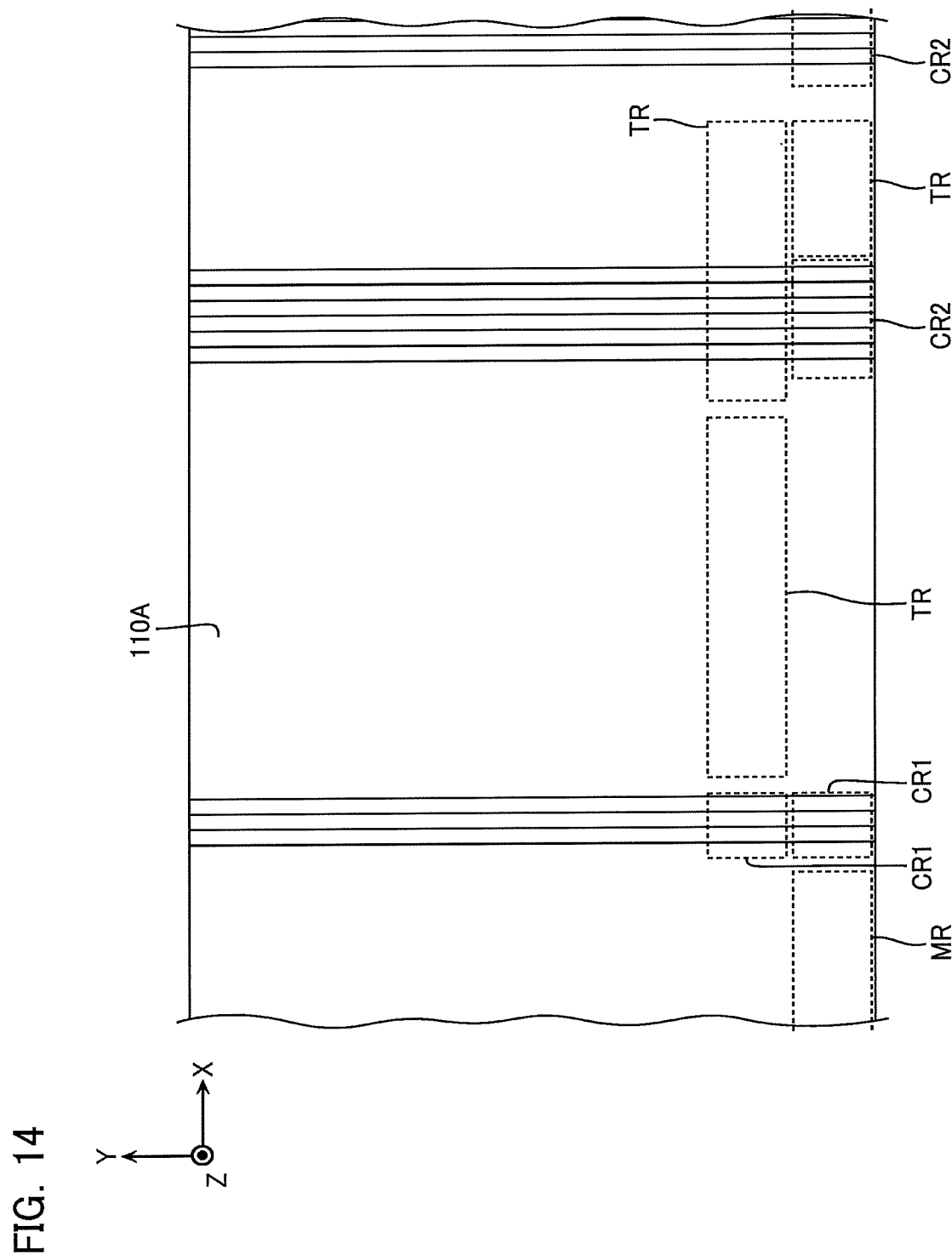
FIG. 14 is a schematic drawing illustrating the manufacturing method.
Figure 15:
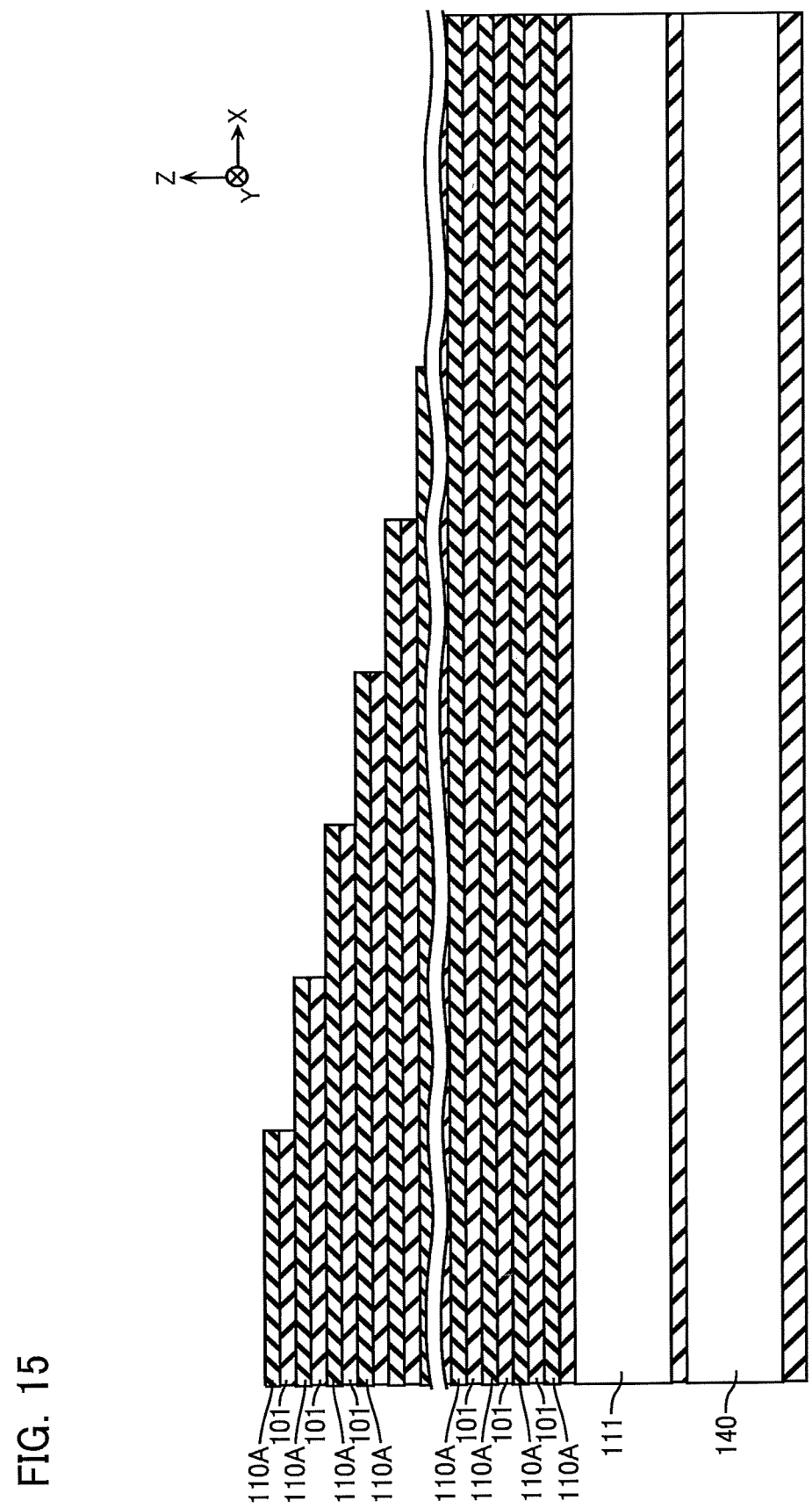
FIG. 15 is a schematic drawing illustrating the manufacturing method.

Next, for example, as illustrated in FIG. 14 and FIG. 15, a part of the insulating layers 110A and the interlayer insulating layers 101 is removed in a part of the contact regions CR1 and CR2, and the through contact regions TR to form an approximate staircase patterned structure. This process is performed by forming a resist on a top surface of the structure illustrated in FIG. 13, and repeatedly performing a removal of a part of the insulating layers 110A, a removal of a part of the interlayer insulating layers 101, and a removal of a part of the resist.

Figure 16:
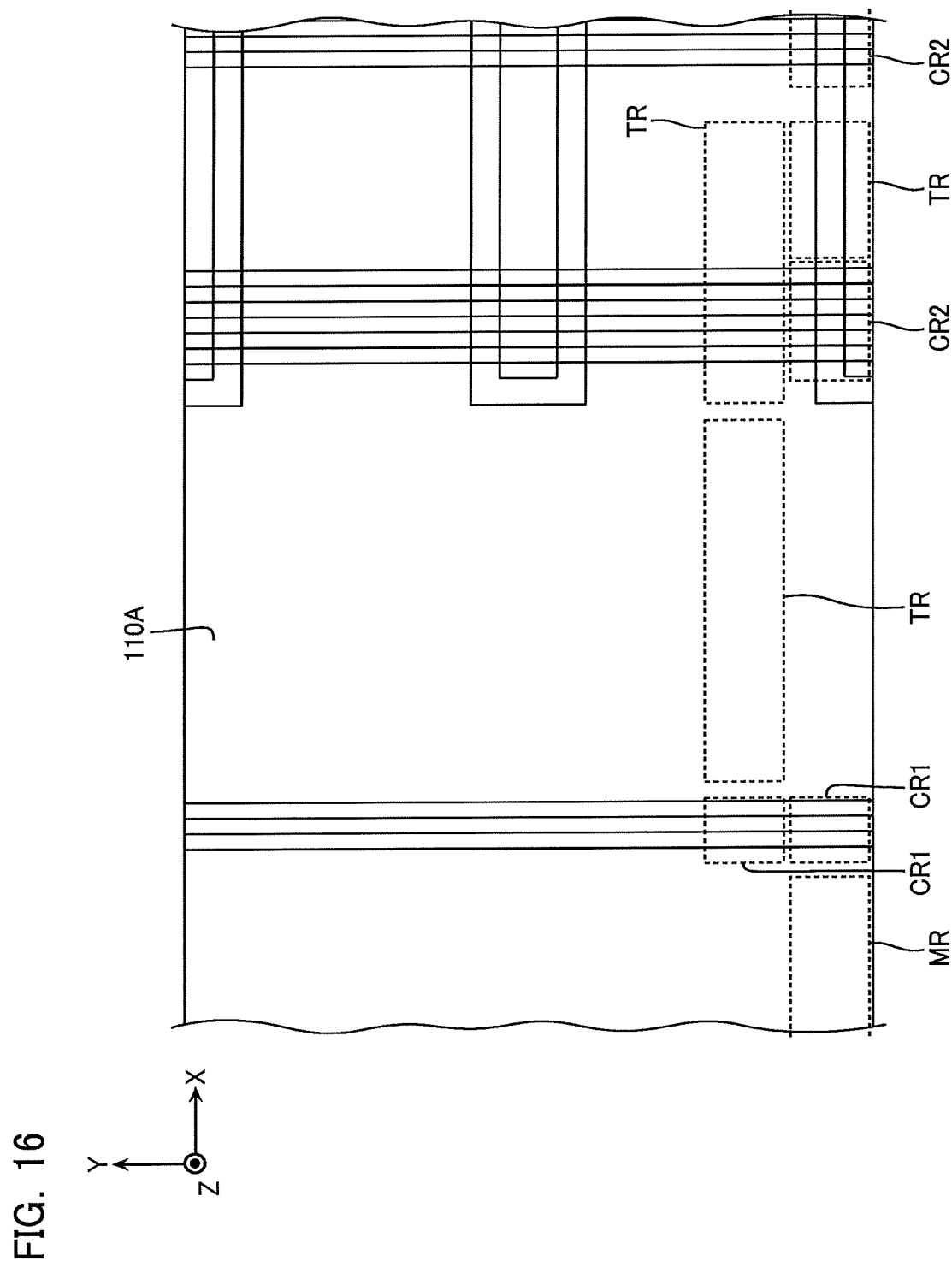
FIG. 16 is a schematic drawing illustrating the manufacturing method.
Figure 17:
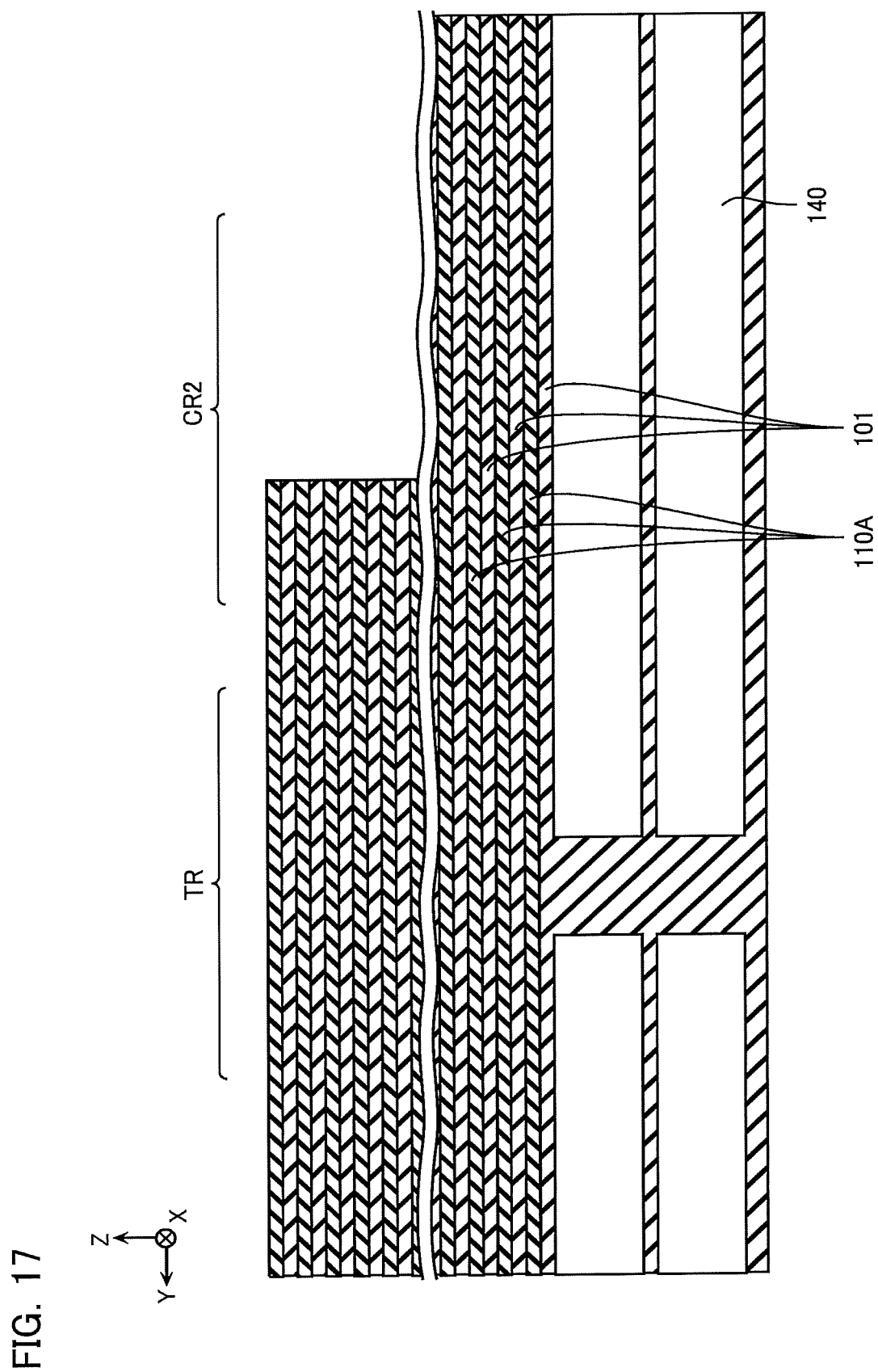
FIG. 17 is a schematic drawing illustrating the manufacturing method.

Next, for example, as illustrated in FIG. 16 and FIG. 17, a part of the insulating layers 110A and the interlayer insulating layers 101 is removed in a part of the contact regions CR2 and the through contact regions TR to form an approximate staircase patterned structure. This process is, for example, performed by forming a resist on a top surface of the structure illustrated in FIG. 14 and FIG. 15, and repeatedly performing a removal of a part of the insulating layers 110A, a removal of a part of the interlayer insulating layers 101, and a removal of a part of the resist.

Figure 18:
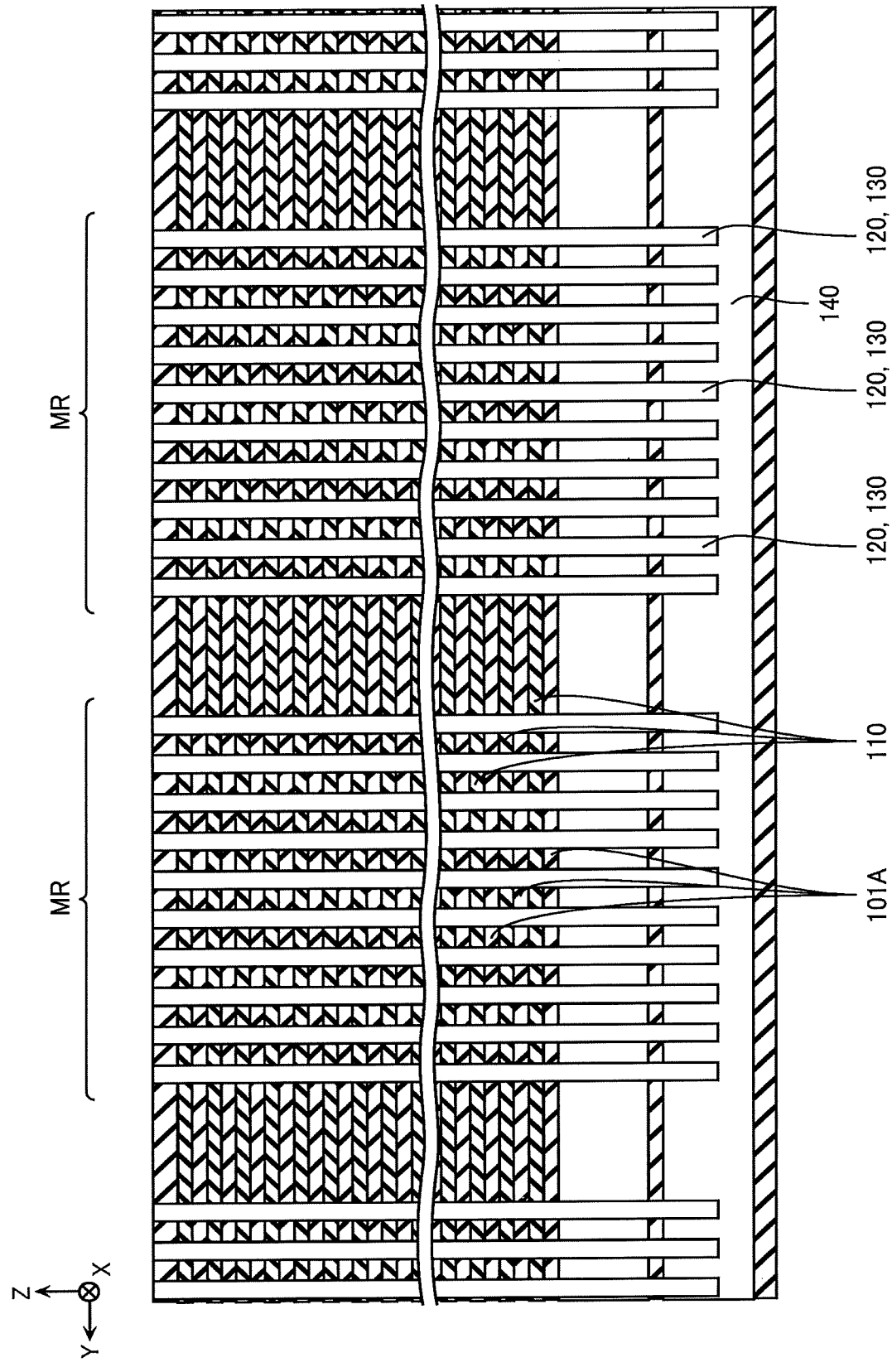
FIG. 18 is a schematic drawing illustrating the manufacturing method.

Next, for example, as illustrated in FIG. 18, the semiconductor layers 120 and the gate insulating films 130 are formed in the memory area MR. As illustrated in FIG. 19, the support members HR are formed in the contact regions CR1 and CR2, and the through contact region TR. This process is, for example, performed by a formation of through holes by Reactive Ion Etching (RIE) or the like, and a film formation by the CVD or the like.

Figure 21:
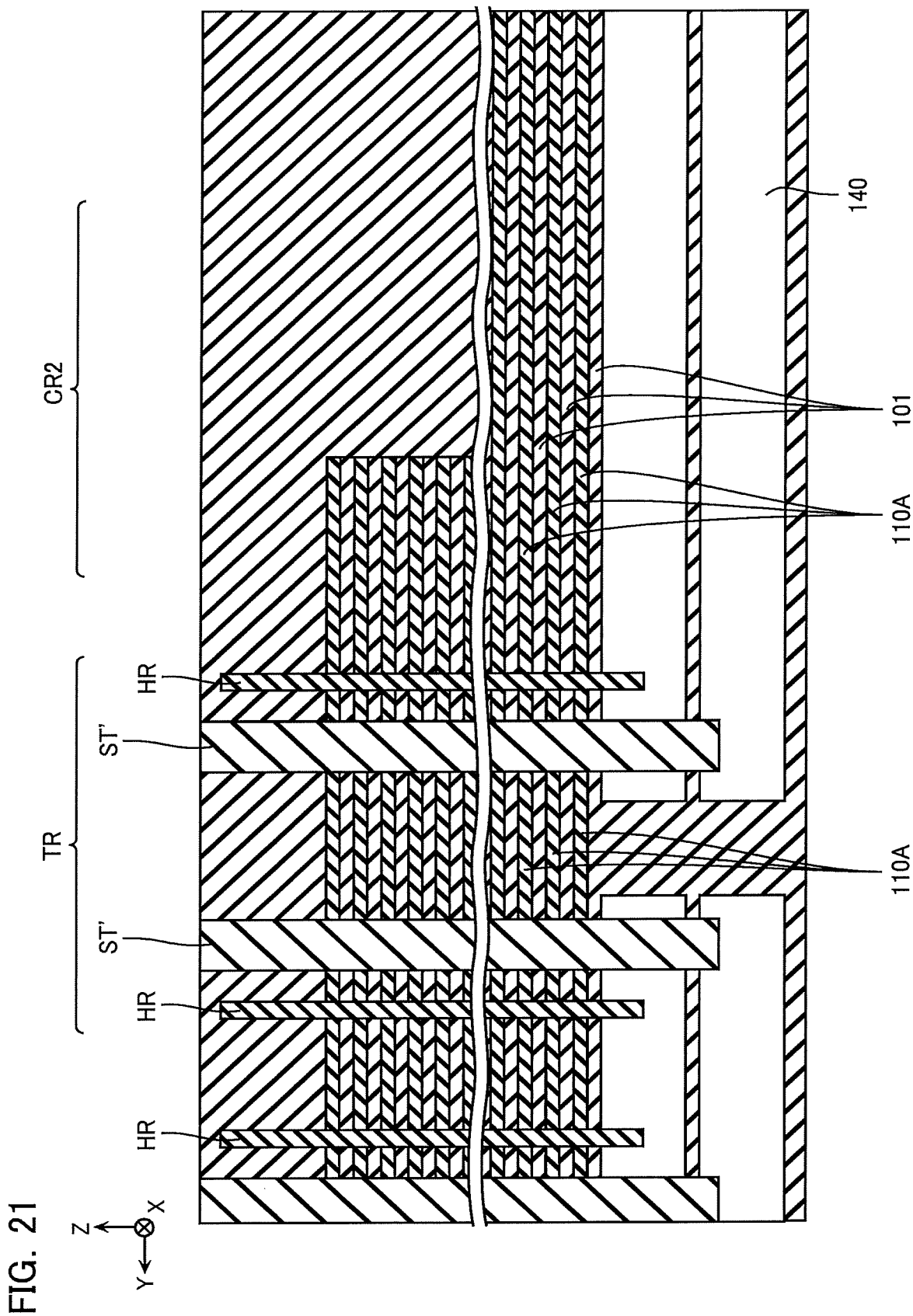
FIG. 21 is a schematic drawing illustrating the manufacturing method.
Figure 22:
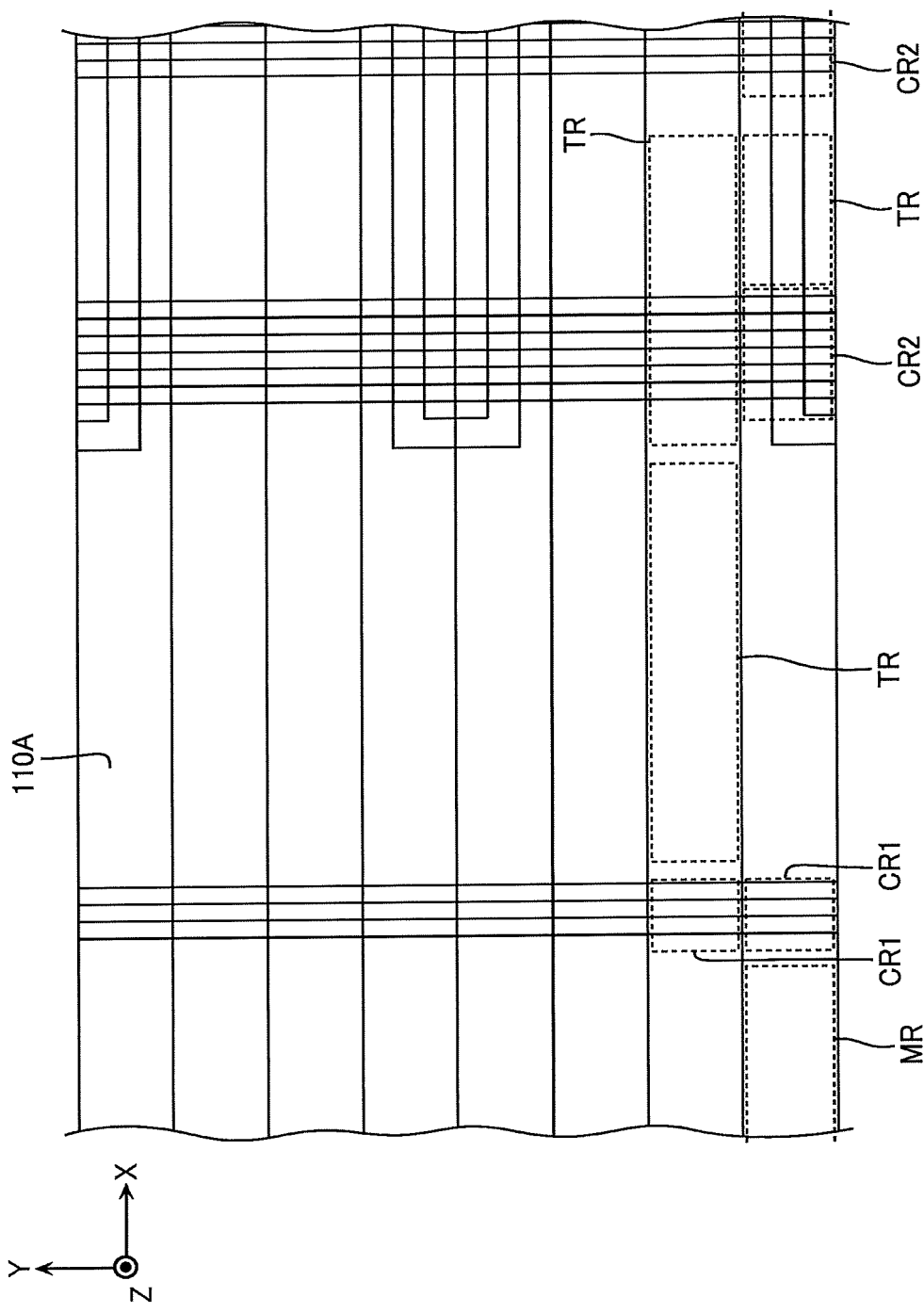
FIG. 22 is a schematic drawing illustrating the manufacturing method.

Next, for example, as illustrated in FIG. 20 and FIG. 21, the stopper insulating layers ST' are formed in the through contact regions TR. This process is, for example, performed by a formation of trenches by the RIE or the like and a film formation by the CVD or the like.

Next, for example, as illustrated in FIG. 22 to FIG. 25, trenches STA are formed at positions corresponding to the inter-memory-block insulating layers ST. This process is, for example, performed by the RIE or the like.

Next, for example, as illustrated in FIG. 26 to FIG. 29, apart of the insulating layers 110A is removed. This process is, for example, performed by performing wet etching or the like using phosphoric acid or the like via the trenches STA to selectively remove the insulating layers 110A. Note that a part of the insulating layers 110A is protected by the stopper insulating layer ST' to be remained without being removed.

Figure 30:
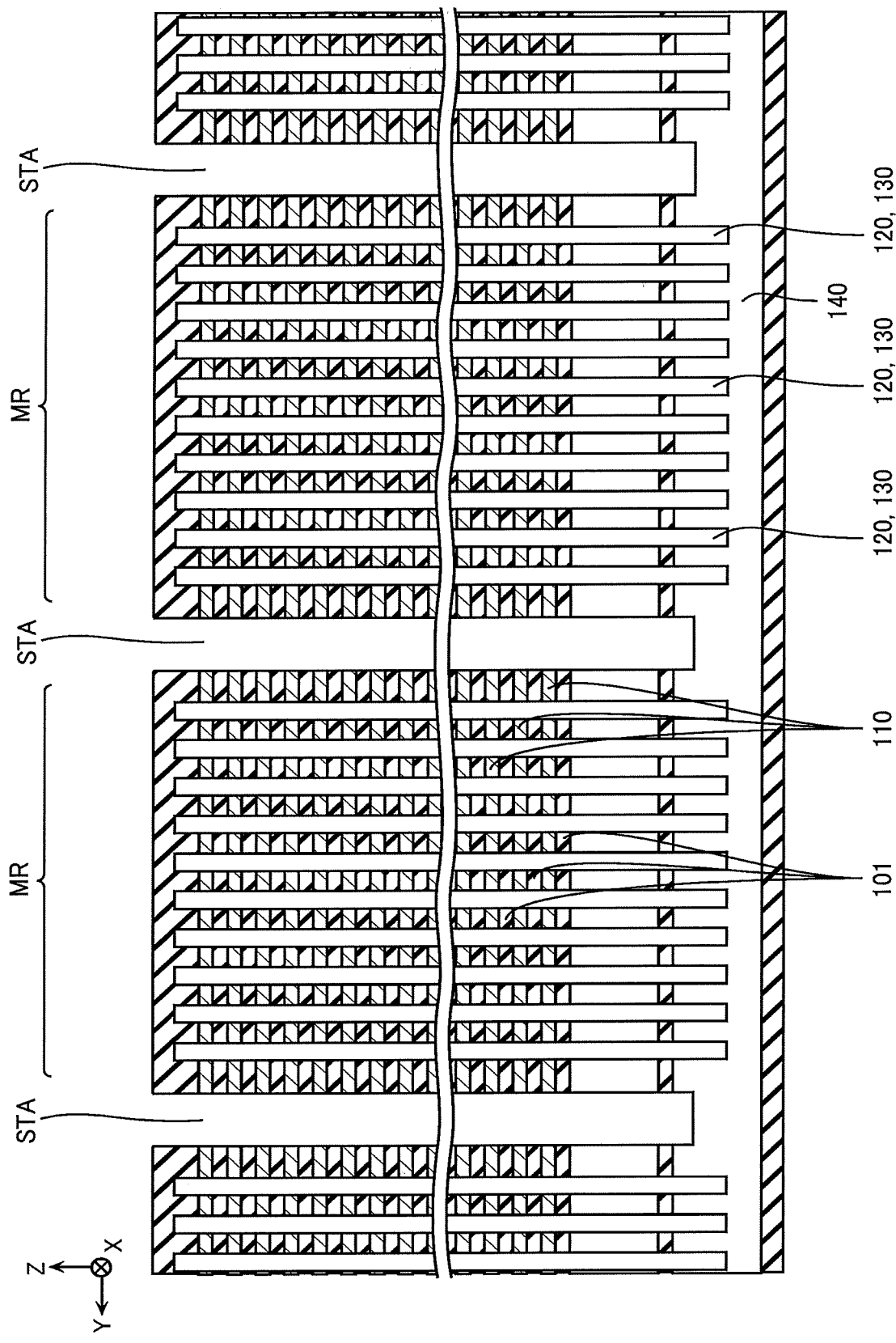
FIG. 30 is a schematic drawing illustrating the manufacturing method.
Figure 31:
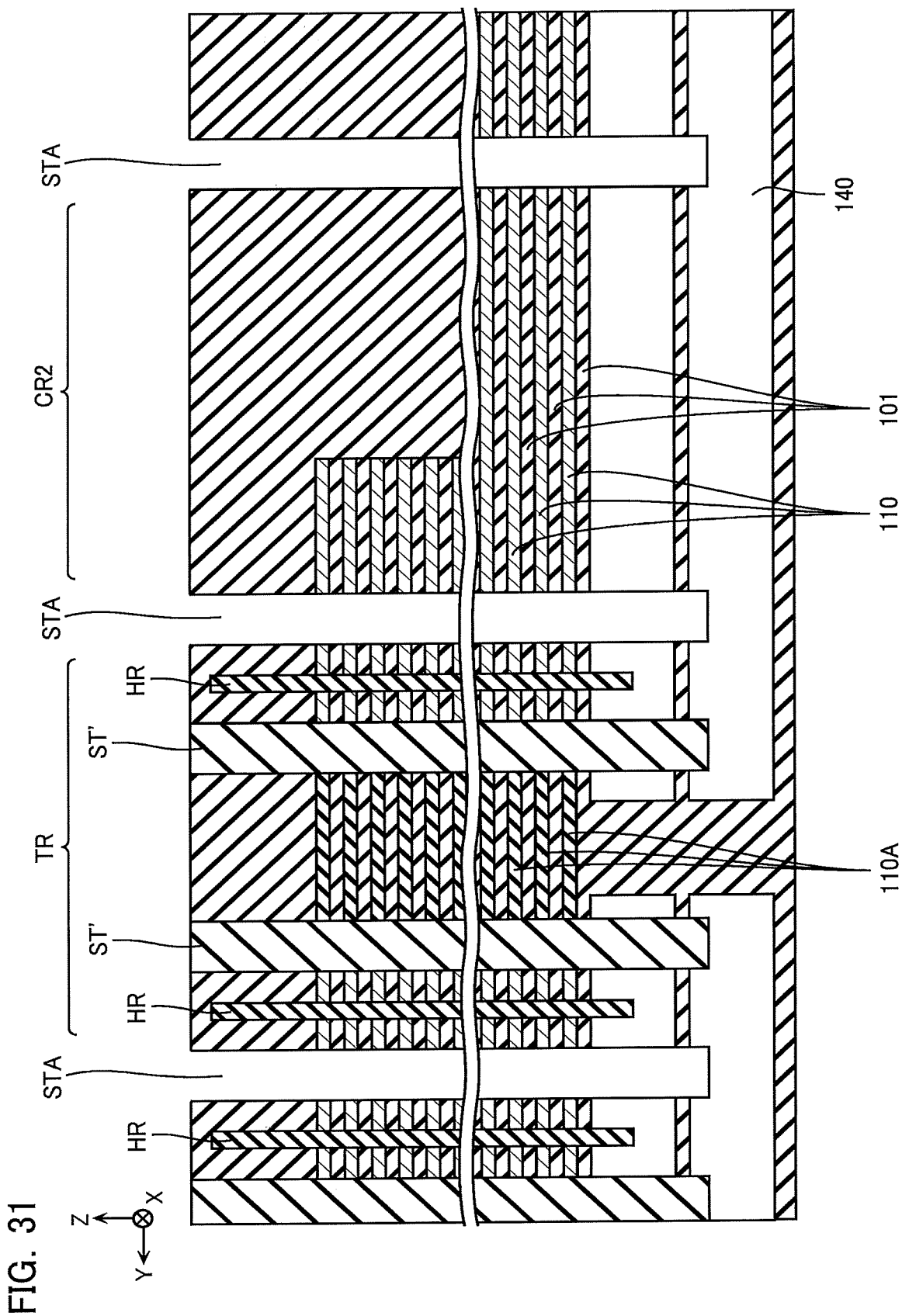
FIG. 31 is a schematic drawing illustrating the manufacturing method.

Next, for example, as illustrated in FIG. 30 to FIG. 31, the conducting layers 110 are formed. This process is, for example, performed by a film formation of the conducting layers 110 by the CVD or the like via the trenches STA and a separation of the conducting layers 110 by the wet etching or the like.

Figure 32:
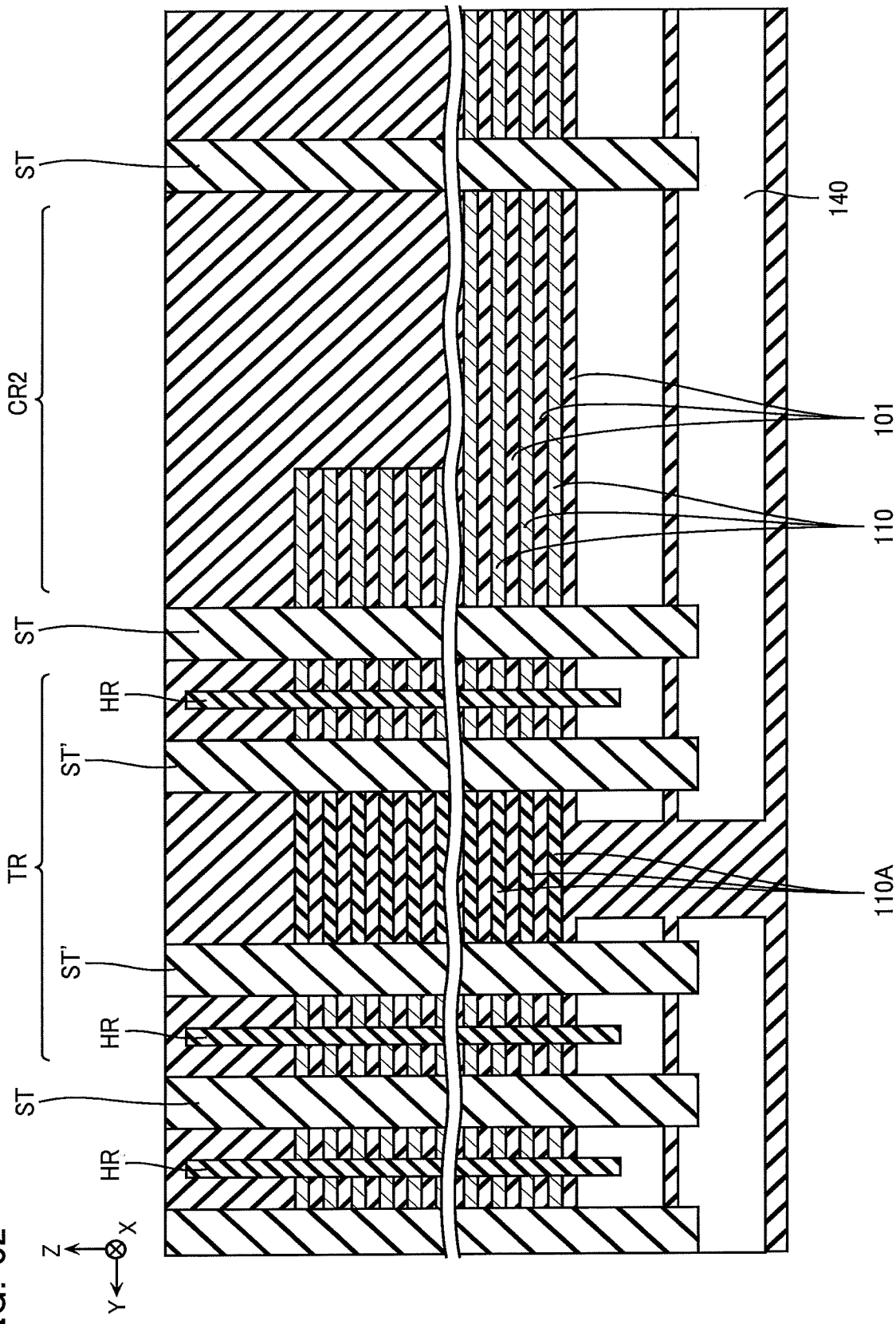
FIG. 32 is a schematic drawing illustrating the manufacturing method.

Next, for example, as illustrated in FIG. 32, the inter-memory-block insulating layer ST is formed. This process is, for example, performed by the CVD or the like.

Afterwards, forming the through contacts C4, the inter-string-unit insulating layers SHE, and the like forms a structure as described with reference to FIG. 4 to FIG. 12 and the like.

[Effect]

There has been known a semiconductor memory device including a plurality of conducting layers laminated in the direction intersecting with a surface of a substrate, a semiconductor layer opposed to the plurality of these conducting layers, and electric charge accumulating film disposed between the plurality of these conducting layers and the semiconductor layer. When such a semiconductor memory device is manufactured, for example, it is possible to form a plurality of conducting layers and a plurality of interlayer insulating layers on the substrate, form memory holes that pass through the plurality of these conducting layers and the plurality of these interlayer insulating layers, and dispose the electric charge accumulating film and the semiconductor layer on an inner circumferential surface of this memory hole. However, when the memory holes are formed on the plurality of conducting layers and the plurality of interlayer insulating layers, an aspect ratio of the memory hole decreases in some cases. Therefore, in some cases, a plurality of sacrificial layers and a plurality of interlayer insulating layers are laminated instead of laminating the plurality of conducting layers and the plurality of interlayer insulating layers, the sacrificial layers are removed after the memory holes, the semiconductor layers, and the like are formed, and the conducting layers are formed in a part where the sacrificial layer was formed.

In such a semiconductor memory device, for example, as described with reference to FIG. 2, the transistor, the wiring, and the like are disposed below the memory cell array in some cases. In such a configuration, in order to connect the configuration in the memory layer ML and the configuration disposed in the upper side of the memory layer ML to the transistor and the like in the circuit layer CL, a through contact that passes through the memory layer ML is disposed in some cases. Such a through contact can be formed by, for example, forming a contact hole that passes through a plurality of conducting layers functioning as the word lines WL and the like, and forming an insulating layer and a conducting layer such as metal or the like on an inner circumferential surface of this contact hole. However, in such a case, the insulating layer for insulating between the conducting layer and the through contact is necessary to be formed on the inner circumferential surface of the contact hole, and therefore, an inner diameter of the contact hole increases in some cases. This increases a distance between the through contacts to increase an area of the through contact region in some cases.

Therefore, in the semiconductor memory device according to the embodiment, a part of the above-described sacrificial layer is used as the insulating layer between the contacts. Such a method eliminates a need for disposing the insulating layer in the contact hole, thereby ensuring removing the distance between the through contacts. This ensures decreasing the area of the through contact region TR.

In the semiconductor memory device according to the embodiment, in removing the insulating layer 110A, the stopper insulating layer ST' that reduces a progress of a chemical liquid of, for example, the wet etching is disposed. This ensures accurately setting a position, an area, and the like of the through contact region TR.

In the embodiment, two stopper insulating layers ST' in a straight line extending in the X direction reduce the progress of the chemical liquid. Such a configuration is, for example, easily achievable for sake of convenience of processing and the like compared with a configuration that has four stopper insulating layer ST' in a straight line extending along four sides of the through contact region TR.

Second Embodiment

Next, a semiconductor memory device according to a second embodiment will be described. Note that, in the following description, parts similar to those of the semiconductor memory device according to the first embodiment are attached by similar reference numerals, thereby omitting the description.

The semiconductor memory device according to the second embodiment is basically configured similarly to the semiconductor memory device according to the first embodiment. However, the semiconductor memory device according to the second embodiment has a different manufacturing method compared with the semiconductor memory device according to the first embodiment.

FIG. 33 to FIG. 39 are schematic cross-sectional views illustrating a part of the manufacturing method of the semiconductor memory device according to the embodiment, and illustrate the cross-sectional surface corresponding to FIG. 11.

The manufacturing method is performed similarly to the manufacturing method according to the first embodiment up to the process described with reference to FIG. 18 and FIG. 19.

Figure 33:
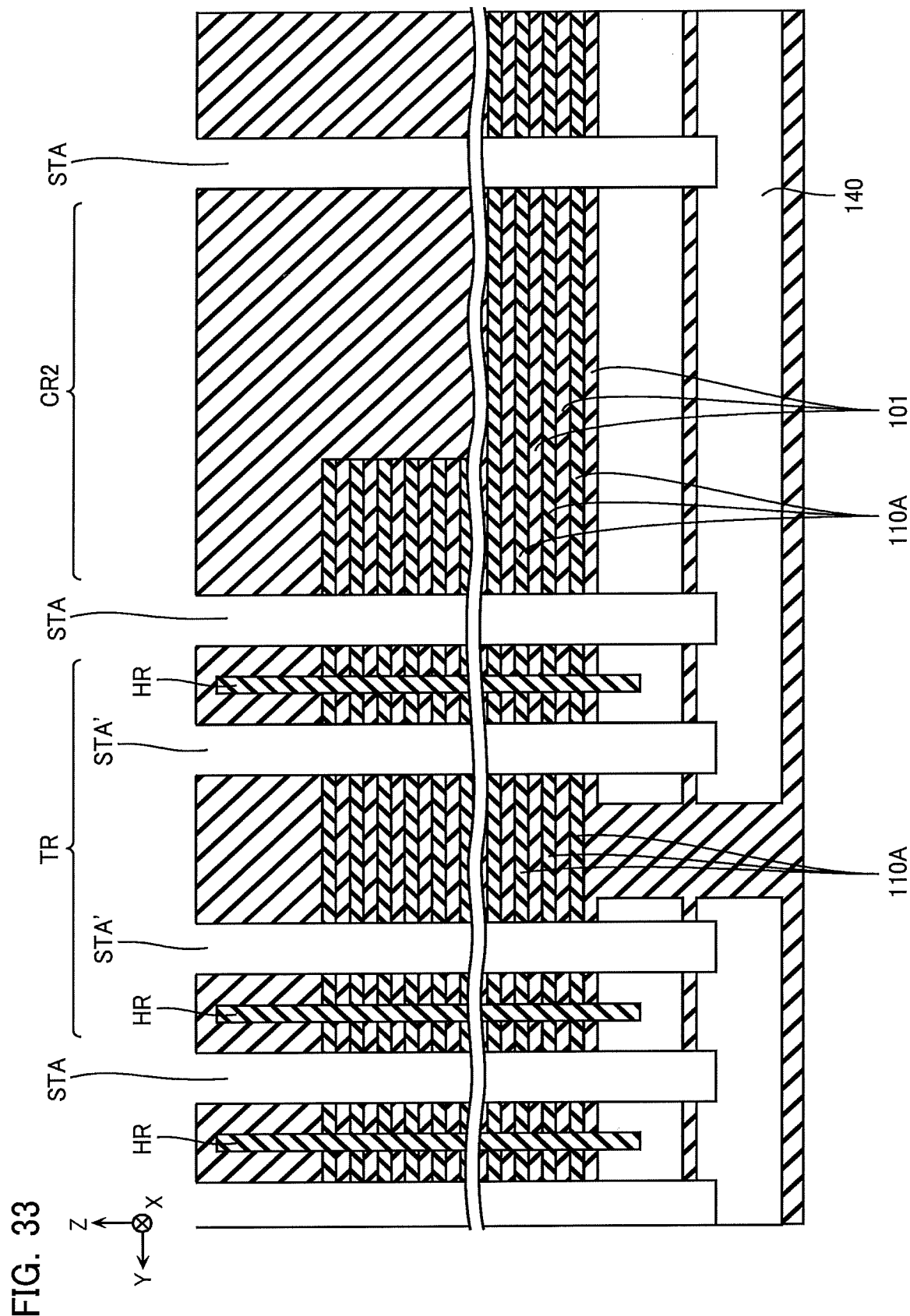
FIG. 33 is a schematic drawing illustrating a manufacturing method of a semiconductor memory device according to a second embodiment.

Next, as illustrated in FIG. 33, trenches STA' are formed at positions corresponding to the stopper insulating layers ST', and the trenches STA are formed at positions corresponding to the inter-memory-block insulating layers ST. This process is, for example, performed by the RIE or the like.

Figure 34:
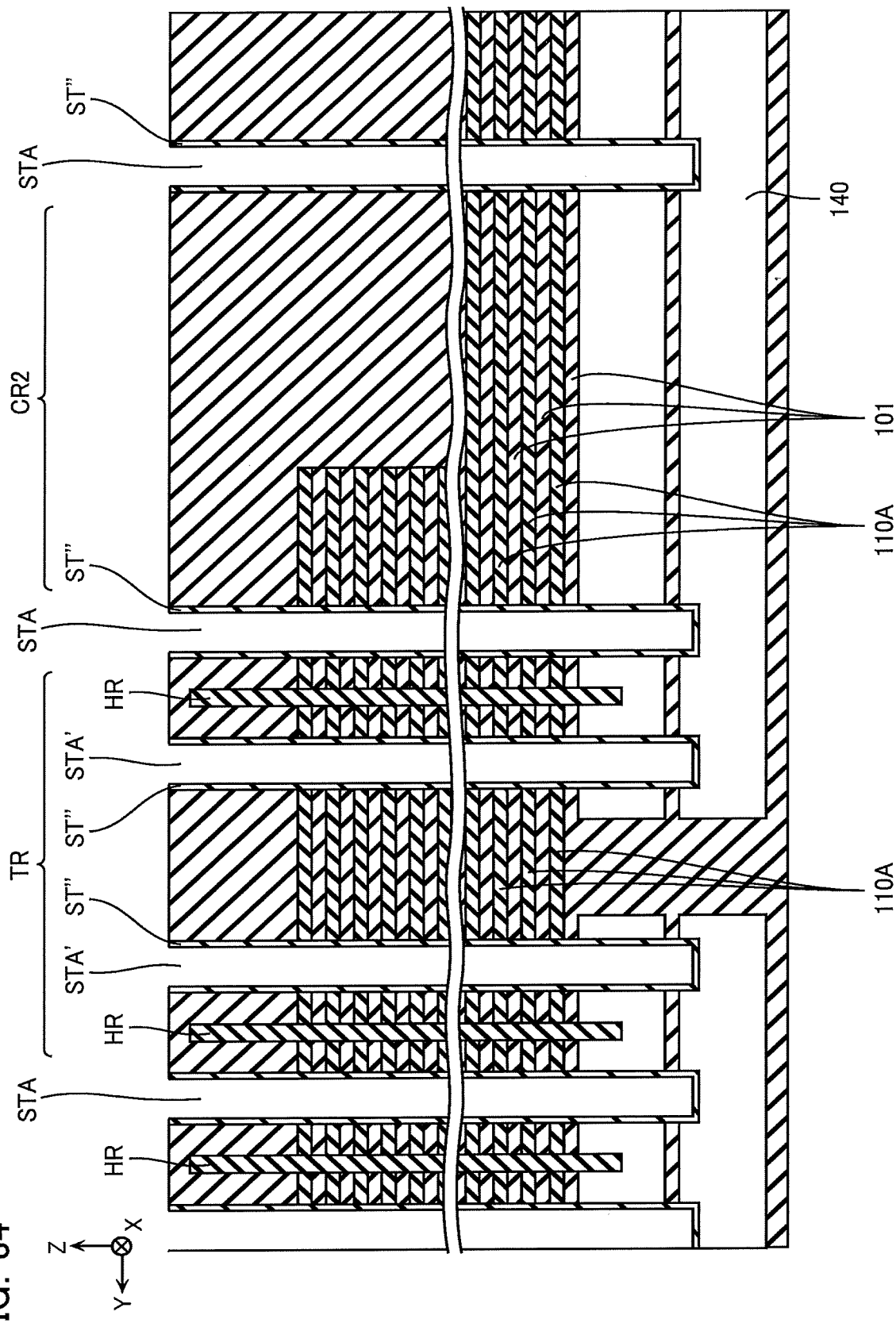
FIG. 34 is a schematic drawing illustrating the manufacturing method.

Next, as illustrated in FIG. 34, stopper insulating layers ST'' are formed on bottom surfaces and side surfaces of the trenches STA' and the trenches STA. The stopper insulating layers ST'' include, for example, silicon oxide ($SiO_2$). The stopper insulating layers ST" are formed thin to the extent that the trenches STA' and the trenches STA are not buried.

Figure 35:
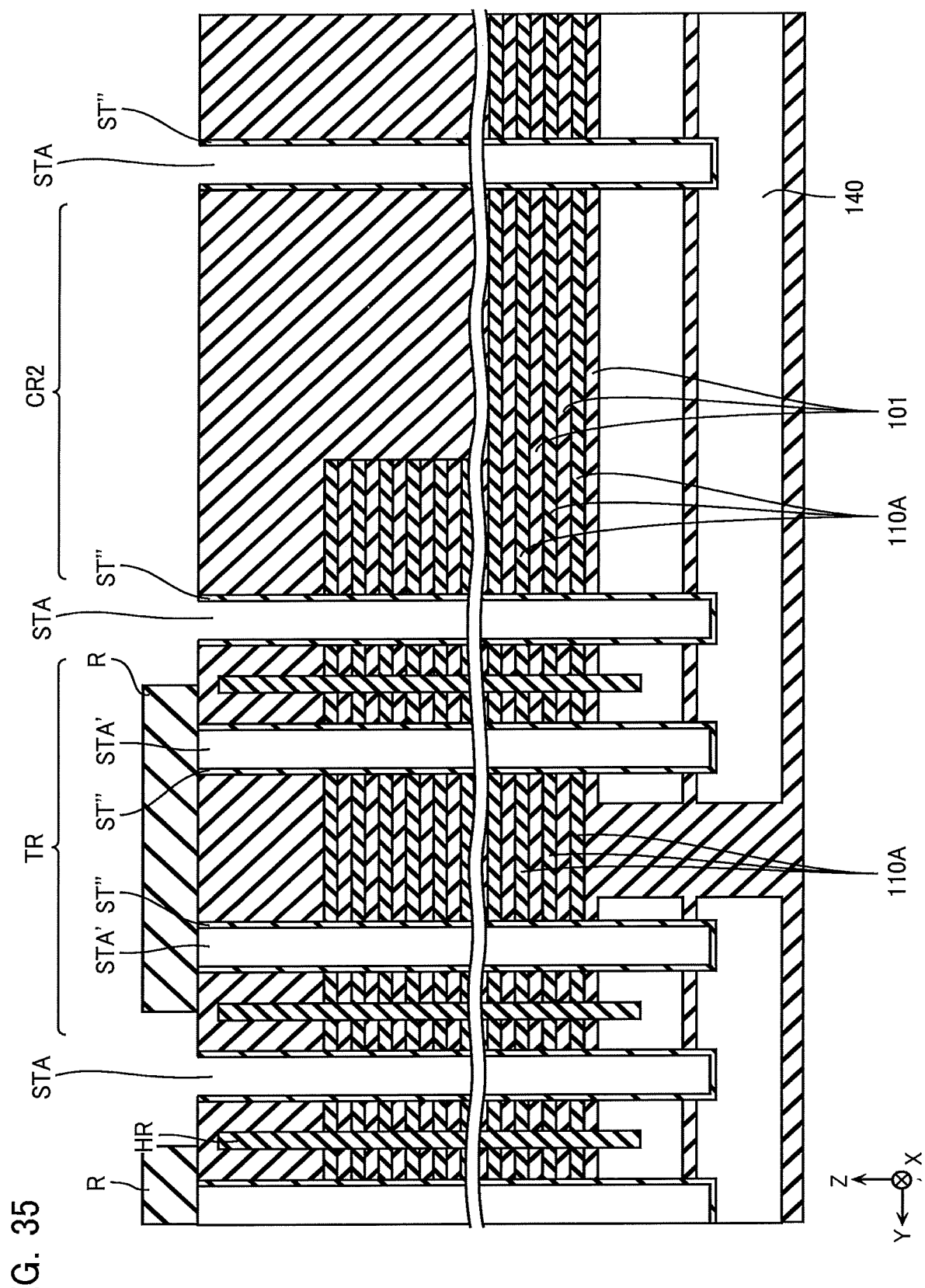
FIG. 35 is a schematic drawing illustrating the manufacturing method.

Next, as illustrated in FIG. 35, resists R are formed on a top surface of the configuration illustrated in FIG. 34. The resists R cover regions where the trenches STA' are formed, and expose regions where the trenches STA are formed.

Figure 36:
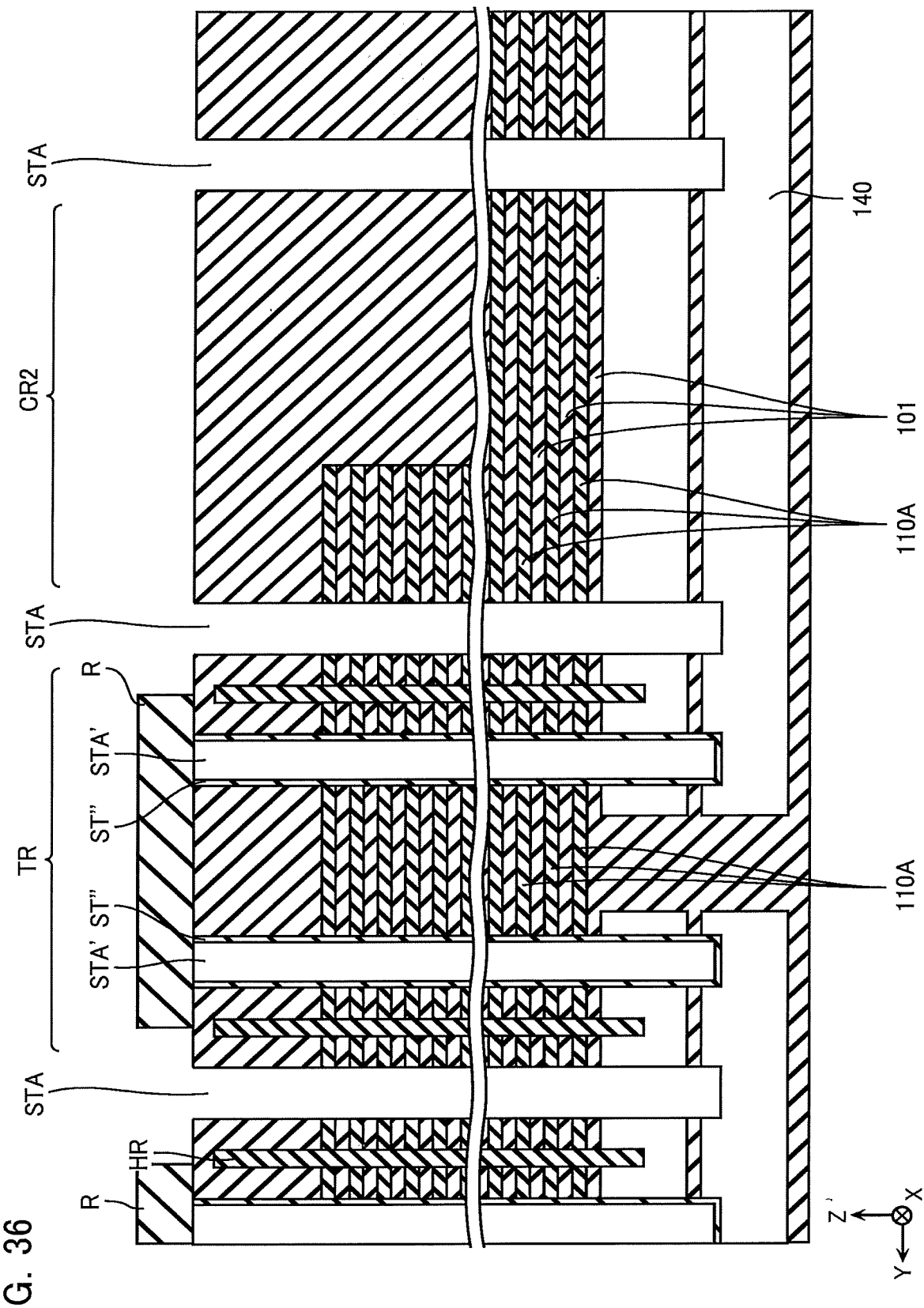
FIG. 36 is a schematic drawing illustrating the manufacturing method.

Next, as illustrated in FIG. 36, among the stopper insulating layers ST", parts that are formed in the trenches STA are removed. This process is, for example, performed by the wet etching or the like via the resists R.

Figure 37:
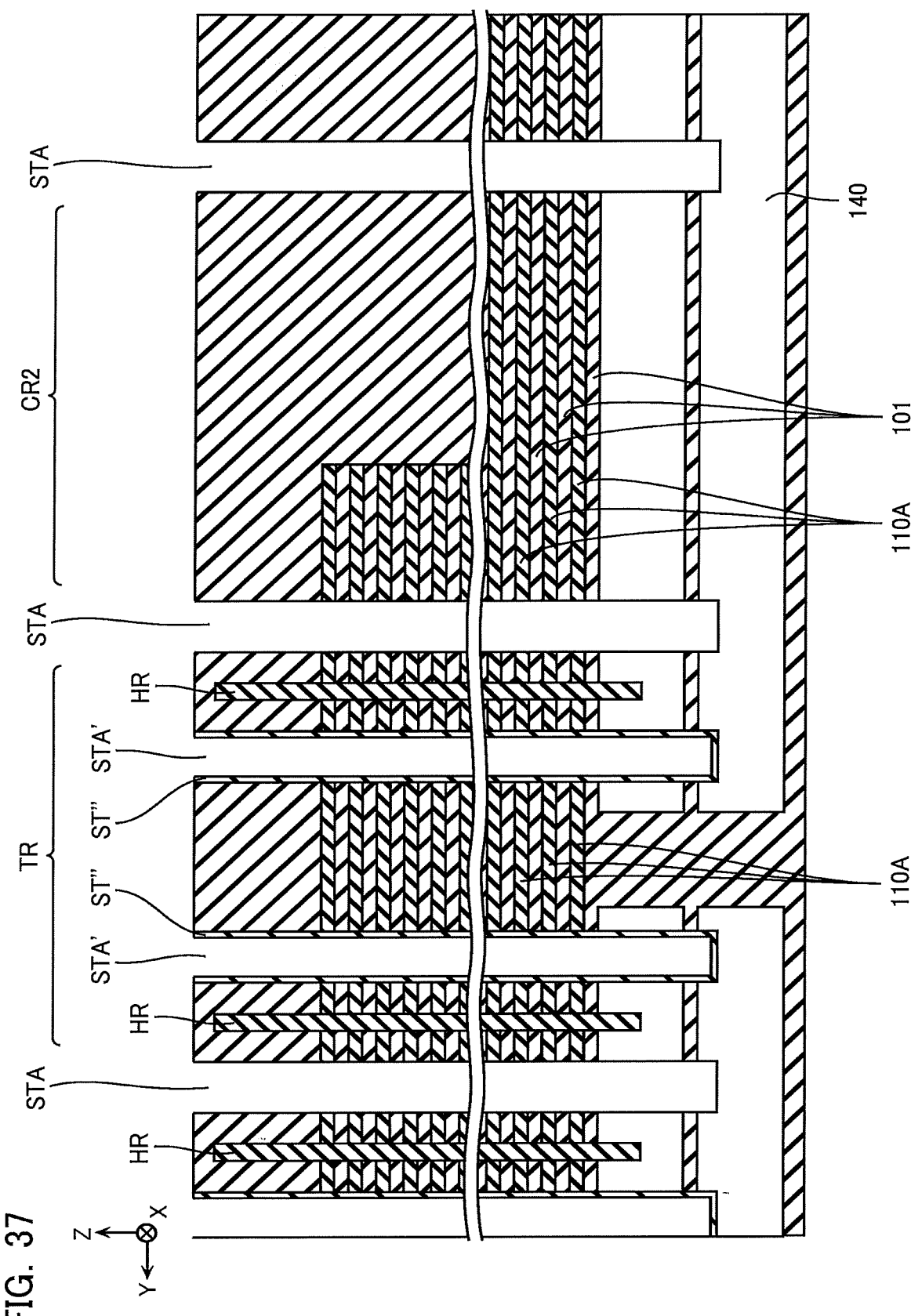
FIG. 37 is a schematic drawing illustrating the manufacturing method.

Next, as illustrated in FIG. 37, the resists R are removed.

Figure 38:
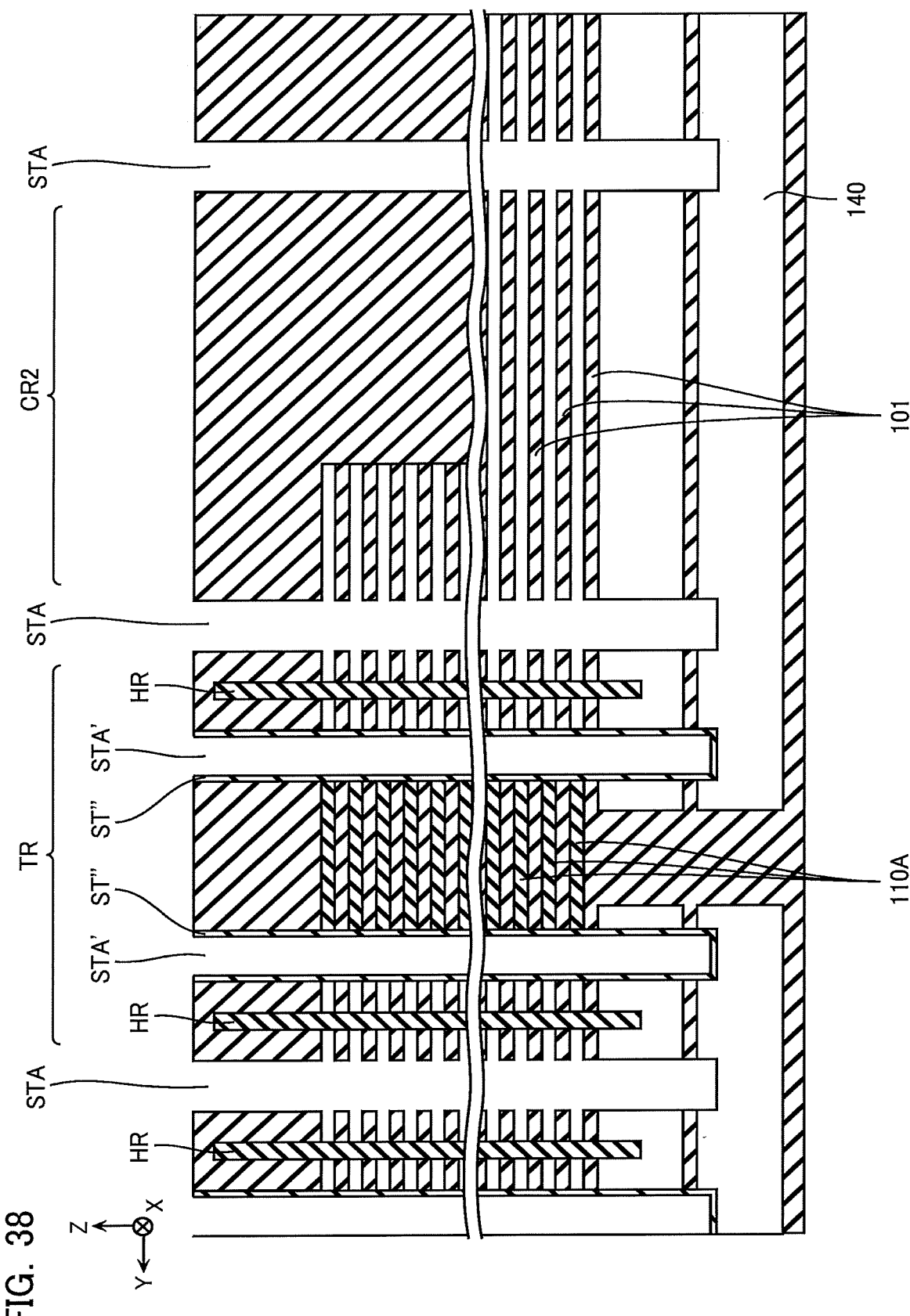
FIG. 38 is a schematic drawing illustrating the manufacturing method.

Next, as illustrated in FIG. 38, apart of the insulating layers 110A is removed. This process is, for example, performed similarly to the process described with reference to FIG. 26 to FIG. 29.

Figure 39:
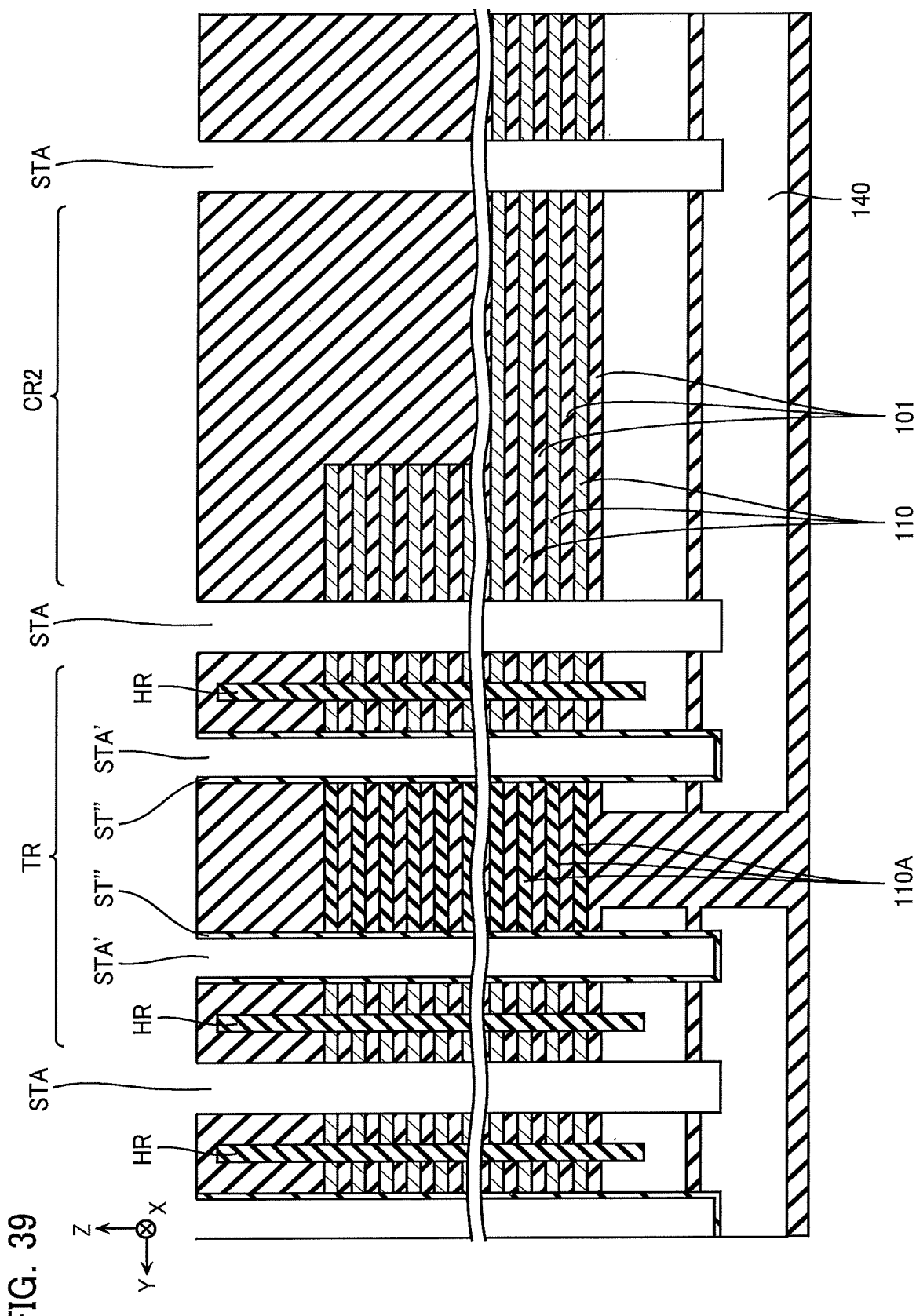
FIG. 39 is a schematic drawing illustrating the manufacturing method.

Next, as illustrated in FIG. 39, the conducting layers 110 are formed. This process is, for example, performed similarly to the process described with reference to, for example, FIG. 30 to FIG. 31.

Afterwards, for example, the process after the process described with reference to FIG. 32 is performed.

Third Embodiment

Next, a semiconductor memory device according to a third embodiment will be described. Note that, in the following description, parts similar to those of the semiconductor memory device according to the first embodiment or the second embodiment is attached by similar reference numerals, thereby omitting the description.

Figure 40:
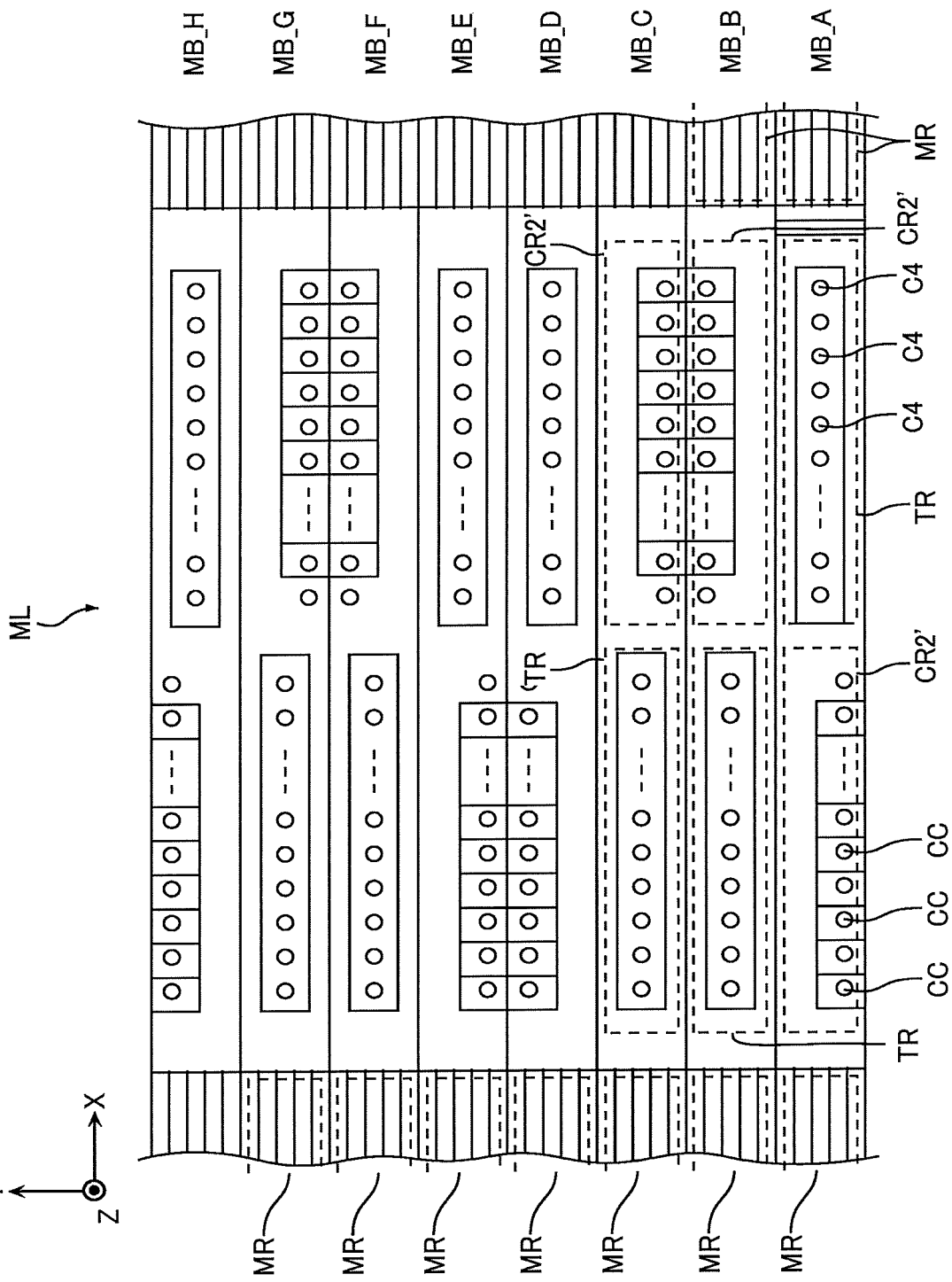
FIG. 40 is a schematic plan view illustrating a configuration of a semiconductor memory device according to a third embodiment.

FIG. 40 is a schematic plan view illustrating a configuration in the memory layer ML of the semiconductor memory device according to the embodiment. As described with reference to FIG. 5 and the like, in the first embodiment and the second embodiment, the memory area MR that extends in the X direction in each of the memory blocks MB is disposed, and the contact regions CR1 and CR2, and the through contact region TR are disposed on the one end portion and the other end portion in the X direction of each of the memory area MR. Meanwhile, as illustrated in FIG. 40, in the third embodiment, the memory area MR extending in the X direction on one side (the right side in FIG. 40) and the other side (the left side in FIG. 40) in the X direction of each of the memory blocks MB is disposed, and a contact region CR2' and the through contact region TR are disposed between these regions. Note that while the illustration is omitted in FIG. 40, the respective contact regions CR1 are disposed between the memory area MR and the contact region CR2' and between the memory area MR and the through contact region TR.

In the semiconductor memory device according to the embodiment, the memory area MR, the contact region CR1, and the through contact region TR are configured similarly to the first embodiment and the second embodiment.

Figure 41:
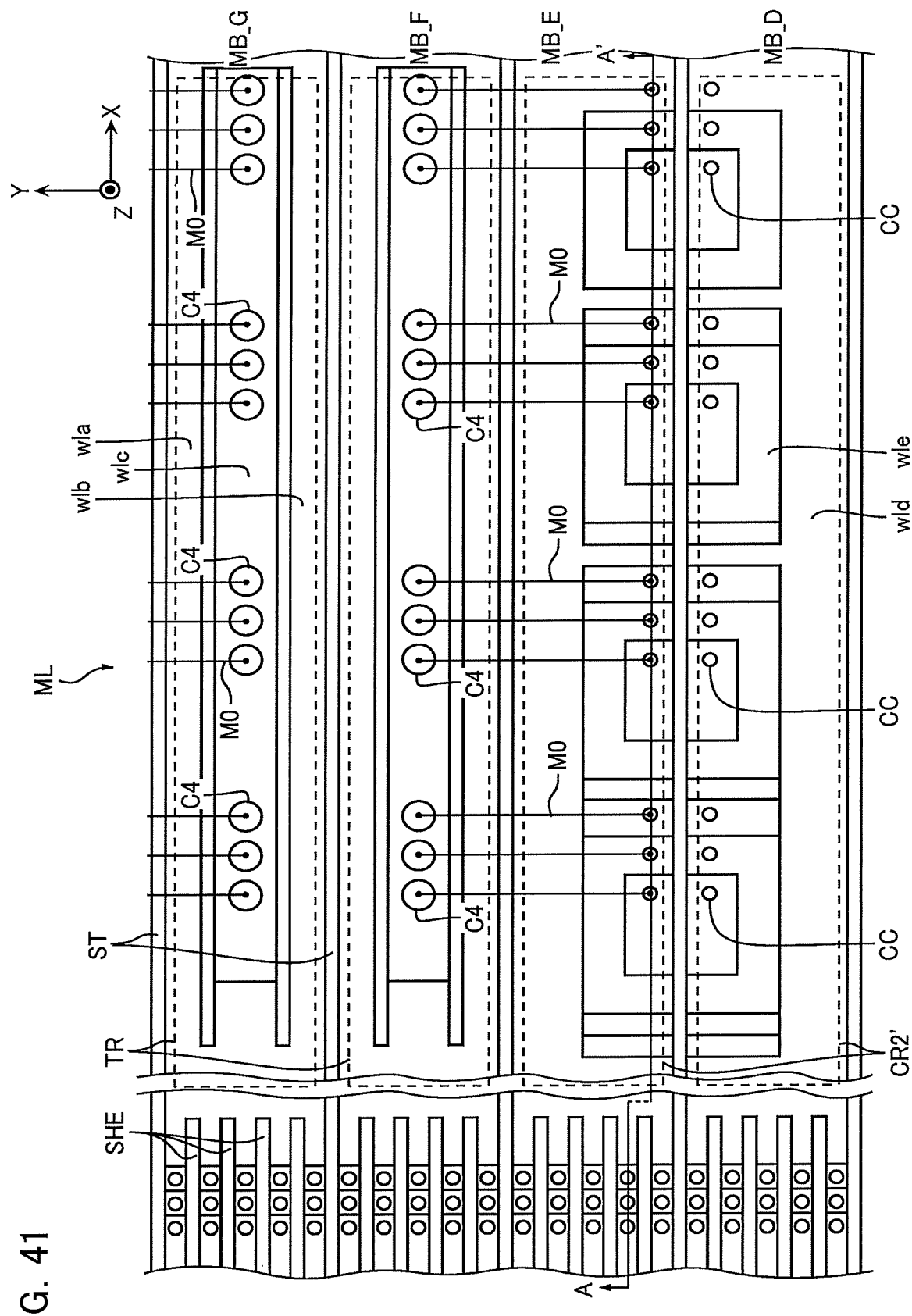
FIG. 41 is a schematic enlarged view of FIG. 40.
Figure 42:
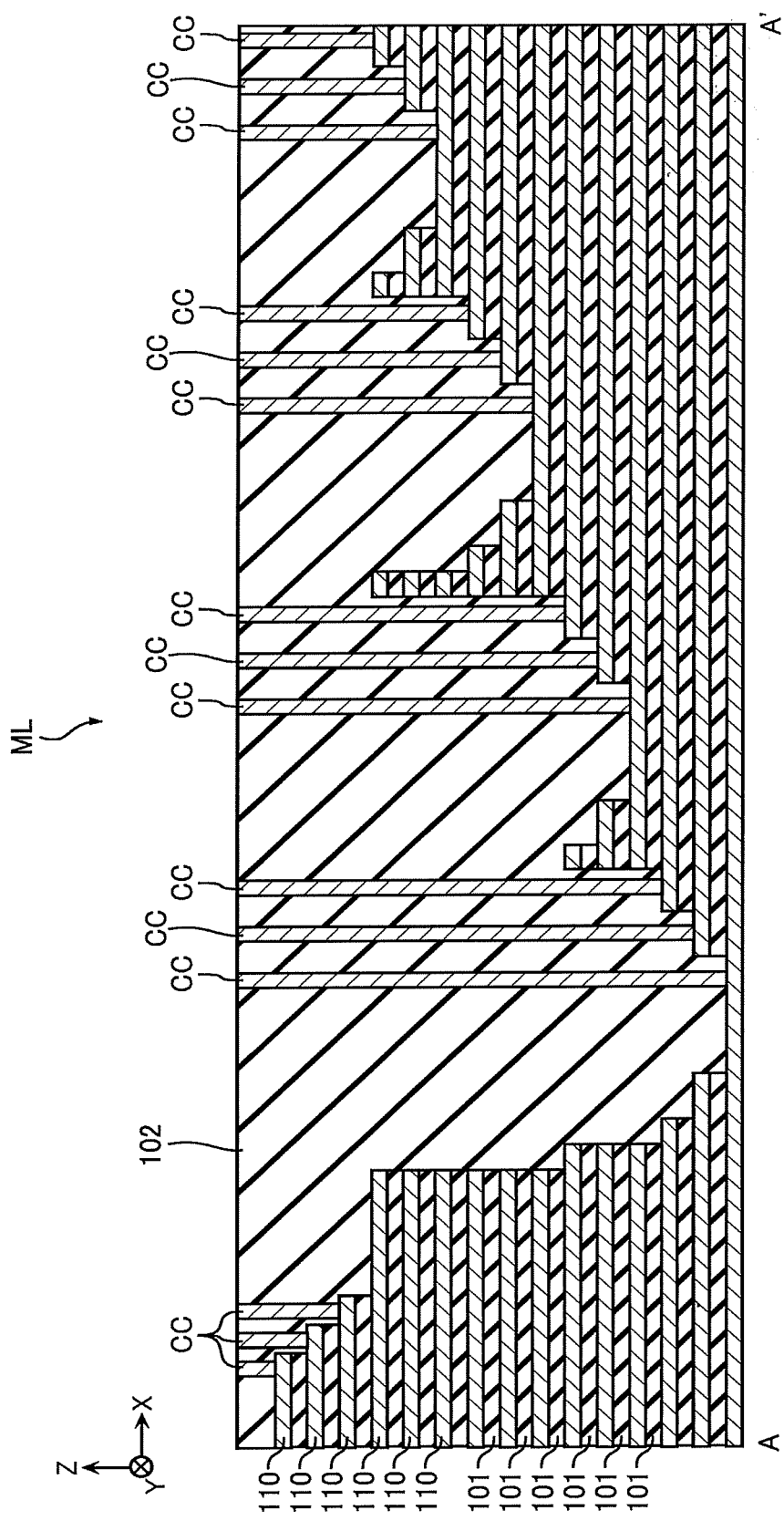
FIG. 42 is a schematic cross-sectional view where the structure illustrated in FIG. 41 is taken along the line A-A' and viewed in the arrow direction.

FIG. 41 is a partially enlarged view of FIG. 40, and is a schematic plan view illustrating a configuration in the contact region CR2' and the through contact region TR. FIG. 42 is a schematic cross-sectional view where the structure in FIG. 41 is taken along the line A-A', and viewed in the arrow direction.

As illustrated in FIG. 41, the contact regions CR2' include wiring regions wld extending in the X direction and arranged in Y direction, and contact regions wle. The wiring region wld includes apart of the plurality of conducting layers 110 and the plurality of interlayer insulating layers 101 arranged in the Z direction. As illustrated in FIG. 42, the contact region wle includes the plurality of contacts CC arranged in the X direction and a part of the plurality of conducting layers 110 and the plurality of interlayer insulating layers 101 arranged in the Z direction. The plurality of contacts CC arranged in the X direction all have different lower end positions, and are connected to the different conducting layer 110. The plurality of conducting layers 110 each include a connecting portion connected to one of the plurality of contacts CC and an opening for connecting the other contacts CC to the conducting layer 110 below. Note that, in the example in FIG. 41, the plurality of contacts CC disposed in the contact region CR2' and the plurality of through contacts C4 disposed in the through contact region TR are correspondingly disposed, and the contacts CC are connected to the respective through contacts C4 via wirings MO extending in the Y direction. A length in the Y direction of the wiring MO is greater than a length in the X direction of the wiring MO.

[Effect]

In the semiconductor memory device according to the first embodiment and the second embodiment, the contact regions CR1 and CR2, and the through contact region TR are disposed on the one end portion and the other end portion in the X direction of each of the memory areas MR. In such a configuration, the distance from the contact regions CR1 and CR2 to the one end portion or the other end portion in the X direction of the memory area MR increases, and therefore, a voltage transfer to the conducting layer 110 takes time in some cases.

On the other hand, in the semiconductor memory device according to the embodiment, the memory area MR extending in the X direction is disposed on the one side (the right side in FIG. 40) and the other side (the left side on FIG. 40) in the X direction of each of the memory blocks MB, and the contact regions CR1 and CR2', and the through contact region TR are disposed between these regions. Therefore, if the memory block MB in the first embodiment and the memory block MB in the third embodiment include the same number of memory cells MC, a length in the X direction of the memory area MR in the third embodiment is half a length in the X direction of the memory area MR in the first embodiment. Therefore, compared with the memory block MB according to the first embodiment, the voltage can be transferred at high speed to the conducting layer 110.

In the embodiment, the plurality of contacts CC disposed in the contact region CR2' and the plurality of through contacts C4 disposed in the through contact region TR are correspondingly disposed, and the contacts CC are connected to the respective through contacts C4 via the wiring MO extending in the Y direction. Such a configuration can substantially reduce a variation of wiring resistance between the contact CC and the through contact C4 compared with the configuration according to the first embodiment and the second embodiment.

Fourth Embodiment

Next, a semiconductor memory device according to a fourth embodiment will be described. Note that, in the following description, parts similar to those of the semiconductor memory device according to the first embodiment to the third embodiment are attached by similar reference numerals, thereby omitting the description.

Figure 43:
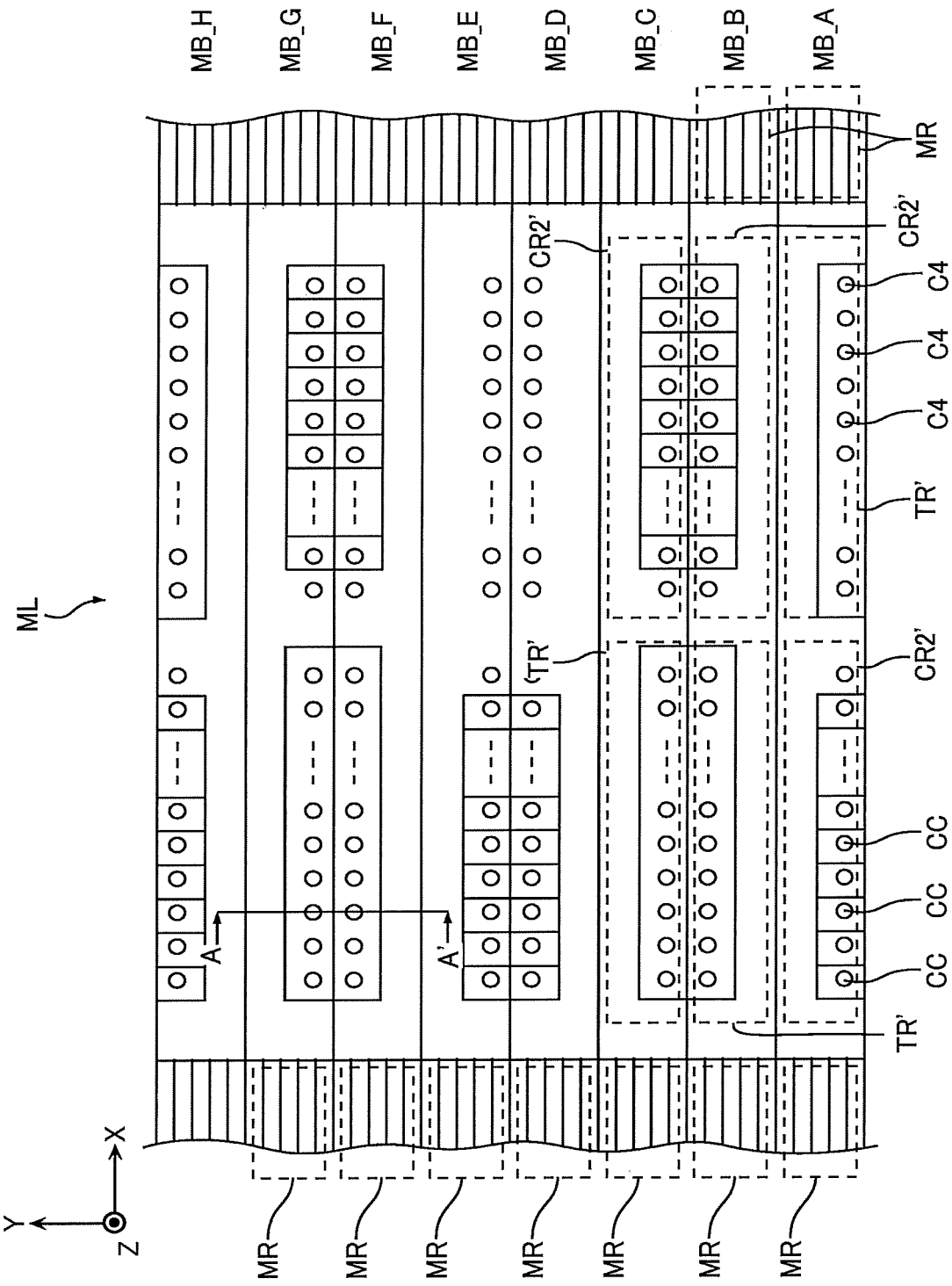
FIG. 43 is a schematic plan view illustrating a configuration of a semiconductor memory device according to a fourth embodiment.

FIG. 43 is a schematic plan view illustrating a configuration in the memory layer ML in the semiconductor memory device according to the embodiment. As illustrated, the semiconductor memory device according to the embodiment is basically configured similarly to the semiconductor memory device according to the third embodiment. However, the semiconductor memory device according to the embodiment does not include the through contact region TR according to the third embodiment, but includes a through contact region TR' instead.

Figure 44:
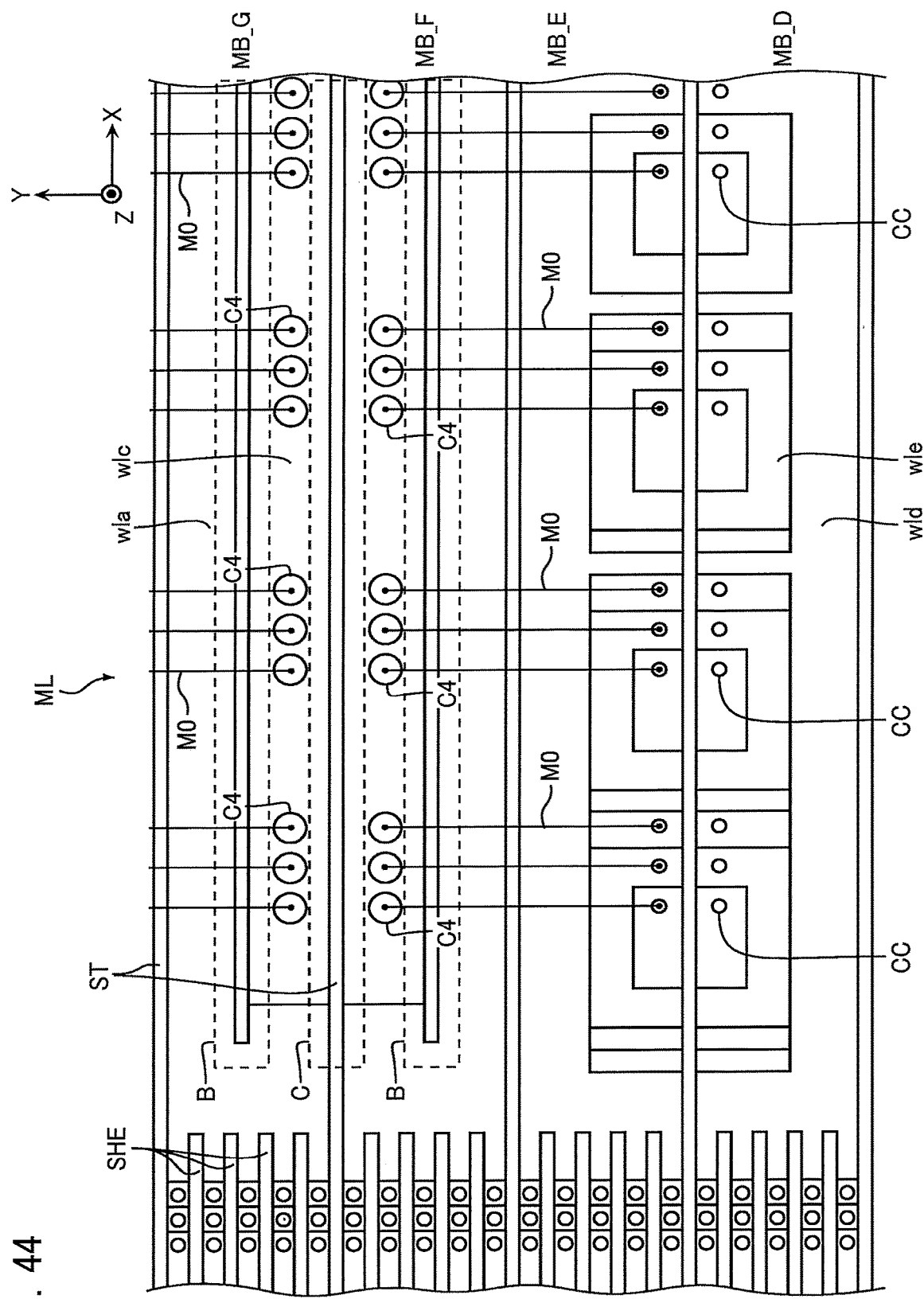
FIG. 44 is a schematic enlarged view of FIG. 43.
Figure 45:
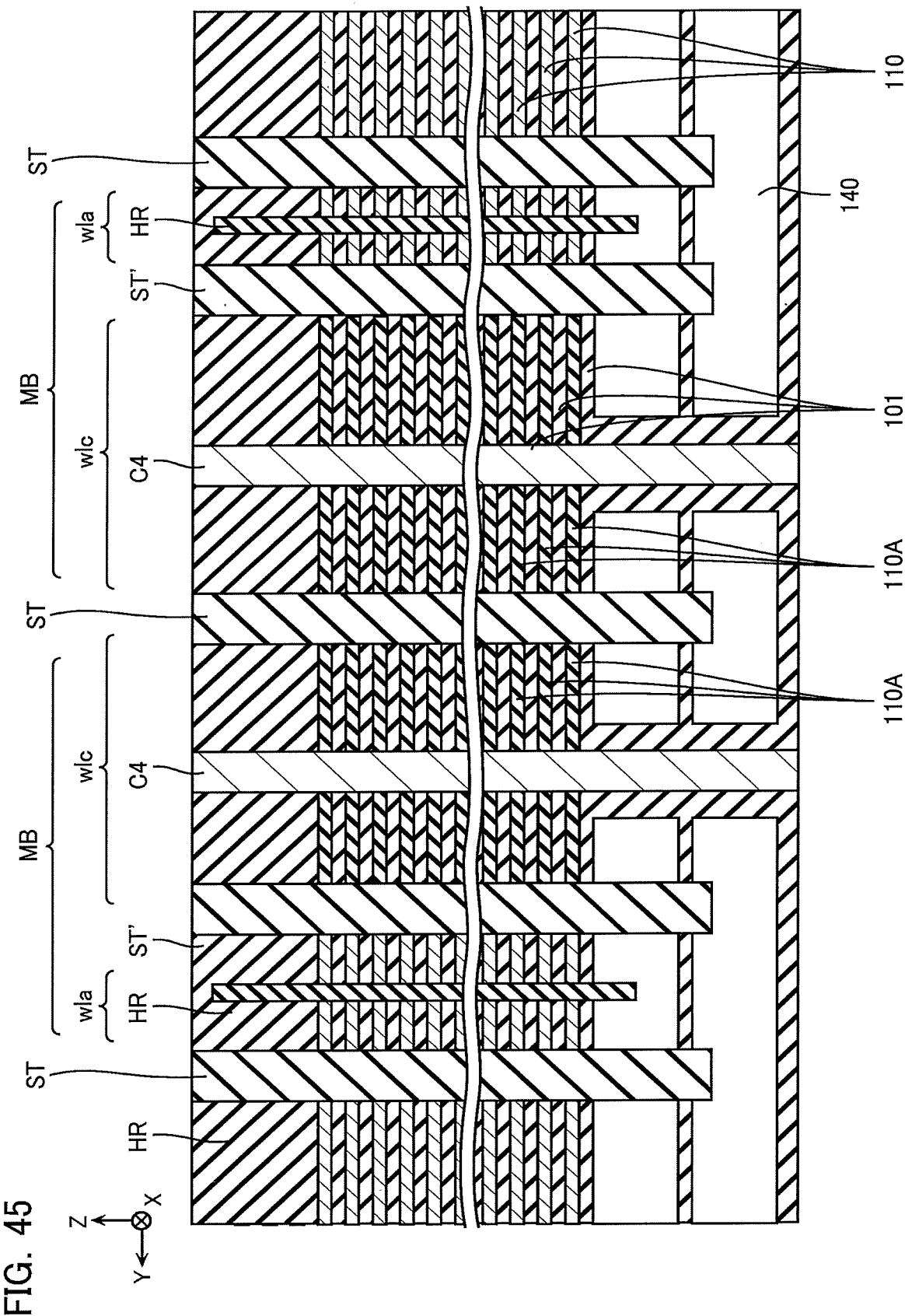
FIG. 45 is a schematic cross-sectional view where the structure illustrated in FIG. 43 is taken along the line A-A' and viewed in the arrow direction.

FIG. 44 is an enlarged view of a part of FIG. 43, and is a schematic plan view illustrating a configuration in the contact region CR2' and the through contact region TR'. FIG. 45 is a schematic cross-sectional view where a structure illustrated in FIG. 43 is taken along the line A-A', and viewed in the arrow direction.

The through contact region TR' is basically configured similarly to the through contact region TR according to the first embodiment to the third embodiment. However, the through contact region TR' according to the embodiment does not have the wiring regions wlb, and have only one stopper insulating layer ST'. As illustrated in FIG. 45, a side surface on one side (the right side in FIG. 45) in the X direction of the plurality of insulating layer 110A disposed in the contact region wlc is connected to a side surface of the stopper insulating layer ST', and a side surface on the other side (the left side in FIG. 45) in the X direction is connected to a side surface of the inter-memory-block insulating layer ST.

Such a configuration is manufacturable by various kinds of methods. For example, when the semiconductor memory device according to the embodiment is formed in a method similar to the manufacturing method according to the second embodiment, the resist R that covers the region indicated by B and the region indicated by C in FIG. 44 and exposes the other parts may be formed in the process described with reference to FIG. 35. Note that the region indicated by B in FIG. 44 includes the stopper insulating layer ST'. The region indicated by C in FIG. 44 includes a part disposed between two through contact regions TR' adjacent to one another in the Y direction among the inter-memory-block insulating layers ST.

Other Embodiments

The through contact region TR according to the third embodiment and the through contact region TR' according to the fourth embodiment may be formed by a manufacturing method similar to that in the first embodiment or may be formed by a manufacturing method similar to that in the second embodiment.

The configuration in the through contact region TR' according to the fourth embodiment is applicable to the semiconductor memory device according to the first embodiment and the second embodiment.

Figure 46:
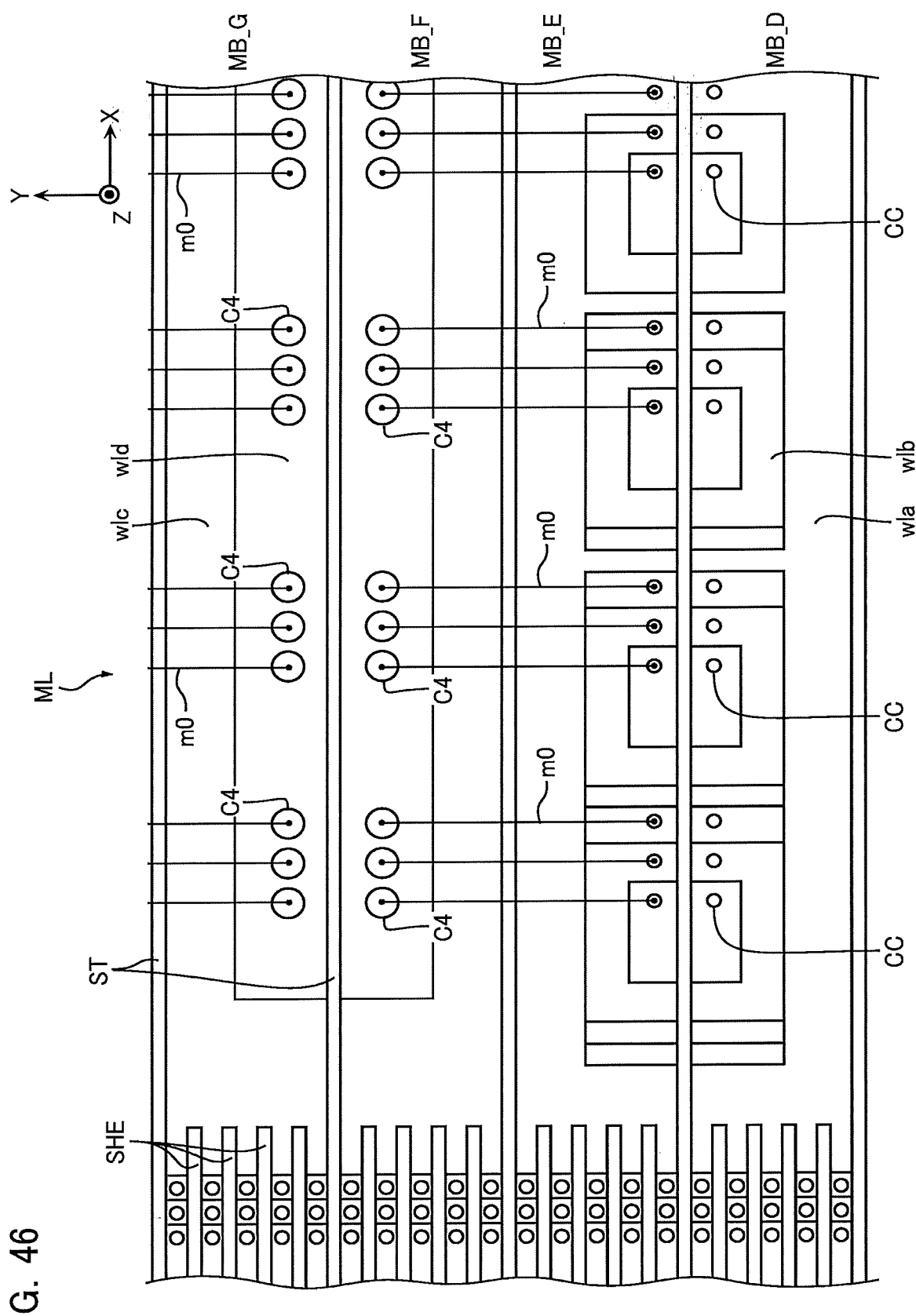
FIG. 46 is a schematic plan view illustrating a configuration of a semiconductor memory device according to another embodiment.

In the first embodiment to the fourth embodiment, the stopper insulating layer ST' is disposed between the insulating layer 110A and the inter-memory-block insulating layer ST. However, for example, as illustrated in FIG. 46, it is possible not to dispose the stopper insulating layer ST' between the insulating layer 110A and the inter-memory-block insulating layer ST in the through contact region TR or the through contact region TR'. Such a configuration ensures reducing the number of manufacturing processes compared with the semiconductor memory devices according to the first embodiment to the fourth embodiment.

In the first embodiment to the fourth embodiment, the through contact C4 connected between the conducting layer 110 functioning as the word line WL or the like and the transistor Tr (FIG. 2) disposed on the semiconductor substrate S is exemplarily described as the through contact C4 disposed in the through contact regions TR and TR'. However, the configurations according to the first embodiment to the fourth embodiment are applicable to the through contact that connects the configurations other than those described above.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate having a first region and a second region arranged in a first direction;
   a plurality of first word line layers and a plurality of first interlayer insulating layers laminated in a second direction intersecting with a surface of the substrate,
   each of the plurality of first word line layers including a first part provided over the first region and a second part provided over the second region,
   each of the plurality of first interlayer insulating layers including a third part provided over the first region, a fourth part provided over the second region, and a fifth part provided over the second region,
   all third parts of the plurality of first interlayer insulating layers being laminated in the second direction alternately with all first parts of the plurality of first word line layers, and
   all fourth parts of the plurality of first interlayer insulating layers being laminated in the second direction alternately with all second parts of the plurality of first word line layers;
   a first semiconductor layer that is provided over the first region and extends in the second direction, the first semiconductor layer having an outer peripheral surface opposed to first parts of the plurality of first word line layers;
   a first electric charge accumulating film provided over the first region and disposed between all first parts of the plurality of first word line layers and the first semiconductor layer;
   a plurality of first insulating layers provided over the second region and laminated in the second direction alternately with all fifth parts of the plurality of first interlayer insulating layers that separate from all second parts of the plurality of first word line layers in a third direction intersecting with the first direction and the second direction;
   a first contact that is provided over the second region and extends in the second direction, the first contact having an outer peripheral surface abutting at least some of the plurality of first insulating layers; and
   a second insulating layer disposed between and along all second parts of the plurality of first word line layers and the plurality of first insulating layers, the second insulating layer extending in the first direction and the second direction, wherein
   each of the plurality of first insulating layers has a side surface in the first direction attached to a first part of a corresponding first word line layer, and each of the plurality of first insulating layers has a side surface in the third direction abutting the second insulating layer.

2. The semiconductor memory device according to claim 1, wherein
the substrate has a third region and a fourth region arranged in the first direction, the third region is arranged with the first region in the third direction, and the fourth region is arranged with the second region in the third direction,
the semiconductor memory device comprising:
a plurality of second word line layers and a plurality of second interlayer insulating layers laminated in the second direction,
each of the plurality of second word line layers including a sixth part provided over the third region and a seventh part provided over the fourth region,
each of the plurality of second interlayer insulating layers including an eighth part provided over the third region and a ninth part provided over the fourth region,
all eighth parts of the plurality of second interlayer insulating layers being laminated in the second direction alternately with all sixth parts of the plurality of second word line layers, and
all ninth parts of the plurality of second interlayer insulating layers being laminated in the second direction alternately with all seventh parts of the plurality of second word line layers;
a second semiconductor layer that is provided over the third region and extends in the second direction, the second semiconductor layer having an outer peripheral surface opposed to sixth parts of the plurality of second word line layers;
a second electric charge accumulating film provided over the third region and disposed between all sixth parts of the plurality of second word line layers and the second semiconductor layer; and
a second contact that extends in the second direction, the second contact being connected to one of the seventh parts of the plurality of second word line layers at one end in the second direction;
the one of the seventh parts of the plurality of second word line layers is electrically connected to the first contact via the second contact.

3. The semiconductor memory device according to claim 2, comprising:
a plurality of the first contacts arranged in the first direction; and
a plurality of the second contacts arranged in the first direction and the third direction, wherein
the plurality of second contacts are each connected to any one of the plurality of second word line layers at the one end in the second direction.

4. The semiconductor memory device according to claim 2, wherein
the substrate has a fifth region, and the fifth region is arranged with the fourth region in the first direction,
each of the plurality of second word line layers includes a tenth part provided over the fifth region,
each of the plurality of second interlayer insulating layers includes an eleventh part provided over the fifth region and a twelfth part provided over the fifth region,
all eleventh parts of the plurality of second interlayer insulating layers are laminated in the second direction alternately with all tenth parts of the plurality of second word line layers, the semiconductor memory device comprises:
a plurality of third insulating layers provided over the second region and laminated in the second direction alternately with all twelfth parts of the plurality of second interlayer insulating layers separated from all eleventh parts of the plurality of second word line layers in the third direction;
a third contact that is provided over the fifth region and extends in the second direction, the third contact having an outer peripheral surface abutting at least some of the plurality of third insulating layers; and
a fourth insulating layer disposed between and along all tenth parts of the plurality of second word line layers and the plurality of third insulating layers, the fourth insulating layer extending in the first direction and the second direction,
each of the plurality of third insulating layers has a side surface in the first direction abutting each of the plurality of second word line layers, and
each of the plurality of third insulating layers has a side surface in the third direction abutting the fourth insulating layer.

5. The semiconductor memory device according to claim 4, wherein
the second region is arranged with the fourth region and the fifth region in the third direction, wherein
the semiconductor memory device includes:
a plurality of the first contacts arranged in the first direction;
a plurality of the second contacts arranged in the first direction and the third direction; and
a plurality of the third contacts arranged in the first direction, wherein
a part of the plurality of second contacts is electrically connected to the plurality of first contacts,
another part of the plurality of second contacts is electrically connected to the plurality of third contacts.

6. The semiconductor memory device according to claim 4, wherein
the substrate has a sixth region, and the sixth region is arranged with the second region in the first direction and arranged with the fifth region in the third direction,
each of the plurality of first word line layers includes a thirteenth part provided over the sixth region,
each of the plurality of first interlayer insulating layers includes a fourteenth part provided over the sixth region,
all fourteenth parts of the plurality of first interlayer insulating layers are laminated in the second direction alternately with all thirteenth parts of the plurality of first word line layers,
the semiconductor memory device comprises a fourth contact extending in the second direction, the fourth contact being connected to one of the thirteenth parts of the plurality of first word line layers at the one end in the second direction,
the one of the thirteenth parts of the plurality of first word line layers is electrically connected to the third contact via the fourth contact.

7. The semiconductor memory device according to claim 6, comprising:
a plurality of the first contacts arranged in the first direction, the first contact is one of the plurality of the first contacts;
a plurality of the second contacts arranged in the first direction, the second contact is one of the plurality of the second contacts;

a plurality of the third contacts arranged in the first direction, the third contact is one of the plurality of the third contacts; and a plurality of the fourth contacts arranged in the first direction, the fourth contact is one of the plurality of the fourth contacts; wherein each of the plurality of second contacts is electrically connected to a respective one of the plurality of first contacts, and each of the plurality of fourth contacts is electrically connected to a respective one of the plurality of third contacts.

8. The semiconductor memory device according to claim comprising:
a plurality of first wirings connected to the plurality of first contacts and the plurality of second contacts; and
a plurality of second wirings connected to the plurality of third contacts and the plurality of fourth contacts, wherein
lengths in the third direction of the plurality of first wirings are greater than lengths in the first direction of the plurality of first wirings;
lengths in the third direction of the plurality of second wirings are greater than a-lengths in the first direction of the plurality of second wiring.

9. The semiconductor memory device according to claim 6, wherein
the substrate has a seventh region and an eighth region arranged in the third direction, the seventh region is arranged with the sixth region in the first direction; and the eighth region is arranged with the fifth region in the first direction,
each of the plurality of first word line layers includes a fifteenth part provided over the seventh region,
each of the plurality of first interlayer insulating layers includes a sixteenth part provided over the seventh region,
all sixteenth parts of the plurality of first interlayer insulating layers are laminated in the second direction alternately with all fifteenth parts of the plurality of first word line layers,
each of the plurality of second word line layers includes a seventeenth part provided over the eighth region,
each of the plurality of second interlayer insulating layers includes an eighteenth part provided over the eighth region,
all eighteenth parts of the plurality of second interlayer insulating layers are laminated in the second direction alternately with all seventeenth parts of the plurality of second word line layers,
the semiconductor memory device comprises:
a third semiconductor layer that is provided over the seventh region and extends in the second direction, the third semiconductor layer having an outer peripheral surface opposed to all fifteenth parts of the plurality of first word line layers;
a third electric charge accumulating film provided over the seventh region and disposed between all fifteenth parts of the plurality of first word line layers and the third semiconductor layer;
a fourth semiconductor layer that is provided over the eighth region and extends in the second direction, the fourth semiconductor layer having an outer peripheral surface opposed to all seventeenth parts of the plurality of second word line layers; and
a fourth electric charge accumulating film provided over the eighth region and disposed between all seventeenth parts of the plurality of second word line layers and the fourth semiconductor layer.

10. The semiconductor memory device according to claim 9, wherein
the second region and the sixth region are disposed between the first region and the seventh region, and
the fourth region and the fifth region are disposed between the third region and the eighth region.

11. The semiconductor memory device according to claim 2, comprising:
a plurality of the first contacts arranged in the first direction, the first contact is one of the plurality of the first contacts;
a plurality of the second contacts arranged in the first direction, the second contact is one of the plurality of the second contacts; and
a plurality of first wirings connected to the plurality of first contacts and the plurality of second contacts, one first wiring connected to a corresponding first or second contact, wherein
a length of each wiring in the third direction is greater than a length of this wiring in the first direction.

12. The semiconductor memory device according to claim 1, wherein
each of the plurality of first word line layers includes a nineteenth part provided over the second region,
each of the plurality of first interlayer insulating layers includes a twentieth part provided over the second region,
all twentieth parts of the plurality of first interlayer insulating layers are laminated in the second direction alternately with all nineteenth parts of the plurality of first word line layers,
the semiconductor memory device comprises a fifth insulating layer disposed between and along all nineteenth parts of the plurality of first word line layers and the plurality of first insulating layers, the fifth insulating layer extending in the first direction and the second direction,
each of the plurality of first insulating layers has one side surface in the third direction abutting the second insulating layer, and
each of the plurality of first insulating layers has the other side surface in the third direction abutting the fifth insulating layer.

13. The semiconductor memory device according to claim 1, comprising:
a fifth insulating layer connected to side surfaces in the third direction of the plurality of first word line layers and the plurality of first interlayer insulating layers, the fifth insulating layer extending in the first direction and the second direction, wherein
the plurality of first insulating layers have one side surfaces in the third direction connected to the second insulating layer, and
the plurality of first insulating layers have other side surfaces in the third direction connected to the fifth insulating layer.

* * * * *